US012571950B2

(12) United States Patent
Fukagawa et al.

(10) Patent No.: US 12,571,950 B2
(45) Date of Patent: Mar. 10, 2026

(54) WAVELENGTH SELECTIVE ABSORPTION FILTER, POLARIZING PLATE, ORGANIC ELECTROLUMINESCENT DISPLAY DEVICE, AND LIQUID CRYSTAL DISPLAY DEVICE

(71) Applicant: FUJIFILM Corporation, Tokyo (JP)

(72) Inventors: Nobutaka Fukagawa, Kanagawa (JP); Yu Naito, Kanagawa (JP)

(73) Assignee: FUJIFILM Corporation, Tokyo (JP)

( * ) Notice: Subject to any disclaimer, the term of this patent is extended or adjusted under 35 U.S.C. 154(b) by 460 days.

(21) Appl. No.: 17/886,051

(22) Filed: Aug. 11, 2022

(65) Prior Publication Data

US 2023/0026009 A1 Jan. 26, 2023

Related U.S. Application Data

(63) Continuation of application No. PCT/JP2021/011974, filed on Mar. 23, 2021.

(30) Foreign Application Priority Data

Mar. 23, 2020 (JP) ................................ 2020-051873

(51) Int. Cl.
*G02B 5/22* (2006.01)
*C08K 5/3445* (2006.01)
(Continued)

(52) U.S. Cl.
CPC ............ *G02B 5/223* (2013.01); *C08K 5/3445* (2013.01); *C08K 5/56* (2013.01); *C09B 67/0033* (2013.01);
(Continued)

(58) Field of Classification Search
CPC . G02B 5/223; C09B 67/0033; C09B 67/0063; C08K 5/56; C08K 5/3445; C08K 2201/014
See application file for complete search history.

(56) References Cited

U.S. PATENT DOCUMENTS 11,733,435 B2 * 8/2023 Fukagawa .................. C08J 5/18 428/1.31
11,735,435 B2 * 8/2023 Okamoto ............ H01L 23/3157 438/112
(Continued)

FOREIGN PATENT DOCUMENTS

JP H11193352 A * 7/1997 ............ C09B 23/00
JP 11-193352 A 7/1999
(Continued)

OTHER PUBLICATIONS

International Search Report issued in PCT/JP2021/011974 on May 25, 2021.
(Continued)

*Primary Examiner* — Bijan Ahvazi
(74) *Attorney, Agent, or Firm* — Edwards Neils LLC; Jean C. Edwards, Esq.

(57) ABSTRACT

Provided are a wavelength selective absorption filter containing a resin and a dye A, which has a main absorption wavelength band in the wavelength selective absorption filter at a wavelength of 400 to 450 nm, and a dye C, which has a main absorption wavelength band in the wavelength selective absorption filter at a wavelength of 560 to 600 nm, each of which has a main absorption wavelength band in a different wavelength range, as well as a polarizing plate and an organic electroluminescent display device or liquid crystal display device, which include the wavelength selective absorption filter. However, the dye A and the dye C do not have fluorescence.

3 Claims, 1 Drawing Sheet

(51) Int. Cl.

| | |
|---|---|
| *C08K 5/56* | (2006.01) |
| *C09B 67/20* | (2006.01) |
| *C09B 67/22* | (2006.01) |
| *H10K 59/80* | (2023.01) |

(52) U.S. Cl.

CPC .... *C09B 67/0063* (2013.01); *C08K 2201/014* (2013.01); *H10K 59/8791* (2023.02)

(56) References Cited

U.S. PATENT DOCUMENTS

| | | | | |
|---|---|---|---|---|
| 11,950,480 | B2 * | 4/2024 | Naito | H05B 33/20 |
| 2006/0063864 | A1 | 3/2006 | Shimizu et al. | |
| 2009/0058250 | A1 * | 3/2009 | Sin | H01J 29/898 313/112 |
| 2017/0235032 | A1 | 8/2017 | Miyazaki | |
| 2017/0329179 | A1 | 11/2017 | Cho et al. | |
| 2020/0217993 | A1 * | 7/2020 | Fukagawa | G02B 5/208 |
| 2021/0005673 | A1 | 1/2021 | Naito et al. | |
| 2022/0109128 | A1 * | 4/2022 | Fukagawa | G02B 5/223 |

FOREIGN PATENT DOCUMENTS

| | | | |
|---|---|---|---|
| JP | 2009-058959 | A | 3/2009 |
| JP | 2009-075217 | A | 4/2009 |
| JP | 5205794 | B2 | 6/2013 |
| JP | 2016-090998 | A | 5/2016 |
| JP | 2017-142412 | A | 8/2017 |
| WO | 2004/005981 | A1 | 1/2004 |
| WO | 2008/090757 | A1 | 7/2008 |
| WO | 2019/066043 | A1 | 4/2019 |
| WO | 2019/189463 | A1 | 10/2019 |

OTHER PUBLICATIONS

Written Opinion issued in PCT/JP2021/011974 on May 25, 2021.

International Preliminary Report on Patentability completed by WIPO on Feb. 9, 2022 in connection with International Patent Application No. PCT/JP2021/011974.

Velezheva, V.S. et al., Khimiya Geterotsiklicheskikh Soedinenii, 10, 1978, 1343-1348.

Office Action, issued by the Japanese Patent Office on Jan. 17, 2023, in connection with Japanese Patent Application No. 2022-510542.

* cited by examiner

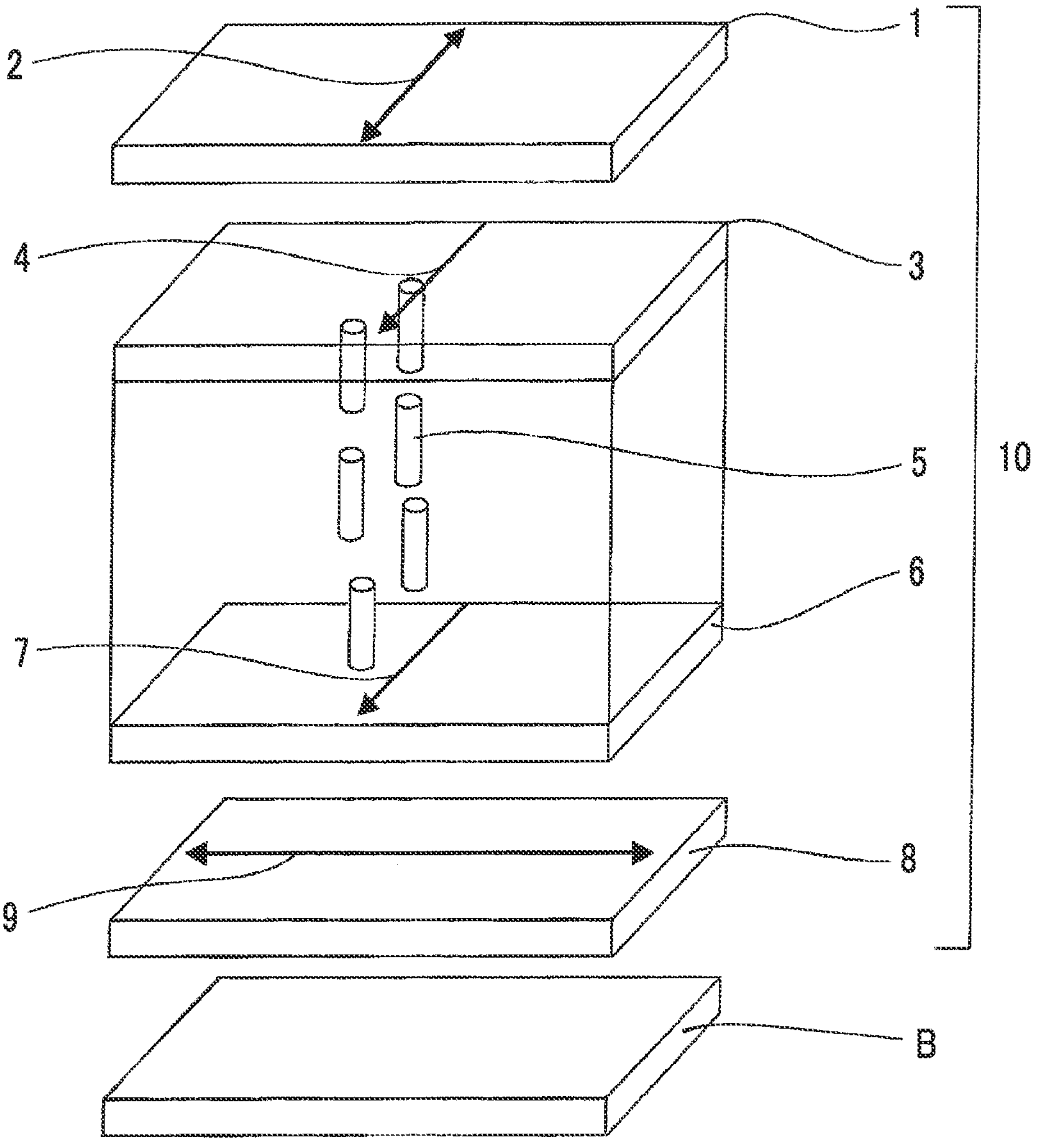
1
2
4
3
5
10
6
7
8
9
B

WAVELENGTH SELECTIVE ABSORPTION FILTER, POLARIZING PLATE, ORGANIC ELECTROLUMINESCENT DISPLAY DEVICE, AND LIQUID CRYSTAL DISPLAY DEVICE

CROSS-REFERENCE TO RELATED APPLICATIONS

This application is a Continuation of PCT International Application No. PCT/JP2021/011974 filed on Mar. 23, 2021, which was published under PCT Article 21 (2) in Japanese, and which claims priority under 35 U.S.C. § 119 (a) to Japanese Patent Application No. 2020-051873 filed in Japan on Mar. 23, 2020. The above applications is are hereby expressly incorporated by reference, in their entirety, into the present application.

BACKGROUND OF THE INVENTION

1. Field of the Invention

The present invention relates to a wavelength selective absorption filter, a polarizing plate, an organic electroluminescent display device, and a liquid crystal display device.

2. Description of the Related Art

Image display devices such as a liquid crystal display device and an organic electroluminescent (OLED) display device are widely used as a space-saving image display device with low power consumption. Above all, in use applications such as televisions for which high-quality images are required, it is required to realize high color reproducibility, excellent contrast, and the like, in addition to the high resolution.

The liquid crystal display device is a non-light emitting element in which the liquid crystal itself displaying an image does not emit light, and thus the liquid crystal display device includes a backlight unit which is disposed on a rear surface of the liquid crystal panel and supplies light to the liquid crystal panel.

In recent years, as a light source for the backlight unit, a white light emitting diode (LED) has been used. For a light emitting device formed of the white LED, a method of producing white light by mixing blue light radiated from a blue LED with light radiated from a yellow phosphor or light radiated from a green phosphor and a red phosphor is known. However, the above-described method has a problem in that a color reproduction range is narrow and the color reproducibility is low as compared with an organic light emitting diode (OLED) or the like which is in the spotlight as a next-generation display, and there is a demand for a new technique for overcoming this problem.

On the other hand, JP2016-90998A proposes a technique in which an absorption dye having a main absorption wavelength band other than RGB and a fluorescent dye having a main absorption wavelength band other than RGB and a main luminance wavelength band corresponding to RGB are incorporated into the same layer or layers different from each other, into a coating layer or pressure sensitive adhesive layer of at least one of a backlight unit or a liquid crystal panel, which constitute a liquid crystal display device, whereby the light having unnecessary wavelengths other than the RGB wavelength (R is red. G is green, and B is blue) emitted from the white LET) is blocked, color purity is improved, and a decrease in brightness is suppressed.

Further, WO2004/005981A, WO2008/090757A, and JP5205794B propose a color adjustment filter using a squarylium-based coloring agent having a specific substituent, as a color adjustment filter for correcting the color balance of the three colors without adversely affecting the emission of the three colors of RGB.

On the other hand, as a method of forming a color image of an organic EL display device, a three-color painting method of red (R), green (G), and blue (B), a color conversion method, and a color filter method are known; however, a method using a color filter method is widely used in the use application in TV. The color filter method is a method in which a white light emitting layer is used, and the white light from the light emitting layer is passed through a color filter to obtain the three primary colors of RGB. It is possible to use as a white light emitting layer, for example, a layer doped with a plurality of kinds of fluorescent materials. Such a white light emitting layer is called a white organic EL light source.

The white light from the white organic EL light source includes light having wavelengths unnecessary for forming a color image (for example, light that gives an orange color in the vicinity of 590 nm), which causes a decrease in color reproducibility of the organic EL display device.

For example, as an optical film capable of imparting good display characteristics in a case of being used in a display device, while having a function of cutting out blue light, JP2017-142412A discloses the invention of a color correction filter that contains at least one compound having a dimethine skeleton having a specific structure and by which the absorbance of an optical film at wavelengths of 420 nm and 450 nm satisfies a specific relational expression.

SUMMARY OF THE INVENTION

NTSC standard and DCI-P3 are examples of the color gamut standard that is emphasized in use applications in display devices. The National Television System Committee (NTSC) standard is a standard created by the National Television Standards Committee of the United States of America and has been used since the era of analog televisions, cathode ray tube (CRT), and monitors. On the other hand, DCI-P3 is a color gamut standard (a color space) for digital cinema advocated by Digital Cinema Initiatives, which is an industry group of American movie production companies.

The DCI-P3 standard is characterized by having a wide red color gamut as compared with the NTSC standard, while the NTSC standard is characterized by having a wide green color gamut as compared with the DCI-P3 standard. In addition, the ranges respectively covered by the two standards are different for the blue color gamut as well, and the two standards are separately used properly depending on the use application such as an image or a display image. The development of a wavelength selective absorption filter capable of realizing a high coverage rate in both the NTSC standard and the DCI-P3 standard is required as a wavelength selective absorption filter capable of achieving excellent color reproducibility since one wavelength selective absorption filter enables various applications to use applications in display devices.

However, as a result of the studies by the inventors of the present invention, it has been found that in the methods described in the above JP2016-90998A, WO2004/005981A, WO2008/090757A, JP5205794B, and JP2017-142412A, the color reproducibility and the suppression of brightness decrease in the color gamuts of both standards of the NTSC standard and the DCI-P3 standard, which are emphasized in use applications in display devices, are not sufficient.

It has been found that the technique described in JP2016-90998A has problems that the tint changes depending on the visible direction, and excellent color reproducibility is hardly realized since the directivity of the fluorescence emitted by a dye is different from the directivity of the display light emitted from the backlight unit, and that a decrease in contrast occurs in a case where a layer containing a dye is disposed at a position sandwiched between two polarizing plates in a liquid crystal display device. Further, since the coloring agents described in WO2004/005981 A, WO2008/090757A, and JP5205794B absorb not only light in an unnecessary wavelength range but also light in a necessary wavelength range in a relatively large amount, the width of the decrease in brightness is large in a case where a layer containing this coloring agent is used to block the light having unnecessary wavelengths. As a result, sufficient color reproducibility has not been realized while suppressing a decrease in relative brightness. In addition, in a case of using the coloring agent described in JP2017-142412A, a decrease in brightness can be prevented to some extent, but sufficient color reproducibility has not been realized yet.

An object of the present invention is to provide a wavelength selective absorption filter capable of realizing excellent color reproducibility while suppressing a decrease in relative brightness, in a case of being used on the front surface of an image display device.

In addition, another object of the present invention is to provide a polarizing plate, a liquid crystal display device, or an organic electroluminescent display device, which includes this wavelength selective absorption filter.

As a result of diligent studies in consideration of the above problems, the inventors of the present invention found that in a case of adjusting the chromaticity of blue light by blocking light having a wavelength of 560 to 600 nm and further blocking light having a wavelength of 400 to 450 nm, it is possible to efficiently improve the color gamut coverage rates of the NTSC standard and the DCI-P3 standard, and it is possible to achieve both the suppression of brightness decrease by blocking light and the excellent color reproducibility. Further studies have been carried out based on these findings, whereby the present invention has been completed.

That is, the above object has been achieved by the following means.

<1> a Wavelength Selective Absorption Filter Comprising:

a resin; and the following dye A and dye C, each of which has a main absorption wavelength band in a different wavelength range, in which the dye A and the dye C do not have fluorescence, the dye A: a dye having a main absorption wavelength band in the wavelength selective absorption filter at a wavelength of 400 to 450 nm, the dye C: a dye having a main absorption wavelength band in the wavelength selective absorption filter at a wavelength of 560 to 600 nm.

<2> The wavelength selective absorption filter according to claim 1, in which the dye A is a coloring agent represented by General Formula (A1), General Formula (A1)

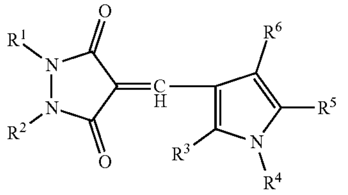

in the formula, $R^1$ and $R^2$ each independently represent an alkyl group or an aryl group, $R^3$ to $R^6$ each independently represent a hydrogen atom or a substituent, and $R^5$ and $R^6$ may be bonded to each other to form a 6-membered ring.

<3> A polarizing plate comprising the wavelength selective absorption filter according to <1> or <2>.

<4> An organic electroluminescent display device or a liquid crystal display device, comprising the wavelength selective absorption filter according to <1> or <2>.

In the present invention, in a case where there are a plurality of substituents, groups, and the like (hereinafter, referred to as substituents and the like) represented by specific reference numerals or formulae, or in a case where a plurality of substituents and the like are defined at the same time, the respective substituents and the like may be the same as or different from each other unless otherwise specified. The same applies to the definition of the number of substituents or the like. In addition, in a case where a plurality of substituents and the like are close to each other (particularly in a case where the substituents and the like are adjacent to each other), the substituents and the like may also be linked to each other to form a ring unless otherwise specified. In addition, unless otherwise specified, rings, for example, alicyclic rings, aromatic rings, and heterocyclic rings may be further fused to form a fused ring.

In the present invention, in a case where the number of carbon atoms of a certain group is defined, this number of carbon atoms means the number of carbon atoms of the entire group thereof unless otherwise specified in the present invention or the present specification. That is, in a case where this group is in a form of further having a substituent, the number of carbon atoms means the number of carbon atoms of the entire group including this substituent.

In the present invention, unless otherwise specified, the wavelength selective absorption filter may contain one kind of each of the components (a dye, a resin, another component that may be appropriately contained, and the like) constituting the wavelength selective absorption filter or may contain two or more kinds thereof.

In the present invention, in a case where an E type double bond and a Z type double bond are present in a molecule, the double bond may be any one thereof or may be a mixture thereof, unless otherwise specified.

In the present invention, the representation of a compound (including a complex) is used to mean not only the compound itself but also a salt thereof, and an ion thereof. In addition, it is meant to include those in which a part of the structure is changed, as long as the effects of the present invention are not impaired. Furthermore, it is meant that a compound, which is not specified to be substituted or unsubstituted, may have any substituent, as long as the effects of the present invention are not impaired. The same applies to the definition of a substituent or a linking group.

In addition, in the present invention, the numerical range indicated by using "to" means a range including the numerical values before and after "to" as the lower limit value and the upper limit value, respectively.

In the present invention, the "composition" includes a mixture in which the component concentration varies within a range in which a desired function is not impaired, in addition to a mixture in which the component concentration is constant (each component is uniformly dispersed).

In the present invention, the description of "having a main absorption wavelength band at a wavelength XX to YY nm" means that a wavelength at which the maximum absorption is exhibited (that is, the maximal absorption wavelength) is present in the wavelength range of XX to YY nm. Therefore, in a case where the maximal absorption wavelength is present in the above-described wavelength range, the entire absorption band including this wavelength may be in the above-described wavelength range or may also be widened up to the outside of the above-described wavelength range. In addition, in a case where there are a plurality of maximal absorption wavelengths, it suffices that a maximal absorption wavelength at which the highest absorbance is exhibited is present in the above-described wavelength range as long as the effects of the present invention are exhibited. That is, the maximal absorption wavelength other than the maximal absorption wavelength at which the highest absorbance is exhibited may be present either inside or outside the above-described wavelength range of XX to YY nm within the range in which the effects of the present invention are exhibited.

In a case of being used on the front surface of an image display device, the wavelength selective absorption filter and the polarizing plate of the present invention can exhibit excellent color reproducibility while suppressing a decrease in relative brightness.

Further, the organic electroluminescent display device and the liquid crystal display device according to the aspects of the present invention, which are equipped with the wavelength selective absorption filter according to the aspect of the present invention, can exhibit excellent color reproducibility while suppressing a decrease in relative brightness.

BRIEF DESCRIPTION OF THE DRAWINGS

FIG. 1 is a schematic view illustrating an outline of an embodiment of a liquid crystal display device equipped with a wavelength selective absorption filter of the present invention.

DESCRIPTION OF THE PREFERRED EMBODIMENTS

[Wavelength Selective Absorption Filter]

A wavelength selective absorption filter of the present invention contains a resin and the following dye A and dye C, each of which has a main absorption wavelength band in a different wavelength range. However, these dye A and dye C do not have fluorescence.

- the dye A: a dye having a main absorption wavelength band in the wavelength selective absorption filter at a wavelength of 400 to 450 nm,
- the dye C; a dye having a main absorption wavelength band in the wavelength selective absorption filter at a wavelength of 560 to 600 nm.

In the present invention, the main absorption wavelength band of a dye is a main absorption wavelength band of a dye, which is measured in a state of being a wavelength selective absorption filter. Specifically, in Examples described later, it is measured and calculated in a state of being a base material-attached wavelength selective absorption filter under the conditions described in the section of the maximal absorption value of the wavelength selective absorption filter.

Regarding the form of the wavelength selective absorption filter according to the embodiment of the present invention, it suffices that the dye in the wavelength selective absorption filter exhibits an absorption spectrum and the effects of the present invention can be exhibited. One form of the wavelength selective absorption filter according to the embodiment of the present invention shall be a filter obtained by dispersing (preferably dissolving) the "dye" in the resin to make the wavelength selective absorption filter a filter that exhibits a specific absorption spectrum derived from the dye. The dispersion may be any type of dispersion, such as a random type or a regular type.

In the present invention, the fact that a dye does not have fluorescence means that it does not exhibit fluorescence.

The above-described dye A and dye C that can be contained in the wavelength selective absorption filter according to the embodiment of the present invention may be each independently one kind or two or more kinds.

The wavelength selective absorption filter according to the embodiment of the present invention may also contain a dye other than the above-described dye A and dye C within the range in which the effects of the present invention are exhibited.

In a case of being used on the front surface of an image display device, the wavelength selective absorption filter according to the embodiment of the present invention can exhibit excellent color reproducibility while suppressing a decrease in relative brightness, since it contains the dye A and the dye C. The presumable reason for this is conceived to be as follows.

In a wavelength selective absorption filter containing the dye C having a main absorption wavelength band at a wavelength of 560 to 600 nm, the color reproduction range can be expanded as compared with a case where the dye is not contained. However, due to the fact that display light close to blue is widened to a region out of the NTSC standard, it has been still insufficient to reproduce a practically important color gamut by containing only the dye C and adjusting the content thereof. On the other hand, in the wavelength selective absorption filter according to the embodiment of the present invention, the dye C and the dye A having a main absorption wavelength band at a wavelength of 400 to 450 nm are contained together, and thus it is possible to adjust the chromaticity of the blue display light to a long wavelength side without significantly changing the area of the triangle formed by being connected on the xy chromaticity diagram in the xyY color system of the International Commission on Illumination (CIE) 1931. As a result, it is conceived that it is possible to improve the color reproducibility in a practically important region while suppressing a decrease in brightness due to containing the dye.

<Dye>

(Dye A)

The dye A is not particularly limited as long as the dye has the main absorption wavelength band in a wavelength of 400 to 450 nm in the wavelength selective absorption filter and does not have fluorescence, and various dyes can be used.

The dye A is preferably a coloring agent represented by General Formula (A1) in that an absorption waveform in the main absorption wavelength band is sharp.

In a case where a coloring agent represented by General Formula (A1) is used as the dye A, it is possible for the wavelength selective absorption filter according to the embodiment of the present invention to exhibit excellent light resistance, in addition to the achievement of the suppression of the decrease in relative brightness and the improvement of the color reproducibility.

General Formula (A1)

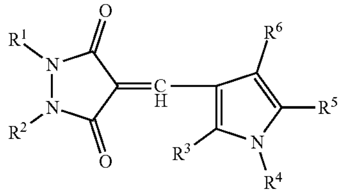

In General Formula (A1), $R^1$ and $R^2$ each independently represent an alkyl group or an aryl group, $R^3$ to $R^6$ each independently represent a hydrogen atom or a substituent, and $R^5$ and $R^6$ may be bonded to each other to form a 6-membered ring.

The alkyl group that can be employed as $R^1$ and $R^2$ may be any one of an unsubstituted alkyl group or a substituted alkyl group having a substituent, may be linear or branched, and may have a cyclic structure.

Examples of the unsubstituted alkyl group include a methyl group, an ethyl group, a normal propyl group, an isopropyl group, and a cyclohexyl group. The number of carbon atoms in the unsubstituted alkyl group is preferably 1 to 12 and more preferably 1 to 6.

Examples of the substituent that can be employed by the substituted alkyl group include a substituent included in the substituent group A below.

(Substituent Group A)

A halogen atom, an alkyl group, a cycloalkyl group, an aralkyl group, an alkenyl group, an alkynyl group, an aryl group, a heterocyclic group, a cyano group, a hydroxy group, a nitro group, a carboxyl group (may be in the form of a salt), an alkoxy group, an aryloxy group, a silyloxy group, a heterocyclic oxy group, an acyloxy group, a carbamoyloxy group, a sulfonyloxy group, an alkoxycarbonyloxy group, an aryloxycarbonyloxy group, an amino group (containing a substituted amino group represented by —NRa2 in addition to —NH2, where Ra each independently represent a hydrogen atom, an alkyl group, an aryl group, or a heteroaryl group, provided that at least one Ra is an alkyl group, an aryl group, or a heteroaryl group), an acylamino group, an aminocarbonylamino group, an alkylcarbonylamino group, an alkoxycarbonylamino group, an aryloxycarbonylamino group, a sulfamoylamino group, an alkylsulfonylamino group, an arylsulfonylamino group, a sulfonamide group, a mercapto group, an alkylthio group, an arylthio group, a heterocyclic thio group, a sulfamoyl group, a sulfa group (may be in the form of a salt), an alkylsulfinyl group, an arylsulfinyl group, an alkylsulfonyl group, an arylsulfonyl group, an acyl group, an aryloxycarbonyl group, an alkoxycarbonyl group, a carbamoyl group, an imide group, a phosphino group, a phosphinyl group, a phosphinyloxy group, a phosphinylamino group, or a silyl group, and a monovalent group in which at least two of these are linked.

Among the substituent group A, preferred examples of the substituent that can be contained in the substituted alkyl group include a halogen atom, an aryl group, an alkoxy group, an acyl group, and a hydroxy group.

The total number of carbon atoms in the substituted alkyl group is preferably 1 to 12. Examples thereof include a benzyl group, a hydroxybenzyl group, and a methoxyethyl group.

The total number of carbon atoms in the substituted alkyl group means the number of carbon atoms in the entire substituted alkyl group including the substituent that can be contained in the substituted alkyl group. Hereinafter, this will be used in the same meaning in regard to other groups as well.

In a case where both $R^1$ and $R^2$ represent an alkyl group, the alkyl groups may be the same or different from each other.

The aryl group that can be employed as $R^1$ and $R^2$ may be any one of an unsubstituted aryl group or a substituted aryl group having a substituent.

The unsubstituted aryl group is preferably an aryl group having 6 to 12 carbon atoms, and examples thereof include a phenyl group.

Examples of the substituent that can be employed by the substituted aryl group include a substituent included in the substituent group A below.

Among the substituent group A, preferred examples of the substituent that can be contained in the substituted aryl group include a halogen atom (for example, a chlorine atom, a bromine atom, or an iodine atom), a hydroxy group, a carboxy group, a sulfonamide group, or an amino group, (preferably, a substituted amino group represented by $—NR^a{}_2$, where $R^a$'s each independently represents a hydrogen atom or an alkyl group, provided that at least one $R^a$ is an alkyl group, and the amino group preferably has 1 to 4 carbon atoms), an alkyl group (preferably, an alkyl group having 1 to 4 carbon atoms; for example, methyl, ethyl, normal propyl, or isopropyl), an alkoxy group (preferably, an alkoxy group having 1 to 4 carbon atoms; for example, methoxy, ethoxy, normal propoxy, or isopropoxy), an alkoxycarbonyl group (preferably, an alkoxycarbonyl groups having 2 to 5 carbon atoms; for example, methoxycarbonyl, ethoxycarbonyl, normal propoxycarbonyl, or isopropoxycarbonyl), and a sulfonyloxy group, as well as a monovalent group in which at least the two thereof are linked to each other.

The substituted aryl group is preferably an aryl group having a total number of carbon atoms of 6 to 18.

Examples thereof include a 4-chlorophenyl group, a 2,5-dichlorophenyl group, a hydroxyphenyl group, a 4-carboxyphenyl group, a 3,5-dicarboxyphenyl group, a 4-methanesulfonamidephenyl group, a 4-methylphenyl group, a 4-methoxyphenyl group, a 4-(2-hydroxyethoxy)phenyl group, an N,N-dimethylaminophenyl group, a 4-(N-carboxymethyl-N-ethylamino)phenyl group, a 4-ethoxycarbonylphenyl group, and a 4-methanesulfonyloxyphenyl group.

In a case where both $R^1$ and $R^2$ represent an aryl group, the aryl groups may be the same or different from each other.

Examples of the substituent that can be employed as $R^3$, $R^4$, $R^5$, and $R^6$ include substituents included in the substituent group A.

Among the substituent group A, $R^3$, $R^5$, and $R^6$ are preferably an alkyl group or an aryl group. That is, $R^3$, $R^5$, and $R^6$ are each independently preferably a hydrogen atom, an alkyl group, or an aryl group.

In addition, in the substituent group A, $R^4$ is preferably an alkyl group or an aryl group. That is, $R^4$ is preferably a hydrogen atom, an alkyl group, or an aryl group.

The alkyl group that can be employed as $R^3$, $R^5$, and $R^6$ may be any of an unsubstituted alkyl group or a substituted alkyl group having a substituent, and any of linear or branched, and may have a cyclic structure.

Examples of the unsubstituted alkyl group that can be employed as $R^3$, $R^5$, and $R^6$ include a methyl group, an ethyl group, a normal propyl group, and an isopropyl group. The number of carbon atoms of the unsubstituted alkyl group that can be employed as $R^3$, $R^5$, and $R^6$ is preferably 1 to 8 and more preferably 1 to 4.

Examples of the substituent that can be contained in the substituted alkyl group as $R^3$, $R^5$, and $R^6$ include substituents included in the substituent group A.

Preferred examples of the substituent that can be contained in the substituted alkyl group as $R^3$, $R^5$, and $R^6$ include an aryl group (preferably a phenyl group), a halogen atom, an acyl group, an amino group, an alkoxycarbonyl group, a carboxy group, and a hydroxy group.

The total number of carbon atoms in the substituted alkyl group that can be employed as $R^3$, $R^5$, and $R^6$ is preferably 1 to 8. For example, a benzyl group, a carboxymethyl group, and a hydroxymethyl group are exemplified.

In a case where all of $R^3$, $R^5$, and $R^6$ represent alkyl groups, the alkyl groups may be the same or different from each other.

The aryl group that can be employed as $R^3$, $R^5$, and $R^6$ may be any one of an unsubstituted aryl group or a substituted aryl group which has been substituted.

The unsubstituted aryl group that can be employed as $R^3$, $R^5$, and $R^6$ is preferably an aryl group having 6 to 10 carbon atoms, and examples thereof include a phenyl group.

Examples of the substituent that can be contained in the substituted aryl group as $R^3$, $R^5$, and $R^6$ include substituents included in the substituent group A.

Preferred examples of the substituent that can be contained in the substituted aryl group as $R^3$, $R^5$, and $R^6$ include a halogen atom (for example, a fluorine atom, a chlorine atom, a bromine atom, or an iodine atom), a hydroxy group, a carboxy group, an alkyl group (preferably an alkyl groups having 1 to 4 carbon atoms; for example, methyl, ethyl, normal propyl, or isopropyl).

The substituted aryl group that can be employed as $R^3$, $R^5$, and $R^6$ is preferably an aryl group having a total number of carbon atoms of 6 to 10. Examples thereof include a 2-fluorophenyl group, a 4-chlorophenyl group, a 2,5-dichlorophenyl group, a hydroxyphenyl group, a carboxyphenyl group, a 3,5-dicarboxyphenyl group, and a 4-methylphenyl group.

In a case where both $R^5$ and $R^6$ are a substituent, $R^3$ is preferably a hydrogen atom from the viewpoint of light resistance and heat resistance.

In a case where $R^3$, $R^5$; and $R^6$ are all aryl groups, the aryl groups may be the same or different from each other.

The alkyl group that can be employed as $R^4$ may be any one of an unsubstituted alkyl group or a substituted alkyl group having a substituent, may be linear or branched, and may have a cyclic structure.

Examples of the unsubstituted alkyl group that can be employed as $R^4$ include a methyl group, an ethyl group, a normal propyl group, an isopropyl group, and a cyclohexyl group. The number of carbon atoms of the unsubstituted alkyl group that can be employed as $R^4$ is preferably 1 to 8 and more preferably 1 to 4.

Examples of the substituent that can be contained in the substituted alkyl group as $R^4$ include substituents included in the substituent group A.

Preferred examples of the substituent that can be contained in the substituted alkyl group as $R^4$ include an aryl group (preferably, a phenyl group), a heterocyclic group, a carboxy group, a hydroxy group, an alkyl group (preferably, an alkyl group having 1 to 4 carbon atoms; for example, methyl, ethyl, normal propyl, or isopropyl), an alkoxy group (preferably, an alkoxy group having 1 to 4 carbon atoms; for example, methoxy, ethoxy, normal propoxy, or isopropoxy), an aryloxy group, an alkoxycarbonyl group (preferably, an alkoxycarbonyl groups having 2 to 5 carbon atoms; for example, methoxycarbonyl, ethoxycarbonyl, normal propoxycarbonyl, or isopropoxycarbonyl), an alkylamino group (preferably an alkylamino group having 1 to 4 carbon atoms; for example, a dimethylamino group), an alkylcarbonylamino group (preferably, an alkylcarbonylamino group having 1 to 4 carbon atoms; for example, a methylcarbonylamino group), a cyano group, and an acyl group (for example, an acetyl group, a propionyl group, a benzoyl group, or a mesyl group), as well as a monovalent group in which at least the two thereof are linked to each other.

The total number of carbon atoms in the substituted alkyl group that can be employed as $R^4$ is preferably 1 to 18.

For example, a benzyl group, a carboxybenzyl group, a hydroxybenzyl group, a methoxycarbonylethyl group, an ethoxycarbonylmethyl group, a 2-cyanoethyl group, a 2-propionylaminoethyl group, a dimethylaminomethyl group, a methylcarbonylaminopropyl group, a di(methoxycarbonylmethyl)aminopropyl group, and a phenacyl group are exemplified.

The aryl group that can be employed as $R^4$ may be any one of an unsubstituted aryl group or a substituted aryl group having a substituent.

The unsubstituted aryl group that can be employed as $R^4$ is preferably an aryl group having 6 to 12 carbon atoms, and examples thereof include a phenyl group.

Examples of the substituent that can be contained in the substituted aryl group as $R^4$ include substituents included in the substituent group A.

Preferred examples of the substituent that can be contained in the substituted aryl group as $R^4$ include a halogen atom (for example, a chlorine atom, a bromine atom, or an iodine atom), a hydroxy group, a carboxy group, a sulfonamide group, an amino group, an alkyl group (preferably, an alkyl group having 1 to 4 carbon atoms; for example, methyl, ethyl, normal propyl, or isopropyl), an alkoxy group (preferably, an alkoxy group having 1 to 4 carbon atoms; for example, methoxy, ethoxy, normal propoxy, or isopropoxy), an alkoxycarbonyl group (preferably, an alkoxycarbonyl groups having 2 to 5 carbon atoms; for example, methoxycarbonyl, ethoxycarbonyl, normal propoxycarbonyl, or isopropoxycarbonyl), and a sulfonyloxy group, as well as a monovalent group in which at least the two thereof are linked to each other.

The amino group that can be contained in the substituted aryl group as $R^4$ may be any one of an unsubstituted amino group ($—NH_2$) or a substituted amino group having a substituent ($—NR^a{}_2$ in the substituent group A).

In the amino group ($—NR^a{}_2$) that can be contained in the substituted aryl group as $R^4$, examples of $R^a$ include the same group as the substituted alkyl group as $R^4$.

The substituted amino group is preferably an alkylamino group in which one or two hydrogen atoms in the amino group are substituted with an alkyl group.

Examples of the alkylamino group include a methylamino group, a dimethylamino group, a diethylamino group, and a pyrrolidino group. The number of carbon atoms in the alkylamino group is preferably 1 to 8 and more preferably 1 to 4.

Further, the alkyl group in the alkylamino group may be further substituted, and for example, a di(alkoxycarbonylalkyl)amino group is preferably mentioned. The di(alkoxycarbonylalkyl)amino group preferably has 6 to 10 carbon atoms and more preferably 6 to 8 carbon atoms.

The substituted aryl group that can be employed as $R^4$ is preferably an aryl group having a total number of carbon atoms of 6 to 22. Examples thereof include a 4-chlorophenyl group, a 2,5-dichlorophenyl group, a hydroxyphenyl group, a 2,5-methoxyphenyl group, a 2-methoxy-5-ethoxycarbonylphenyl group, a 4-ethyloxycarbonylphenyl group, a 4-ethoxycarbonylphenyl group, a 4-butoxycarbonylphenyl group, a 4-octyloxycarbonylphenyl group, a 4-carboxyphenyl group, a 3,5-dicarboxyphenyl group, a 4-methanesulfonamidephenyl group, a 4-methylphenyl group, a 4-methoxyphenyl group, a 4-ethoxyphenyl group, a 4-(2-hydroxyethoxy)phenyl group, an N,N-dimethylaminophenyl group, an N,N-diethylaminophenyl group, a 4-(N-carboxymethyl-N-ethylamino)phenyl group, a 4-{N,N-di(ethoxycarbonylmethyl)amino}phenyl group, a 4-{di(ethoxycarbonylmethyl)amino}carbonylphenyl group, a 4-ethoxycarbonylphenyl group, a 4-methanesulfonyloxyphenyl group, a 4-acetylsulfamoylphenyl group, a 4-propionylsulfamoylphenyl group, and a 4-methanesulfonamidephenyl group.

$R^5$ and $R^6$ may be bonded to each other to form a 6-membered ring. Hydrogen atoms may be eliminated during the formation of the ring to form an aromatic ring or an aliphatic ring having an unsaturated bond.

The 6-membered ring formed by $R^5$ and $R^6$ being bonded to each other is preferably a benzene ring.

In particular, from the viewpoint of light resistance, among $R^1$ and $R^2$ in General Formula (A1), it is preferable that $R^1$ is an alkyl group, and it is more preferable that $R^1$ is an alkyl group and $R^2$ is an alkyl group or an aryl group. In addition, from the same viewpoint, it is still more preferable that both $R^1$ and $R^2$ are each independently an alkyl group, and it is particularly preferable that both $R^1$ and $R^2$ are an alkyl group having 1 to 8 carbon atoms.

Further, in terms of heat resistance and light resistance, it is also preferable that both $R^1$ and $R^2$ in General Formula (A1) are an aryl group.

In a case where $R^1$ and $R^2$ each independently represent an aryl group, it is preferable that $R^3$, $R^5$, and $R^6$ are each independently a hydrogen atom, an alkyl group, or an aryl group and that at least one of $R^3$ or $R^6$ is preferably a hydrogen atom. Among the above, from the viewpoint of heat resistance and light resistance, a case where $R^3$ represents a hydrogen atom, and $R^5$ and $R^6$ each independently represent an alkyl group or an aryl group is more preferable. A case where $R^3$ represents a hydrogen atom and $R^5$ and $R^6$ each independently represent an alkyl group is still more preferable. A case where $R^3$ represents a hydrogen atom, $R^5$ and $R^6$ each independently represent an alkyl group, and $R^5$ and $R^6$ are bonded to each other to form a ring and fused with a pyrrole ring to form an indole ring together with the pyrrole ring is particularly preferable. That is, the coloring agent represented by General Formula (A1) is particularly preferably a coloring agent represented by General Formula (A2).

General Formula (A2)

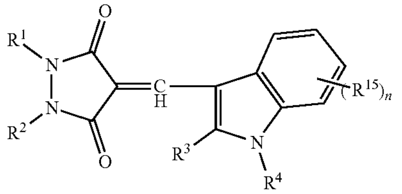

In General Formula (A2), $R^1$ to $R^4$ respectively have the same meanings as R to $R^4$ in General Formula (A1), and the same applies to the preferred aspects thereof.

In General Formula (A2), $R^{15}$ represents a substituent. Examples of the substituent that can be employed as $R^{15}$ include substituents included in the substituent group A. $R^{15}$ is preferably an alkyl group, an aryl group, a halogen atom, an acyl group, an amino group, or an alkoxycarbonyl group.

As the alkyl group and the aryl group, which can be employed as $R^{15}$, the descriptions for the alkyl group and the aryl group, which can be employed as $R^3$, $R^5$, and $R^6$, can be applied respectively.

Examples of the halogen atom that can be employed as $R^{15}$ include a chlorine atom, a bromine atom, and an iodine atom.

Examples of the acyl group that can be employed as $R^{15}$ include an acetyl group, a propionyl group, and a butyroyl group.

For the amino group that can be employed as $R^{15}$, the description for the amino group that can be contained in the substituted aryl group as $R^4$ can be applied. Further, a nitrogen-containing heterocyclic group having a 5-membered to 7-membered ring in which an alkyl group on the nitrogen atom of the amino group is bonded to form a ring is also preferable.

The alkoxycarbonyl group that can be employed as $R^{15}$, is preferably an alkoxycarbonyl group having 2 to 5 carbon atoms, and examples thereof include methoxycarbonyl, ethoxycarbonyl, normal propoxycarbonyl, and isopropoxycarbonyl.

n represents an integer of 0 to 4. n is not particularly limited, and is, for example, preferably 0 or 1.

Specific examples of the coloring agent represented by General Formula (A1) are shown below. However, the present invention is not limited thereto.

In the specific examples below, Me represents a methyl group.

E-1

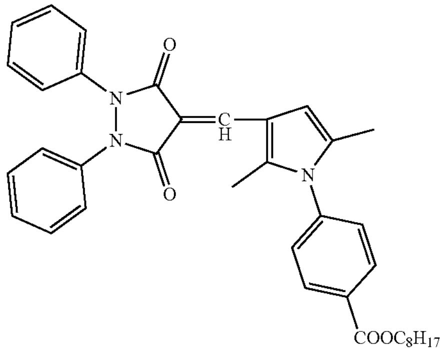

E-2
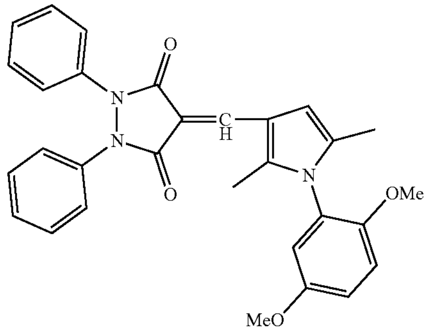
E-3
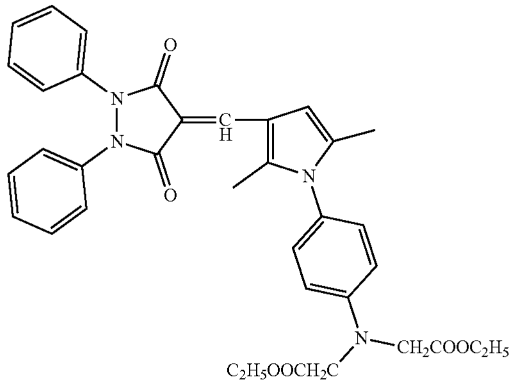
E-4
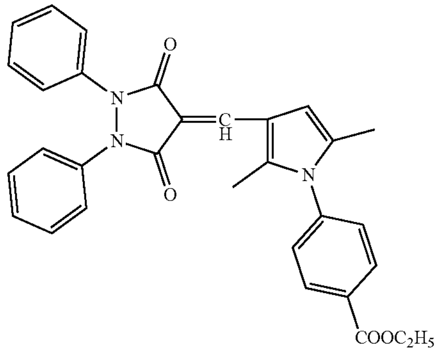
E-5
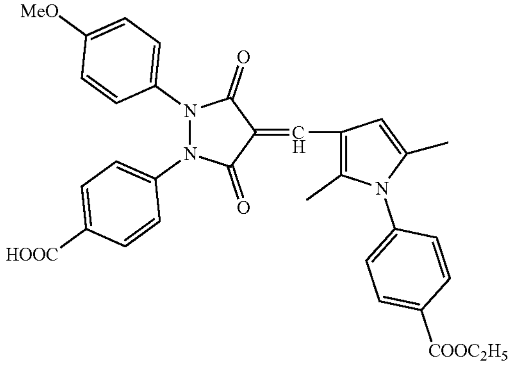
E-6
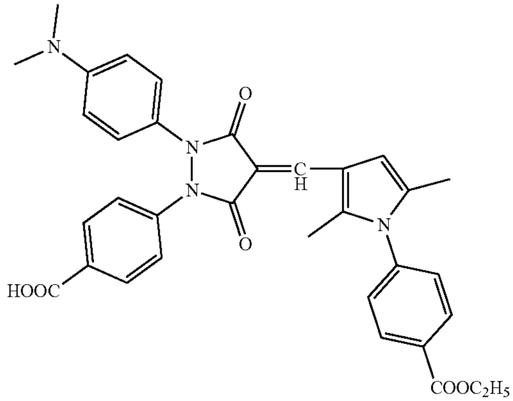
E-7
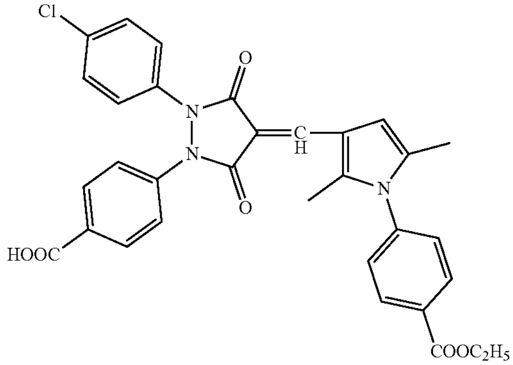
E-8
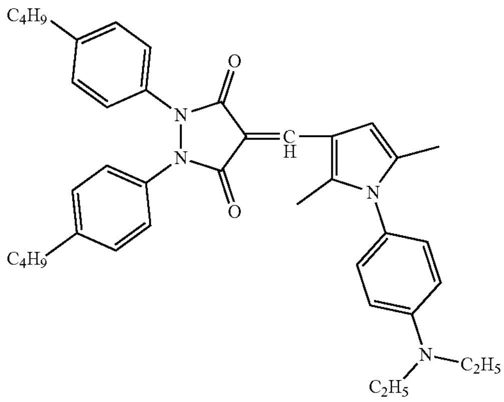
E-9
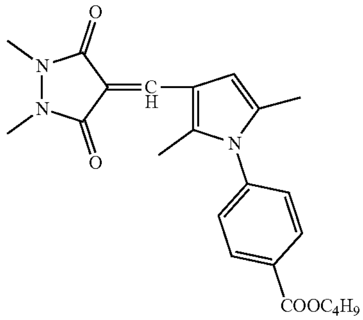

E-10
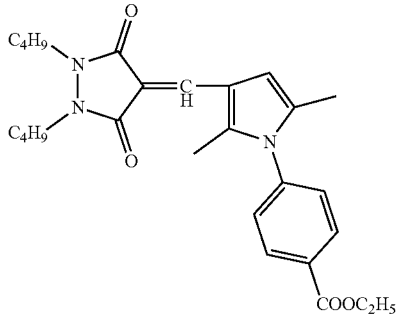
E-11
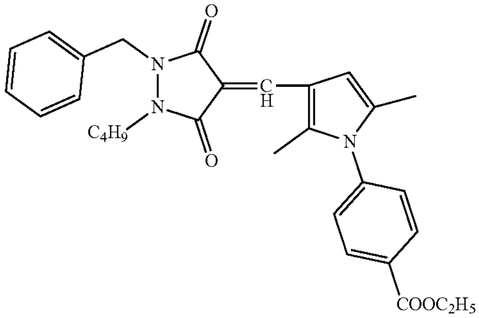
E-12
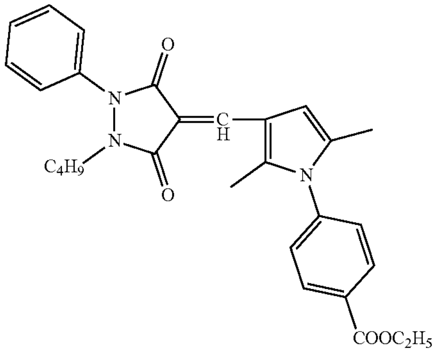
E-13
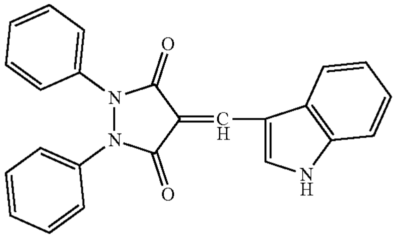
E-14
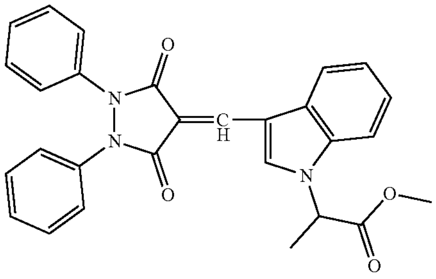
E-15
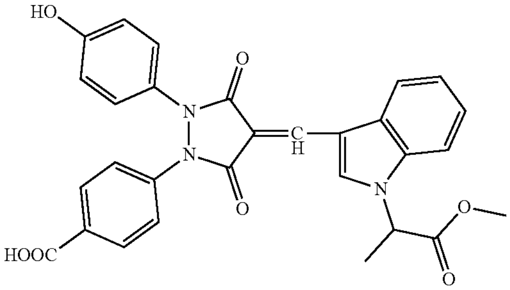
E-16
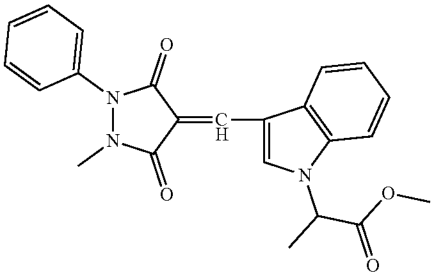
E-17
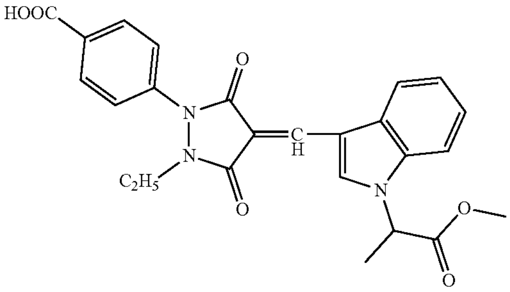
E-18
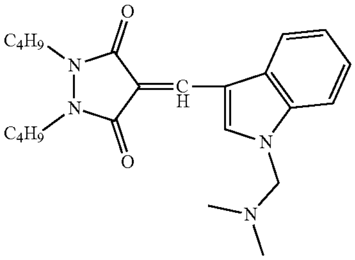
E-19
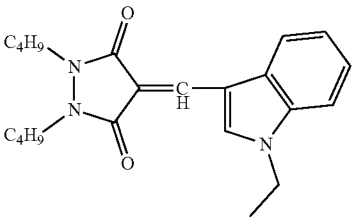
E-20
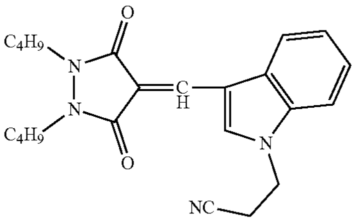

-continued
E-21
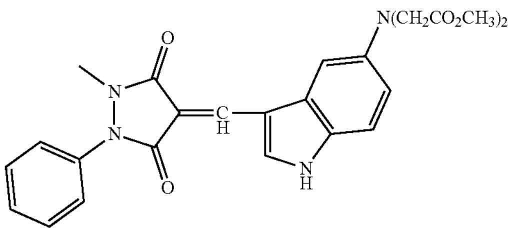
E-22
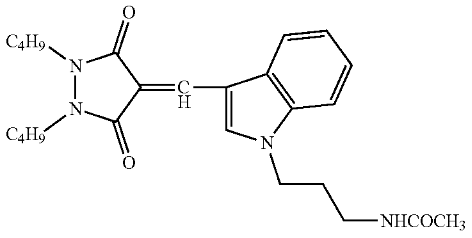
E-23
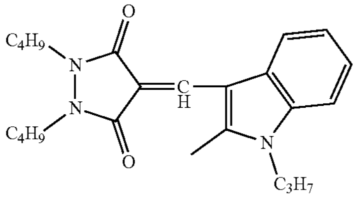
E-24
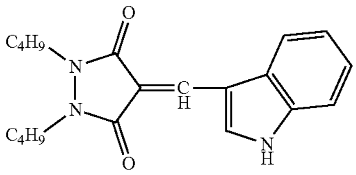
E-25
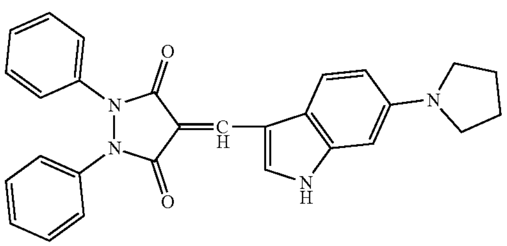
E-26
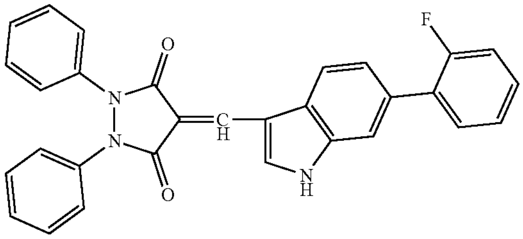
-continued
E-27
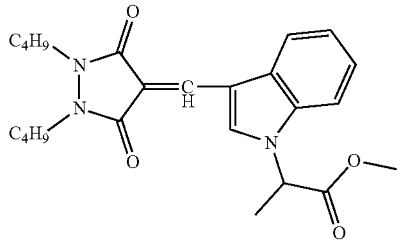
E-28
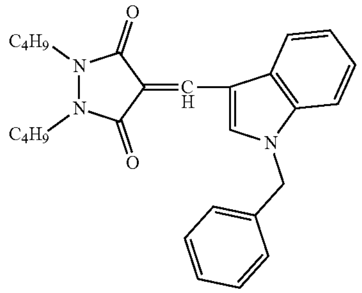
E-29
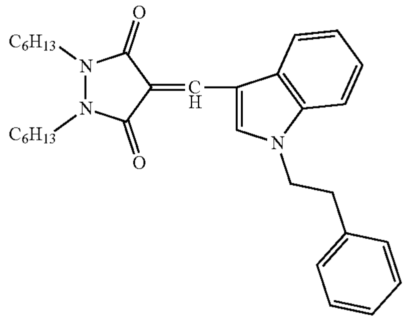
E-30
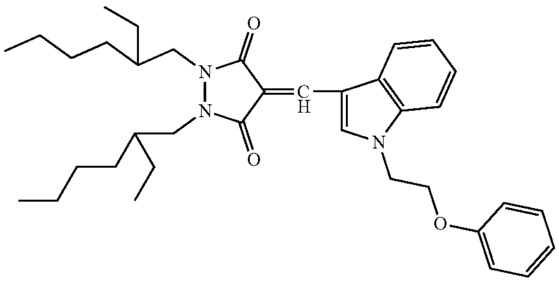
E-31
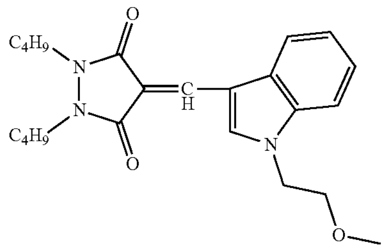

-continued

E-32

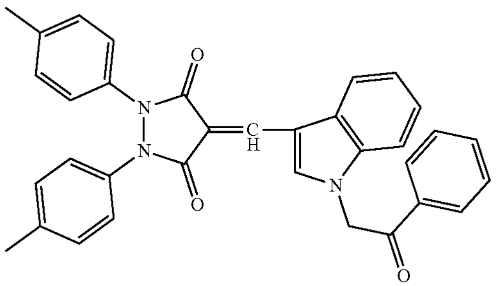

E-33

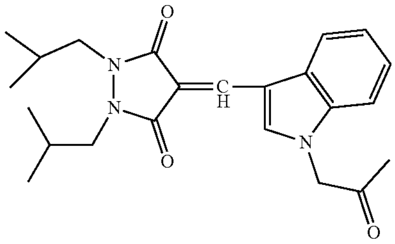

E-34

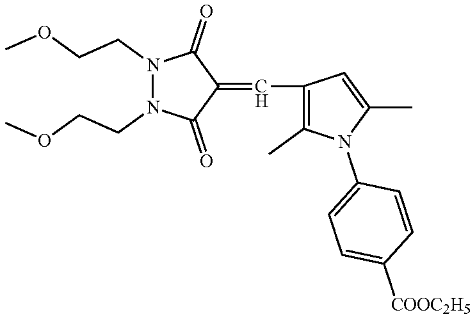

E-35

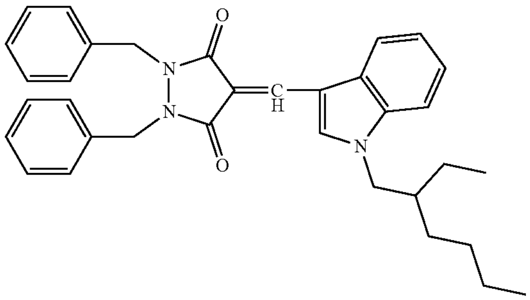

E-36

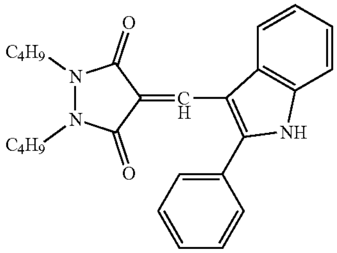

-continued

E-37

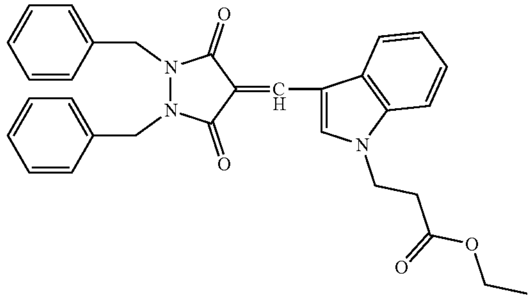

E-38

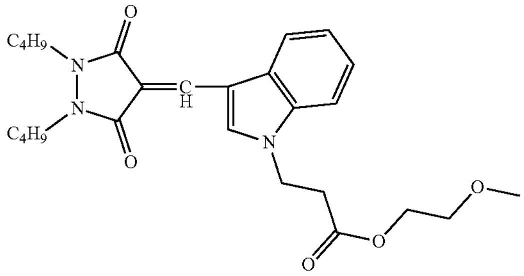

E-39

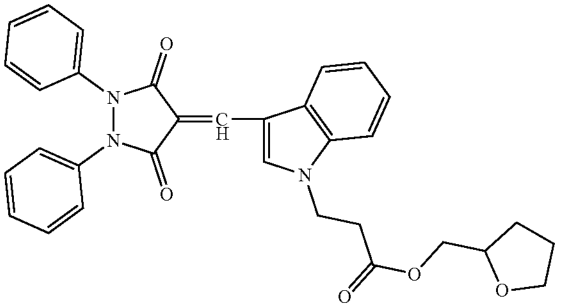

As the dye A, in addition to the coloring agent represented by General Formula (A1), the compounds described in paragraphs 0012 to 0067 of JP1993-53241A (JP-H5-53241A) and the compounds described in paragraphs 0011 to 0076 of JP2707371B can also be preferably used.

The main absorption wavelength band of the dye A in the wavelength selective absorption filter is preferably 400 to 430 nm.

(Dye C)

The dye C is not particularly limited as long as the dye has the main absorption wavelength band in a wavelength of 560 to 600 nm in the wavelength selective absorption filter and does not have fluorescence, and various dyes can be used.

Specific examples of the dye C include individual coloring agents (dyes) which are based on, for example, tetraazaporphyrin (TAP), squarine, and cyanine (CY).

Among these, the dye C is preferably a squarine-based coloring agent, and more preferably a squarine-based coloring agent represented by General Formula (1) in that the absorption waveform in the main absorption wavelength band is sharp. In a case where a coloring agent having a sharp absorption waveform as described above is used as the dye C, it is possible to widen the color reproduction range while suppressing a brightness decrease.

In the present invention, in the coloring agent represented by each General Formula, a cation is present in a delocalized manner, and thus a plurality of tautomer structures are present. Therefore, in the present invention, in a case where at least one tautomer structure of a certain coloring agent matches with each general formula, the certain coloring agent shall be a coloring agent represented by the general formula. Therefore, a coloring agent represented by a specific general formula can also be said to be a coloring agent having at least one tautomer structure that can be represented by the specific general formula. In the present invention, a coloring agent represented by a general formula may have any tautomer structure as long as at least one tautomer structure of the coloring agent matches with the general formula.

General Formula (1)

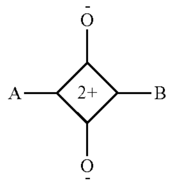

In General Formula (1), A and B each independently represent an aryl group which may have a substituent, a heterocyclic group which may have a substituent, or —CH═G. Here, G represents a heterocyclic group which may have a substituent.

The aryl group that can be employed as A or B is not particularly limited and may be a group consisting of a monocyclic ring or a group consisting of a fused ring. The aryl group preferably has 6 to 30 carbon atoms, more preferably 6 to 20 carbon atoms, and still more preferably 6 to 12 carbon atoms. Examples of the aryl group include groups respectively consisting of a benzene ring and a naphthalene ring, and a group consisting of a benzene ring is more preferable.

The heterocyclic group that can be employed as A or B is not particularly limited, and examples thereof include a group consisting of an aliphatic heterocyclic ring or an aromatic heterocyclic ring. A group consisting of an aromatic heterocyclic ring is preferable. Examples of the heteroaryl group that is an aromatic heterocyclic group include a heteroaryl group that can be employed as a substituent X described below. The aromatic heterocyclic group that can be employed as A or B is preferably a group of a 5-membered ring or a 6-membered ring and more preferably a group of a nitrogen-containing 5-membered ring. Specific examples thereof suitably include a group consisting of any one of a pyrrole ring, a furan ring, a thiophene ring, an imidazole ring, a pyrazole ring, a thiazole ring, an oxazole ring, a triazole ring, an indole ring, an indolenine ring, an indoline ring, a pyridine ring, a pyrimidine ring, a quinoline ring, a benzothiazole ring, a benzoxazole ring, or a pyrazolotriazole ring. Among these, a group consisting of any one of a pyrrole ring, a pyrazole ring, a thiazole ring, a pyridine ring, a pyrimidine ring, or a pyrazolotriazole ring is preferable. The pyrazolotriazole ring consists of a fused ring of a pyrazole ring and a triazole ring and may be a fused ring obtained by fusing at least one pyrazole ring and at least one triazole ring. Examples thereof include fused rings in General Formulae (4) and (5) described below.

A and B may be bonded to a squaric acid moiety (the 4-membered ring represented by General Formula (1)) at any moiety (ring-constituting atom) without particular limitation and is preferable to be bonded to a carbon atom.

G in —CH═G that can be employed as A or B represents a heterocyclic group which may have a substituent, and examples thereof suitably include examples shown in the heterocyclic group that can be employed as A or B. Among these, a group consisting of any one of a benzoxazole ring, a benzothiazole ring, an indoline ring, or the like is preferable.

At least one of A or B may have a hydrogen bonding group that forms an intramolecular hydrogen bond.

Each of A, B, and G may have the substituent X, and, in a case where A. B. or G has the substituent X, adjacent substituents may be bonded to each other to further form a ring structure. In addition, a plurality of substituents X may be present.

Examples of the substituent X include substituents that can be employed as $R^1$ in General Formula (2) described below, and specific examples thereof include a halogen atom, a cyano group, a nitro group, an alkyl group (including a cycloalkyl group), an alkenyl group, an alkynyl group, an aryl group, a heteroaryl group, an aralkyl group, and a ferrocenyl group, $—OR^{10}$, $—C(═O)R^{11}$, $—C(═O)OR^{12}$, $—OC(═O)R^{13}$, $—NR^{14}R^{15}$, $—NHCOR^{16}$, $—CONR^{17}R^{18}$, $—NHCONR^{19}R^{20}$, $—NHCOOR^{21}$, $—SR^{22}$, $—SO_2R^{23}$, $—SO_3R^{24}$, $—NHSO_2R^{25}$, and $—SO_2NR^{26}R^{27}$. Further, it is also preferable that the substituent X has a quencher moiety described later, in addition to the ferrocenyl group.

In General Formula (1), $R^{10}$ to $R^{27}$ each independently represent a hydrogen atom, an aliphatic group, an aromatic group, or a heterocyclic group. The aliphatic group and the aromatic group that can be employed as $R^{10}$ to $R^{27}$ are not particularly limited, and appropriately selected from an alkyl group, a cycloalkyl group, an alkenyl group, and an alkynyl group which are classified as aliphatic groups, and an aryl group which is classified as an aromatic group, in the substituent that can be employed as $R^1$ in General Formula (2) described later. The heterocyclic group that can be employed as $R^{10}$ to $R^{27}$ may be aliphatic or aromatic, and it can be appropriately selected from heteroaryl groups or heterocyclic groups that can be employed as $R^1$ in General Formula (2) described below.

It is noted that in a case where $R^{12}$ of $—COOR^{12}$ is a hydrogen atom (that is, a carboxy group), the hydrogen atom may be dissociated (that is, a carbonate group) or may be in a salt state. In addition, in a case where $R^{24}$ of $—SO_3R^{24}$ is a hydrogen atom (that is, a sulfo group), the hydrogen atom may be dissociated (that is, a sulfonate group) or may be in a salt state.

Examples of the halogen atom that can be employed as the substituent X include a fluorine atom, a chlorine atom, a bromine atom, and an iodine atom.

The alkyl group that can be employed as the substituent X preferably has 1 to 20 carbon atoms, more preferably 1 to 15 carbon atoms, and still more preferably 1 to 8 carbon atoms. The alkenyl group preferably has 2 to 20 carbon atoms, more preferably 2 to 12 carbon atoms, and still more preferably 2 to 8 carbon atoms. The alkynyl group preferably has 2 to 40 carbon atoms, more preferably 2 to 30 carbon atoms, and particularly preferably 2 to 25 carbon atoms. The alkyl group, the alkenyl group, and the alkynyl group each may be linear, branched, or cyclic, and they are preferably linear or branched.

The aryl group that can be employed as the substituent X includes a monocyclic group or a fused ring group. The aryl group preferably has 6 to 30 carbon atoms, more preferably 6 to 20 carbon atoms, and still more preferably 6 to 12 carbon atoms.

An alkyl portion in the aralkyl group that can be employed as the substituent X is the same as that in the alkyl group. An aryl portion in the aralkyl group is the same as that in the aryl group. The aralkyl group preferably has 7 to 40 carbon atoms, more preferably 7 to 30 carbon atoms, and still more preferably 7 to 25 carbon atoms.

The heteroaryl group that can be employed as the substituent X includes a group consisting of a single ring or a fused ring, a group consisting of a single ring or a fused ring having 2 to 8 rings is preferable, and a group consisting of a single ring or a fused ring having 2 to 4 rings is more preferable. The number of heteroatoms constituting the ring of the heteroaryl group is preferably 1 to 3. Examples of the heteroatom constituting the ring of the heteroaryl group include a nitrogen atom, an oxygen atom, and a sulfur atom. The heteroaryl group is preferably a group consisting of a 5-membered ring or a 6-membered ring. The number of carbon atoms constituting the ring in the heteroaryl group is preferably 3 to 30, more preferably 3 to 18, and more preferably 3 to 12. Examples of the heteroaryl group include each group consisting of any one of a pyridine ring, a piperidine ring, a furan ring, a furfuran ring, a thiophene ring, a pyrrole ring, a quinoline ring, a morpholine ring, an indole ring, an imidazole ring, a pyrazole ring, a carbazole ring, a phenothiazine ring, a phenoxazine ring, an indoline ring, a thiazole ring, a pyrazine ring, a thiadiazine ring, a benzoquinoline ring, or a thiadiazole ring.

The ferrocenyl group that can be employed as substituent X is preferably represented by General Formula (2M).

General Formula (2M)

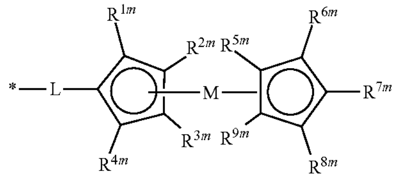

In General Formula (2M), L represents a single bond or a divalent linking group that does not conjugate with A. B, or G in General Formula (1). $R^{1m}$ to $R^{9m}$ each independently represent a hydrogen atom or a substituent. M represents an atom that can constitute a metallocene compound and represents Fe. Co, Ni, Ti, Cu, Zn, Zr, Cr, Mo, Os, Mn, Ru, Sn, Pd, Rh, V, or Pt. * represents a bonding site to A, B, or G.

In the present invention, in a case where L in General Formula (2M) is a single bond, a cyclopentadienyl ring directly bonded to A, B, or G (a ring having $R^{1m}$ in General Formula (2M)) is not included in the conjugated structure which conjugates with A, B, or G.

The divalent linking group that can be employed as L is not particularly limited as long as it is a linking group that does not conjugate with A, B, or G, and it may have a conjugated structure in the inside thereof or at a cyclopentadiene ring side end part in General Formula (2M). Examples of the divalent linking group include an alkylene group having 1 to 20 carbon atoms, an arylene group having 6 to 20 carbon atoms, a divalent heterocyclic group obtained by removing two hydrogens from the heterocyclic ring, —CH═CH—, —CO—, —CS—, —NR—(R represents a hydrogen atom or a monovalent substituent), —O—, —S—, —$SO_2$—, or —N═CH—, or a divalent linking group formed by combining a plurality (preferably, 2 to 6) of these groups. The divalent linking group is preferably a group selected from the group consisting of an alkylene group having 1 to 8 carbon atoms, an arylene group having 6 to 12 carbon atoms, —CH═CH—, —CO—, —NR— (R is as described above), —O—, —S—, —$SO_2$—, and —N═CH—, or a divalent linking group in which two or more (preferably 2 to 6) selected from the above group are combined, and it is particularly preferably a group selected from the group consisting of an alkylene group having 1 to 4 carbon atoms, a phenylene group, —CO—, —NH—, —O—, and —$SO_2$—, or a linking group in which two or more (preferably 2 to 6) selected from the above group are combined. The divalent linking group combined is not particularly limited, and it is preferably a group containing —CO—, —NH—, —O—, or —$SO_2$—, and examples thereof include a linking group formed by combining two or more of —CO—, —NH—, —O—, or —$SO_2$—, or a linking group formed by combining at least one of —CO—, —NH—, —O—, or —$SO_2$— and an alkylene group or an arylene group. Examples of the linking group formed by combining two or more of —CO—, —NH—, —O—, or —$SO_2$— include —COO—, —OCO—, —CONH—, —NHCOO—, —NHCONH—, and —$SO_2$NH—. Examples of the linking group formed by combining at least one of —CO—, —NH—, —O—, or —$SO_2$— and an alkylene group or an arylene group include a group in which —CO—, —COO—, or —CONH— and an alkylene group or an arylene group are combined.

The substituent that can be employed as R is not particularly limited, and it has the same meaning as the substituent X which may be contained in A in General Formula (2).

L is preferably a single bond or a group selected from the group consisting of an alkylene group having 1 to 8 carbon atoms, an arylene group having 6 to 12 carbon atoms, —CH═CH—, —CO—, —NR— (R is as described above), —O—, —S—, —$SO_2$—, and —N═CH—, or a group in which two or more selected from the above group are combined.

L may have one or a plurality of substituents. The substituent which may be contained in L is not particularly limited, and for example, it has the same meaning as the substituent X. In a case where L has a plurality of substituents, the substituents bonded to adjacent atoms may be bonded to each other to further form a ring structure.

The alkylene group that can be employed as L may be linear, branched, or cyclic as long as the group has 1 to 20 carbon atoms, and examples thereof include methylene, ethylene, propylene, methylethylene, methylmethylene, dimethylmethylene, 1,1-dimethylethylene, butylene, 1-methylpropylene, 2-methylpropylene, 1,2-dimethylpropylene, 1,3-dimethylpropylene, 1-methylbutylene, 2-methylbutylene, 3-methylbutylene, 4-methylbutylene, 2,4-dimethylbutylene, 1,3-dimethylbutylene, pentylene, hexylene, heptylene, octylene, ethane-1,1-diyl, propane-2,2-diyl, cyclopropane-1,1-diyl, cyclopropane-1,2-diyl, cyclobutane-1,1-diyl, cyclobutane-1,2-diyl, cyclopentane-1,1-diyl, cyclopentane-1,2-diyl, cyclopentane-1,3-diyl, cyclohexane-1,1-diyl, cyclohexane-1,2-diyl, cyclohexane-1,3-diyl, cyclohexane-1,4-diyl, and methylcyclohexane-1,4-diyl.

In a case where a linking group containing at least one of —CO—, —CS—. —NR— (R is as described above), —O—, —S—, —$SO_2$—, or —N═CH— in the alkylene group is employed as L, the group such as —CO— may be incorporated at any site in the alkylene group, and the number of the groups incorporated is not particularly limited.

The arylene group that can be employed as L is not particularly limited as long as the group has 6 to 20 carbon atoms, and examples thereof include a group obtained by further removing one hydrogen atom from each group exemplified as the aryl group having 6 to 20 carbon atoms that can be employed as A in General Formula (1).

The heterocyclic group that can be employed as L is not particularly limited, and examples thereof include a group obtained by further removing one hydrogen atom from each group exemplified as the heterocyclic group that can be employed as A.

In General Formula (2M), the remaining partial structure excluding the linking group L corresponds to a structure (a metallocene structure portion) in which one hydrogen atom is removed from the metallocene compound. In the present invention, for the metallocene compound serving as the metallocene structure portion, a known metallocene compound can be used without particular limitation, as long as it is a compound conforming to the partial structure defined by General Formula (2M) (a compound in which a hydrogen atom is bonded instead of L). Hereinafter, the metallocene structure portion defined by General Formula (2M) will be specifically described.

In General Formula (2M), $R^{1m}$ to $R^{9m}$ each independently represent a hydrogen atom or a substituent. The substituents that can be employed as $R^{1m}$ to $R^{9m}$ are not particularly limited, and can be selected from, for example, the substituents that can be employed as $R^1$ in General Formula (3). $R^{1m}$ to $R^{9m}$ each are preferably a hydrogen atom, a halogen atom, an alkyl group, an acyl group, an alkoxy group, an amino group, or an amide group, more preferably a hydrogen atom, a halogen atom, an alkyl group, an acyl group, or an alkoxy group, still more preferably a hydrogen atom, a halogen atom, an alkyl group, or an acyl group, particularly preferably a hydrogen atom, a halogen atom, or an alkyl group, and most preferably a hydrogen atom.

As the alkyl group that can be employed as $R^{1m}$ to $R^{9m}$, among the alkyl groups that can be employed as $R^1$, an alkyl group having 1 to 8 carbon atoms is preferable, and examples thereof include methyl, ethyl, propyl, isopropyl, butyl, sec-butyl, tert-butyl, isobutyl, pentyl, tert-pentyl, hexyl, octyl, and 2-ethylhexyl.

This alkyl group may have a halogen atom as a substituent. Examples of the alkyl group substituted with a halogen atom include, for example, chloromethyl, dichloromethyl, trichloromethyl, bromomethyl, dibromomethyl, tribromomethyl, fluoromethyl, difluoromethyl, trifluoromethyl, 2,2,2-trifluoroethyl, perfluoroethyl, perfluoropropyl, perfluorobutyl.

In addition, in the alkyl group that can be employed as $R^{1m}$ or the like, at least one methylene group that forms a carbon chain may be substituted with —O— or —CO—. Examples of the alkyl group in which the methylene group is substituted with —O— include, for example, an alkyl group in which the end part methylene group of methoxy, ethoxy, propoxy, isopropoxy, butoxy, isobutoxy, tert-butoxy, 2-methoxyethoxy, chloromethyloxy, dichloromethyloxy, trichloromethyloxy, bromomethyloxy, dibromomethyloxy, tribromomethyloxy, fluoromethyloxy, difluoromethyloxy, trifluoromethyloxy, 2,2,2-trifluoroethyloxy, perfluoroethyloxy, perfluoropropyloxy, or perfluorobutyloxy is substituted, and an alkyl group in which an internal methylene group of the carbon chain such as 2-methoxyethyl or the like is substituted. Examples of the alkyl group in which a methylene group is substituted with —CO— include acetyl, propionyl, monochloroacetyl, dichloroacetyl, trichloroacetyl, trifluoroacetyl, propane-2-one-1-yl, and butane-2-one-1-yl.

In General Formula (2M), M represents an atom that can constitute a metallocene compound, and represents Fe, Co, Ni, Ti, Cu, Zn, Zr, Cr, Mo, Os, Mn, Ru, Sn, Pd, Rh, V, or Pt. Among these, M is preferably Fe, Ti, Co, Ni, Zr, Ru, or Os, more preferably Fe, Ti, Ni, Ru, or Os, still more preferably Fe or Ti, and most preferably Fe.

The group represented by General Formula (2M) is preferably a group formed by combining preferred ones of L, $R^{1m}$ to $R^{9m}$, and M. Examples thereof include a group formed by combining, as L, a single bond, or a group selected from the group consisting of an alkylene group having 2 to 8 carbon atoms, an arylene group having 6 to 12 carbon atoms, —CH=CH—, —CO—, —NR— (R is as described above), —O—, —S—, $—SO_2—$, and —N=CH—, or a group in which two or more selected from the above group are combined; as $R^{1m}$ to $R^{9m}$, a hydrogen atom, a halogen atom, an alkyl group, an acyl group, or an alkoxy group; and as M, Fe.

The alkyl group, the alkenyl group, the alkynyl group, the aralkyl group, the aryl group, and the heteroaryl group which can be employed as the substituent X and the aliphatic group, the aromatic group, and the heterocyclic group which can be employed as $R^{10}$ to $R^{27}$ each may further have a substituent or may be unsubstituted. The substituent which may be further contained therein is not particularly limited, and it is preferably a substituent selected from an alkyl group, an aryl group, an amino group, an alkoxy group, an aryloxy group, an aromatic heterocyclic oxy group, an acyl group, an alkoxycarbonyl group, an aryloxycarbonyl group, an acyloxy group, an acylamino group, an alkoxycarbonylamino group, a aryloxycarbonylamino group, a sulfonylamino group, an alkylthio group, an arylthio group, an aromatic heterocyclic thio group, a sulfonyl group, a ferrocenyl group, a hydroxy group, a mercapto group, a halogen atom, a cyano group, a sulfo group, or a carboxy group, and it is more preferably a substituent selected from a alkyl group, an aryl group, an alkoxy group, an aryloxy group, an aromatic heterocyclic oxy group, an acyl group, an alkoxycarbonyl group, an aryloxycarbonyl group, an acyloxy group, an alkylthio group, an arylthio group, an aromatic heterocyclic thio group, a sulfonyl group, a ferrocenyl group, a hydroxy group, a mercapto group, a halogen atom, a cyano group, a sulfo group, or a carboxy group. This groups can be appropriately selected from the substituents that can be employed as $R^1$ in General Formula (2) described below.

One preferred embodiment of the coloring agent represented by General Formula (1) includes a coloring agent represented by General Formula (2).

General Formula (2)

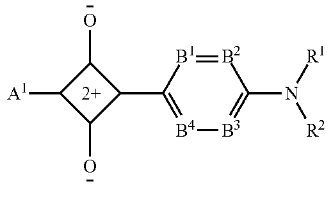

In General Formula (2), $A^1$ is the same as A in General Formula (1). Among these, a heterocyclic group which is a nitrogen-containing 3-membered ring is preferable.

In General Formula (2), $R^1$ and $R^2$ each independently represent a hydrogen atom or a substituent. $R^1$ and $R^2$ may be the same as or different from each other, and may be bonded to each other to form a ring.

The substituents that can be employed as $R^1$ and $R^2$ are not particularly limited, and examples thereof include an alkyl group (a methyl group, an ethyl group, a propyl group, an isopropyl group, a butyl group, a t-butyl group, an isobutyl group, a pentyl group, a hexyl group, an octyl group, a dodecyl group, a trifluoromethyl group, or the like), a cycloalkyl group (a cyclopentyl group, a cyclohexyl group, or the like), an alkenyl group (a vinyl group, an allyl group, or the like), an alkynyl group (an ethynyl group, a propargyl group, or the like), an aryl group (a phenyl group, a naphthyl group, or the like), a heteroaryl group (a furyl group, a thienyl group, a pyridyl group, a pyridazyl group, a pyrimidyl group, a pyrazyl group, a triazyl group, an imidazolyl group, a pyrazolyl group, a thiazolyl group, a benzoimidazolyl group, a benzoxazolyl group, a quinazolyl group, a phthalazyl group, or the like), a heterocyclic group (also referred to as a heterocyclic group, for example, a pyrrolidyl group, a imidazolidyl group, a morpholyl group, an oxazolidyl group, or the like), a alkoxy group (a methoxy group, an ethoxy group, a propyloxy group, or the like), a cycloalkoxy group (a cyclopentyloxy group, a cyclohexyloxy group, or the like), an aryloxy group (a phenoxy group, a naphthyloxy group, or the like), a heteroaryloxy group (an aromatic heterocyclic oxy group), an alkylthio a group (a methylthio group, an ethylthio group, a propylthio group, or the like), a cycloalkylthio group (a cyclopentylthio group, a cyclohexylthio group, or the like), a arylthio group (a phenylthio group, a naphthylthio group, or the like), a heteroarylthio group (an aromatic heterocyclic thio group) an alkoxycarbonyl group (a methyloxycarbonyl group, an ethyloxycarbonyl group, a butyloxycarbonyl group, an octyloxycarbonyl group, or the like), an aryloxycarbonyl group (a phenyloxycarbonyl group, a naphthyloxycarbonyl group, or the like), a phosphoryl group (dimethoxyphosphonyl or diphenylphosphoryl), a sulfamoyl a group (an aminosulfonyl group, a methylaminosulfonyl group, a dimethylaminosulfonyl group, a butylaminosulfonyl group, a cyclohexylaminosulfonyl group, an octylaminosulfonyl group, a phenylaminosulfonyl group, a 2-pyridylaminosulfonyl group, or the like), an ancyl a group (an acetyl group, an ethylcarbonyl group, a propylcarbonyl group, a cyclohexylcarbonyl group, an octylcarbonyl group, a 2-ethylhexylcarbonyl group, a phenylcarbonyl group, a naphthylcarbonyl group, a pyridylcarbonyl group, or the like), an acyloxy group (an acetyloxy group, an ethylcarbonyloxy group, a butylcarbonyloxy group, an octylcarbonyloxy group, a phenylcarbonyloxy group, or the like), an amide group (a methylcarbonylamino group, an ethylcarbonylamino group, a dimethylcarbonylamino group, a propylcarbonylamino group, a pentylcarbonylamino group, a cyclohexylcarbonylamino group, a 2-ethylhexylcarbonylamino group, an octylcarbonylamino group, a dodecylcarbonylamino group, a phenylcarbonylamino group, a naphthylcarbonylamino group, or the like), a sulfonylamide group (a methylsulfonylamino group, an octylsulfonylamino group, a 2-ethylhexylsulfonylamino group, a trifluoromethylsulfonylamino group, or the like), a carbamoyl group (an aminocarbonyl group, a nehylaminocarbonyl group, a dimethylaminocarbonyl group, a propylaminocarbonyl group, a pentylaminocarbonyl group, a cydohexylaminocarbonyl group, an octylaminocarbonyl group, a 2-ethylhexylaminocarbonyl group, a dodecylaminocarbonyl group, a phenylaminocarbonyl group, a naphthylaminocarbonyl group, a 2-pyridylaminocarbonyl group, or the like), a ureaido group (a methylureido group, an ethylureido group, a pentylureido group, a cyclohexylureido group, an octylureido group, a dodecylureido group, a phenylureido group, a naphthylureido group, a 2-pyridylaminoureido group, or the like), an alkylsulfonyl group (a methylsulfonyl group, an ethylsulfonyl group, a butylsulfonyl group, a cyclohexylsulfonyl group, a 2-ethylhexylsulfonyl group, or the like), an arylsulfonyl group (a phenylsulfonyl group, a naphthylsulfonyl group, a 2-pyridylsulfonyl group, or the like), an amino group (an amino group, an ethylamino group, a dimethylamino group, a butylamino group, a dibutylamino group, a cyclopentylamino group, a 2-ethylhexylamino group, a dodecylamino group, an anilino group, a naphthylamino group, a 2-pyridylamino group, or the like), an alkylsulfonyloxy group (methanesulfonyloxy), a cyano group, a nitro group, halogen atoms (a fluorine atom, a chlorine atom, a bromine atom, or the like), and a hydroxy group.

Among these, a alkyl group, a alkenyl group, an aryl group, or a heteroaryl group is preferable, an allyl group, an aryl group, or a heteroaryl group is more preferable, and an allyl group is still more preferable.

The substituent that cm be employed as $R^1$ and $R^2$ may further have a substituent. Examples of the substituent which may be further contained include the above-described substituents which can be employed as $R^1$ and $R^2$. In addition, to form a ring, $R^1$ and $R^2$ may be bonded to each other or may be bonded to a substituent which is contained in $B^2$ or $B^3$. The ring that is formed in this case is preferably a heterocyclic ring or a heteroaryl ring, and it is preferably a 5-membered ring or a 6-membered ring although the size of the ring to be formed is not particularly limited.

In General Formula (2), $B^1$, $B^2$, $B^3$, and $B^4$ each independently represent a carbon atom or a nitrogen atom. The ring including $B^1$, $B^2$, $B^3$, and $B^4$ is an aromatic ring. It is preferable that at least two or more of $B^1$ to $B^4$ are a carbon atom, and it is more preferable that all of $B^1$ to $B^4$ are a carbon atom.

The carbon atom that can be employed a $B^1$ to $B^4$ has a hydrogen atom or a substituent. Among carbon atoms that can be employed as $B^1$ to $B^4$, the number of carbon atoms having a substituent is not particularly limited: however, it is preferably zero, one, or two, and more preferably one. Particularly, it is preferable that $B^1$ and $B^4$ are a carbon atom and at least one of them has a substituent.

The substituent possessed by the carbon atom that can be employed as $B^1$ to $B^4$ is not particularly limited, and examples thereof include the above-described substituents that can be employed as $R^1$ and $R^2$. Among these, it is preferably a alkyl group, a alkoxy group, an alkoxycarbonyl group, an aryl group, an acyl group, an amide group, a sulfonylamide group, a carbamoyl group, an alkylsulfonyl group, an arylsulfonyl group, an amino group, a cyano group, a nitro group, a halogen atom, or a hydroxy group, and it is more preferably an alkyl group, an alkoxy group, an alkoxycarbonyl group, an aryl group, an acyl group, an amide group, a sulfonylamide group, a carbamoyl group, an amino group, a cyano group, a nitro group, a halogen atom, or a hydroxy group.

Examples of the substituent that cm be possessed by the carbon atom that can be employed as $B^1$ and $B^4$ still more preferably include an alkyl group, an alkoxy group, a hydroxy group, an amide group, a sulfonylamide group, or a carbamoyl group, and particularly preferably an alkyl group, an alkoxy group, a hydroxy group, an amide group, or a sulfonylamide group, and a hydroxy group, an amide group, or a sulfonylamide group is most preferable.

It is still more preferable that the substituent that can be possessed by the carbon atom that can be employed as $B^2$ and $B^3$ is an alkyl group, an alkoxy group, an alkoxycarbonyl group, an acyl group, an amino group, a cyano group, a nitro group, or a halogen atom, and it is particularly preferable that the substituent as any one of $B^2$ or $B^3$ is an electron-withdrawing group (for example, an alkoxycarbonyl group, an acyl group, a cyano group, a nitro group, or a halogen atom).

The coloring agent represented by General Formula (2) is preferably a coloring agent represented by may one of General Formulae (3), (4), or (5).

General Formula (3)

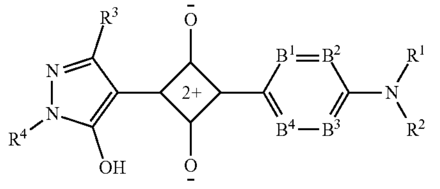

In General Formula (3), $R^1$ and $R^2$ each independently represent a hydrogen atom or a substituent, and they respectively have the same meanings as $R^1$ and $R^2$ in General Formula (2), where the same applies to the preferred ranges thereof.

In General Formula (3), $B^1$ to $B^4$ each independently represent a carbon atom or a nitrogen atom, and they have respectively the same meanings as $B^1$ to $B^4$ in General Formula (2), where the same applies to the preferred ranges thereof.

In General Formula (3), $R^3$ and $R^4$ each independently represent a hydrogen atom or a substituent. The substituent that can be employed as $R^3$ and $R^4$ is not particularly limited, and examples thereof include the same ones as the substituents that can be employed as $R^1$ and $R^2$.

However, the substituent that can be employed as $R^3$ is preferably an alkyl group, an alkoxy group, an amino group, an amide group, a sulfonylamide group, a cyano group, a nitro group, an aryl group, a heteroaryl group, a heterocyclic group, an alkoxycarbonyl group, a carbamoyl group, or a halogen atom, more preferably an alkyl group, an aryl group, or an amino group, and still more preferably a alkyl group.

The substituent that can be employed as $R^4$ is preferably a alkyl group, an aryl group, a heteroaryl group, a heterocyclic group, an alkoxy group, an alkoxycarbonyl group, an acyl group, an acyloxy group, an amide group, a carbamoyl group, an amino group, or a cyano group, more preferably an alkyl group, an alkoxycarbonyl group, an acyl group, a carbamoyl group, or an aryl group, and still more preferably an alkyl group.

The alkyl group that can be employed as $R^3$ and $R^4$ may be linear, branched, or cyclic, and it is preferably linear or branched. The alkyl group preferably has 1 to 12 carbon atoms and more preferably 1 to 8 carbon atoms. An example of the alkyl group is preferably a methyl group, an ethyl group, an n-propyl group, an isopropyl group, a t-butyl group, a 2-ethylhexyl group, or a cyclohexyl group, and more preferably a methyl group or a t-butyl group.

General Formula (4)

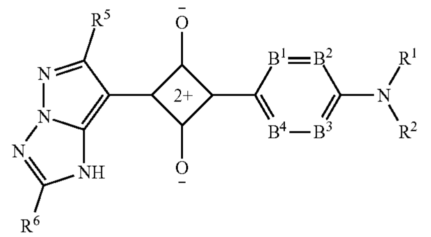

In General Formula (4), $R^1$ and $R^2$ each independently represent a hydrogen atom or a substituent, and they respectively have the same meanings as $R^1$ and $R^2$ in General Formula (2), where the same applies to the preferred ranges thereof.

In General Formula (4), $B^1$ to $B^4$ each independently represent a carbon atom or a nitrogen atom, and they have respectively the same meanings as $B^1$ to $B^4$ in General Formula (2), where the same applies to the preferred ranges thereof.

In General Formula (4), $R^5$ and $R^6$ each independently represent a hydrogen atom or a substituent. The substituent that can be employed as $R^5$ and $R^6$ is not particularly limited, and examples thereof include the same ones as the substituents that can be employed as $R^1$ and $R^2$.

However, the substituent that can be employed as $R^5$ is preferably an alkyl group, an alkoxy group, an aryloxy group, an amino group, a cyano group, an aryl group, a heteroaryl group, a heterocyclic group, an acyl group, an acyloxy group, an amide group, a sulfonylamide group, an ureido group, or a carbamoyl group, more preferably an alkyl group, an alkoxy group, an acyl group, an amide group, or an amino group, and still more preferably an alkyl group.

The alkyl group that can be employed as $R^5$ has die same meaning as the alkyl group that cm be employed as $R^3$ in General Formula (3), and the same applies to the preferred range thereof.

In General Formula (4), the substituent that can be employed as $R^6$ is preferably an alkyl group, an alkenyl group, an aryl group, a heteroaryl group, a heterocyclic group, an alkoxy group, a cycloalkoxy group, an aryloxy group, a alkoxycarbonyl group, an acyl group, an acyloxy group, an amide group, a sulfonylamide group, an alkylsulfonyl group, an arylsulfonyl group, a carbamoyl group, an amino group, a cyano group, a nitro group, or a halogen atom, more preferably an alkyl group, an aryl group, a heteroaryl group, or a heterocyclic group, and still more preferably an alkyl group or an aryl group.

The alkyl group that can be employed as $R^5$ has the same meaning as the alkyl group that can be employed as $R^3$ in General Formula (3), and the same applies to the preferred range thereof.

The aryl group that can be employed as $R^6$ is preferably an aryl group having 6 to 12 carbon atoms, and more preferably a phenyl group. This aryl group may have a substituent, and examples of such a substituent include a group included in the following substituent group A, and an alkyl group, a sulfonyl group, a amino group, a acylamino group, a sulfonylamino group, or the like, which have 1 to 10 carbon atoms, is particularly preferable. This substituent may further have a substituent. Specifically, the substituent is preferably an alkylsulfonylamino group.

—Substituent Group A—

A halogen atom, an alkyl group, an alkenyl group, an alkynyl group, an aryl group, a heterocyclic group, a cyano group, a hydroxy group, a nitro group, a carboxy group, an alkoxy group, an aminooxy group, an aryloxy group, a silyloxy group, a heterocyclic oxy group, n acyloxy group, a carbamoyloxy group, an amino group, an acylamino group, an aminocarbonylamino group, an alkoxycarbonylamino group, an aryloxycarbonylamino group, a sulfamoylamino group, a sulfonylamino group (including an alkyl or arylsulfonylamino group), a mercapto group, an alkylthio group, an arylthio group, a heterocyclic thio group, a sulfamoyl group, a sulfo group, an alkyl or arylsulfonyl group, a sulfonyl group (including an alkyl or arylsulfinyl group), an acyl group, an aryloxycarbonyl group, an alkoxycarbonyl group, a carbamoyl group, an aryl or heterocyclic azo group, an imide group, a phosphino group, a phosphinyl group, a phosphinyloxy group, a phosphinylamino group, a silyl group.

General Formula (5)

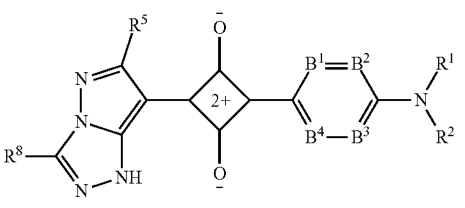

In General Formula (5), $R^1$ and $R^2$ each independently represent a hydrogen atom or a substituent, and they respectively have the same meanings as $R^1$ and $R^2$ in General Formula (2), where the same applies to the preferred ranges thereof.

In General Formula (5), $B^1$ to $B^4$ each independently represent a carbon atom or a nitrogen atom, and they have respectively the same meanings as $B^1$ to $B^4$ in General Formula (2), where the same applies to the preferred ranges thereof.

In General Formula (5), $R^7$ and $R^8$ each independently represent a hydrogen atom or a substituent. The substituent that can be employed as $R^7$ and $R^8$ is not particularly limited, and examples thereof include the same ones as the substituents that can be employed as $R^1$ and $R^2$.

However, the preferred range, the more preferred range, and the still more preferred range of the substituent that can be employed as $R^7$ are the same as those of the substituent that can be employed as $R^5$ in General Formula (4). The alkyl group that can be employed as $R^5$ has the same meaning as the alkyl group that can be employed as $R^3$, and the same applies to the preferred range thereof.

In General Formula (5), the preferred range, the more preferred range, and the still more preferred range of the substituent that can be employed as $R^8$ ae the same those of the substituent that can be employed as $R^6$ in General Formula (4). The preferred ranges of the alkyl group and the aryl group that can be employed as $R^8$ have the same meaning as the alkyl group and the aryl group that can be employed as $R^6$ in General Formula (4), where the same applies to the preferred ranges thereof.

In the present invention, in a case where a squarine-based coloring agent is used a the dye A, any squarine coloring agent may be used without particular limitations as long as the squarine-based coloring agent is the squarine coloring agent represented by may one of General Formulae (1) to (5). Examples thereof include compounds described in, for example, JP2006-160618A, WO2004/005981A, WO2004/007447A, Dyes and Pigment, 2001, 49, p. 161 to 179, WO200/090757A, WO2005/121098A, and JP2008-275726A.

Hereinafter, specific examples of the coloring agent represented by any one of General Formula (1) to General Formula (5) will be shown. However, the present invention is not limited thereto.

In the following specific examples, Me represents methyl, Et represents ethyl, Bu represents butyl, and Ph represents phenyl, respectively.

A-1

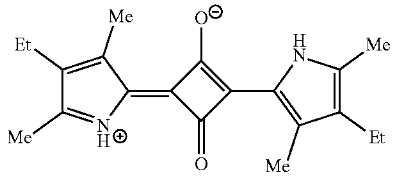

A-2

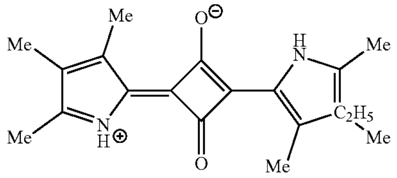

A-3

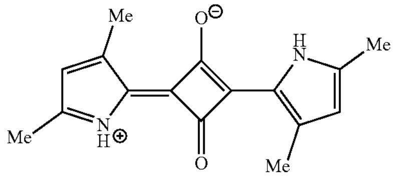

A-4

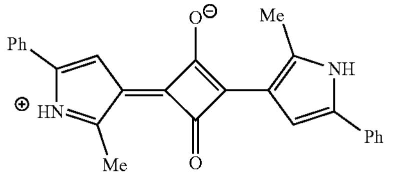

A-5

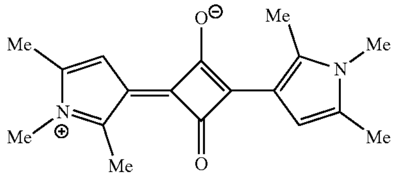

A-6

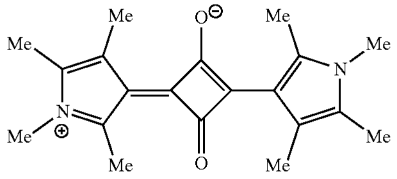

-continued
A-7
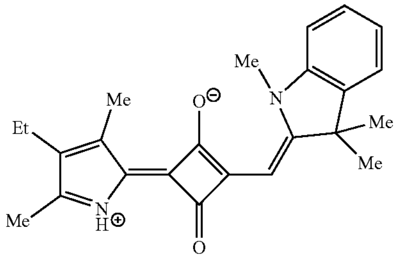
A-8
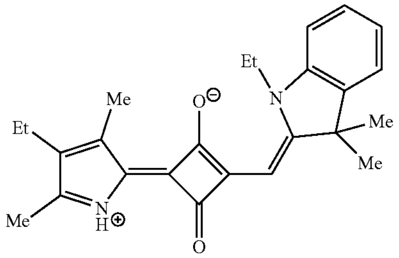
A-9
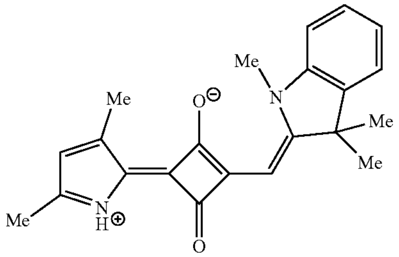
A-10
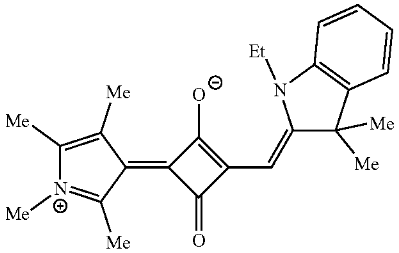
A-11
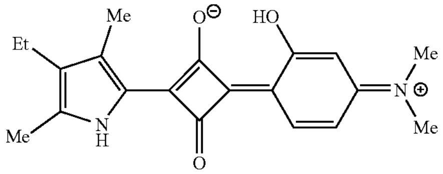
A-12
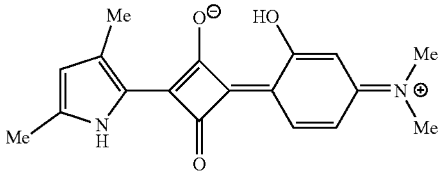
A-13
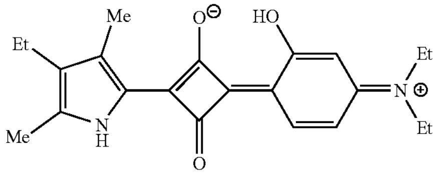
-continued
A-14
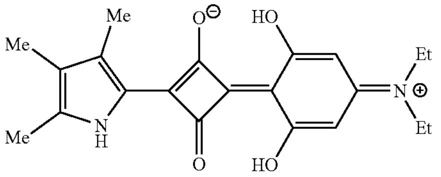
A-15
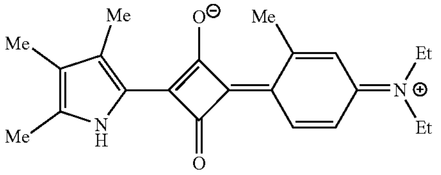
A-16
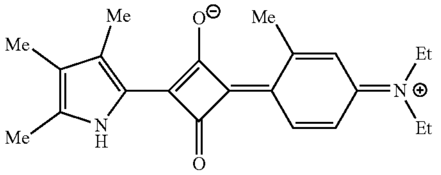
A-17
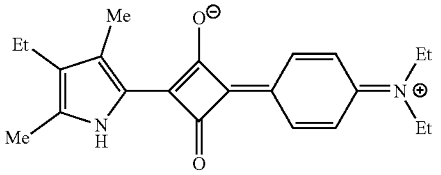
A-18
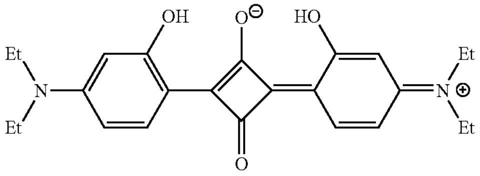
A-19
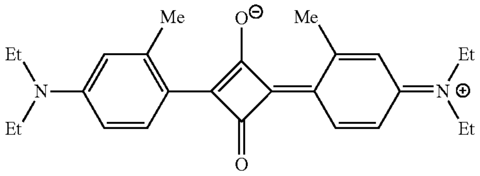
A-20
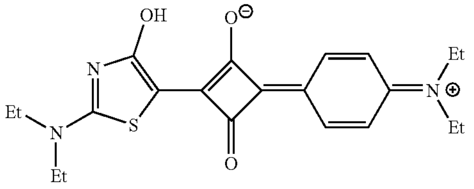
A-21
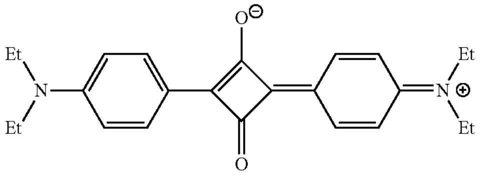

-continued
A-22
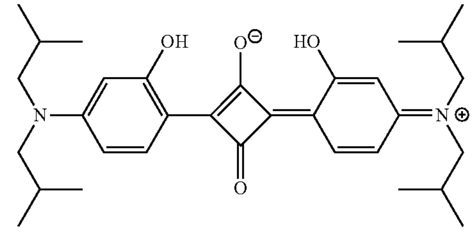
A-23
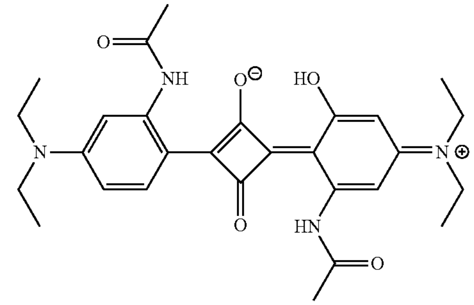
A-24
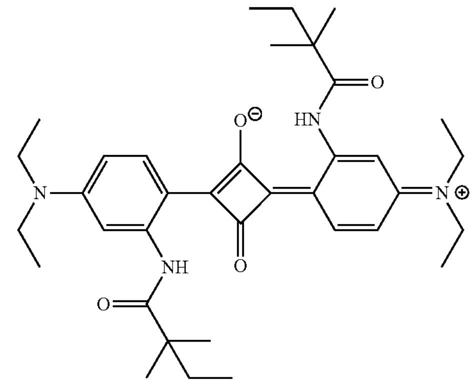
A-25
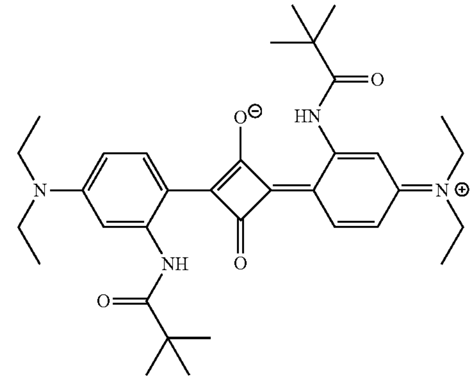
-continued
A-26
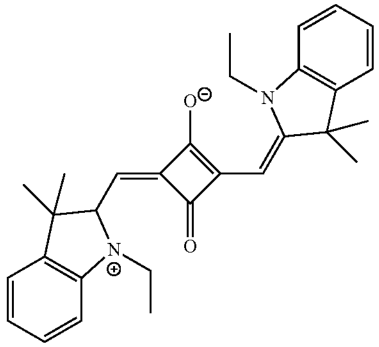
A-27
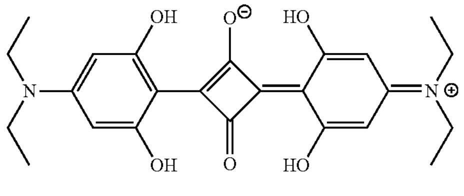
A-28
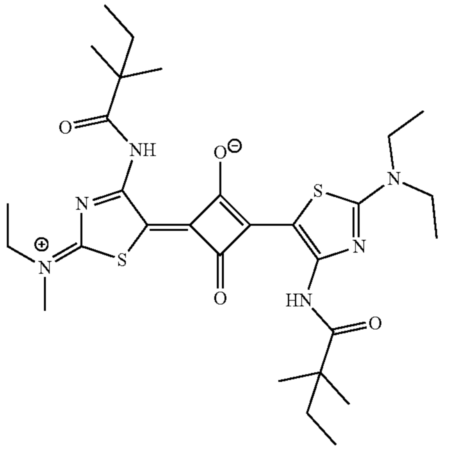
A-29
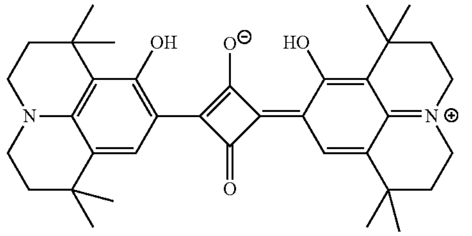
A-30
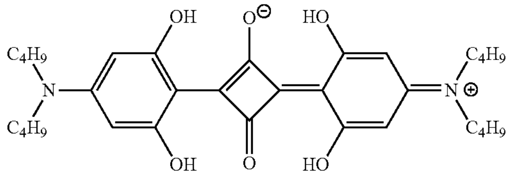
A-31
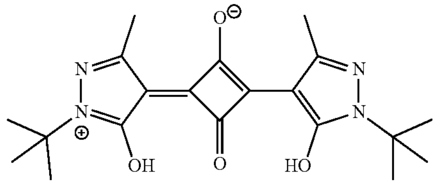

-continued
A-32
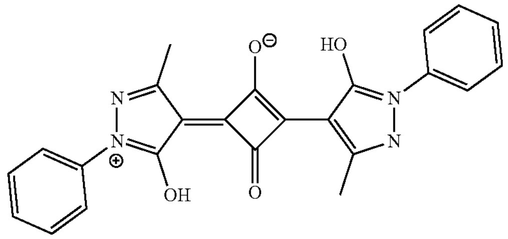
A-33
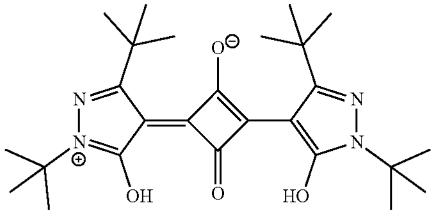
A-34
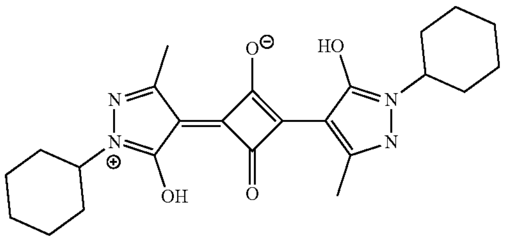
A-35
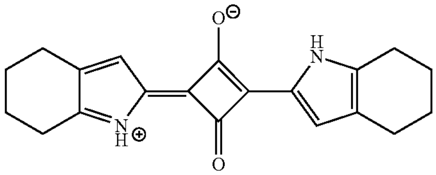
A-36
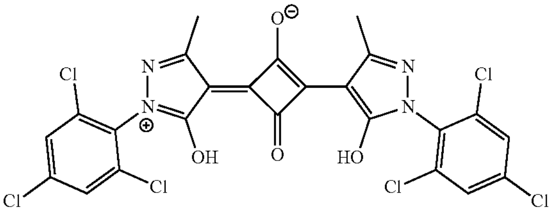
A-37
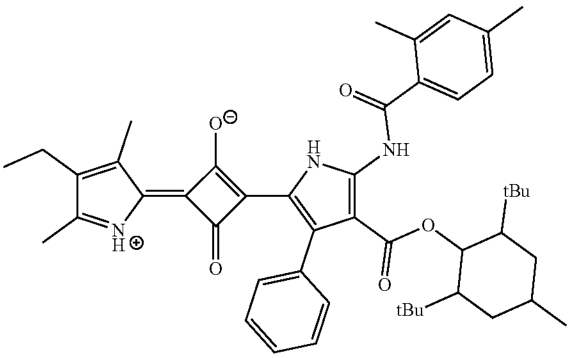
-continued
A-38
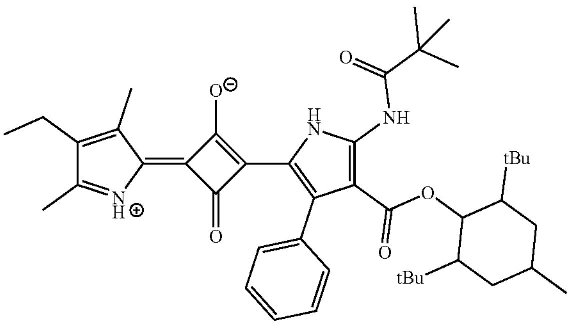
A-39
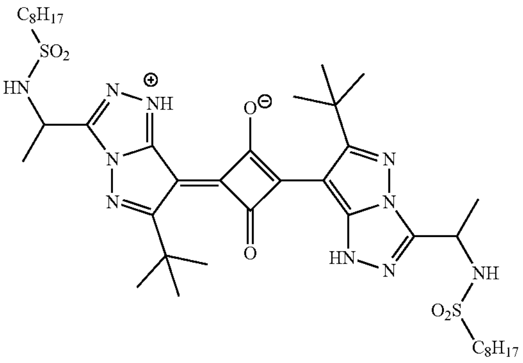
A-40
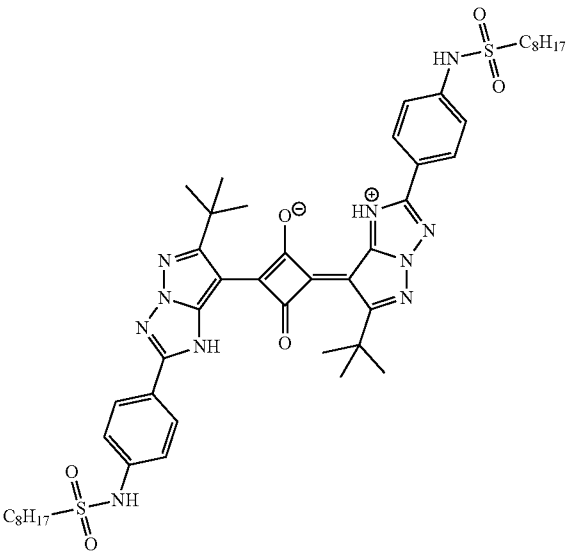

-continued
A-41
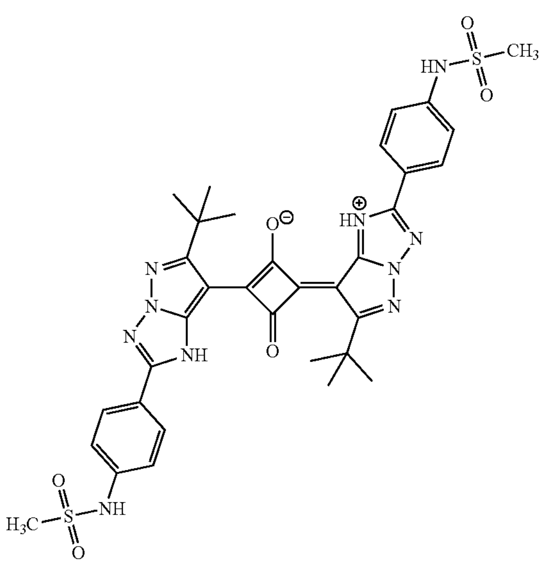
A-42
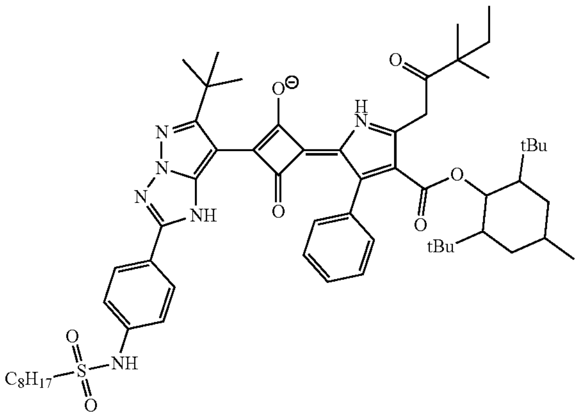
A-43
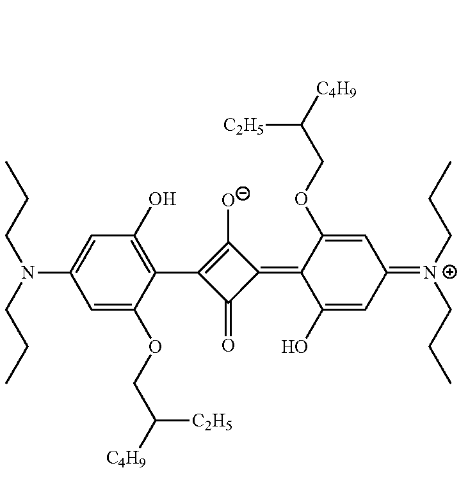
-continued
A-44
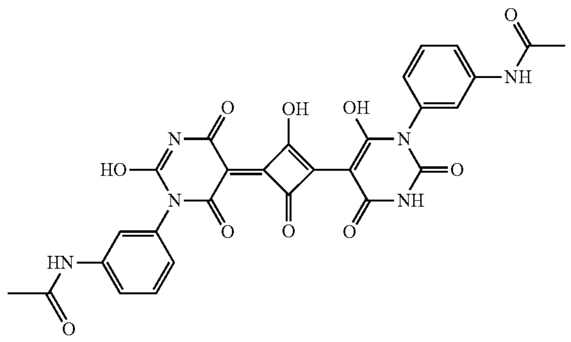
A-45
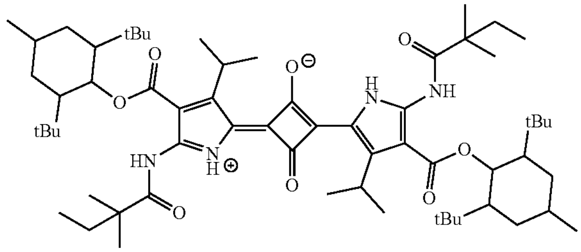
A-46
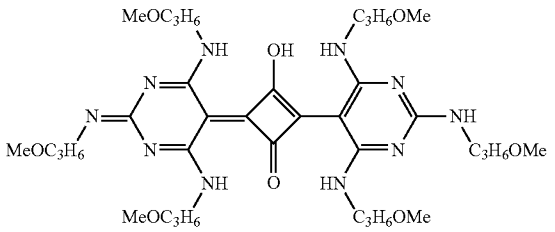
A-47
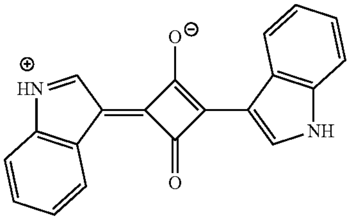
A-48
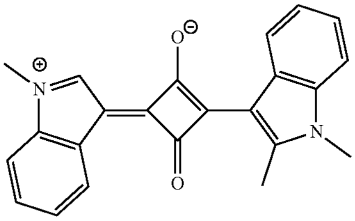
A-49
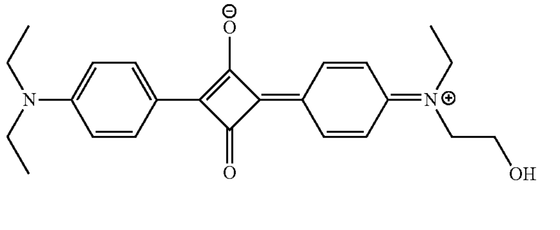

-continued

A-50

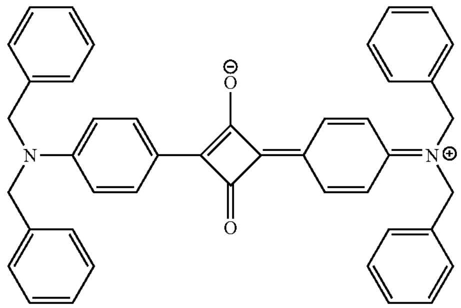

A-51

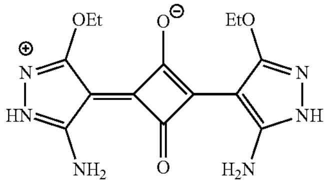

In addition to the above-described specific examples, specific examples of the coloring agents represented by ay one of General Formulae (3) to (5) will be shown. The substituent B in the following tables represents the following structures. In the following structures and the following tables, Me represents methyl, Et represents ethyl, i-Pr represents i-propyl, Bu represents n-butyl, t-Bu represents t-butyl, and Ph represents phenyl, respectively. In the following structures. * indicates a bonding site to a 4-membered carbon ring in each General Formula.

B-1

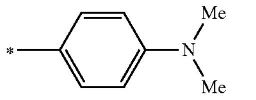

B-2

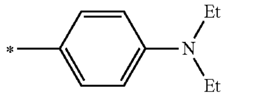

B-3

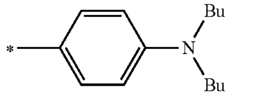

B-4

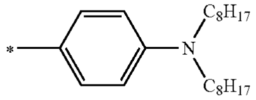

B-5

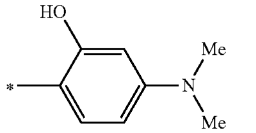

B-6

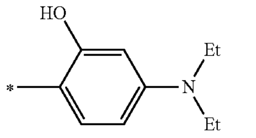

-continued

B-7

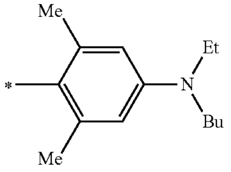

B-8

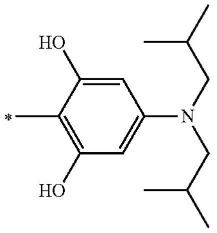

B-9

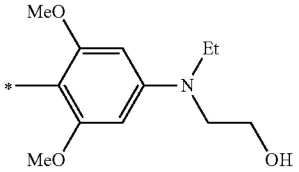

B-10

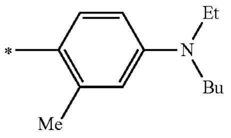

B-11

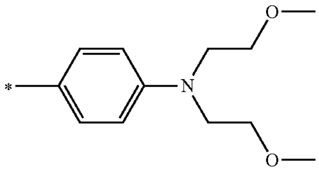

B-12

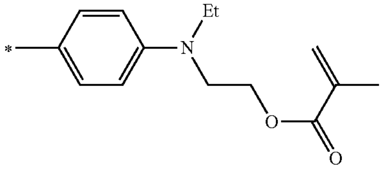

B-13

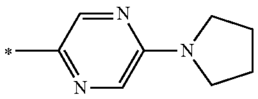

B-14

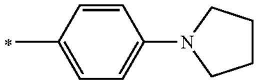

B-15

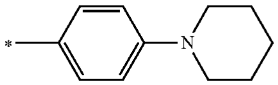

B-16

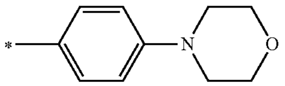

-continued
B-17
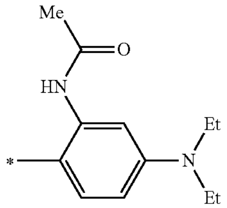
B-18
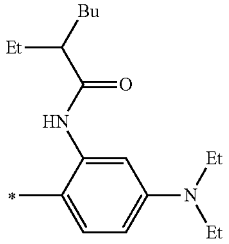
B-19
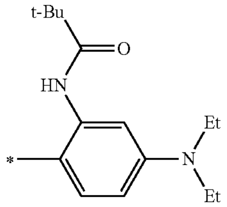
B-20
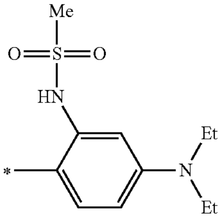
B-21
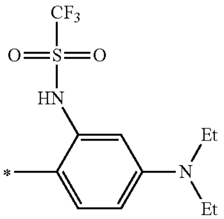
B-22
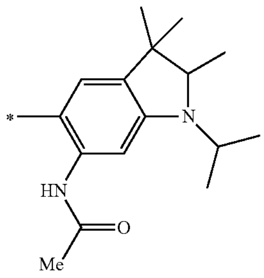
-continued
B-23
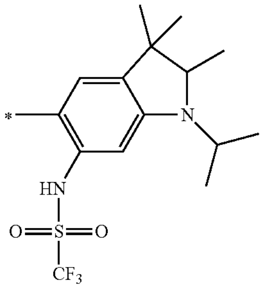
B-24
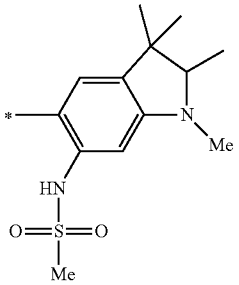
B-25
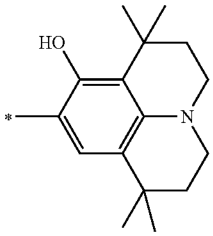
B-26
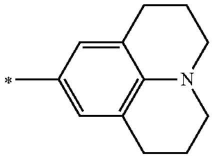
B-27
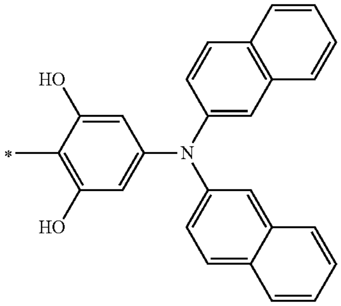
B-28
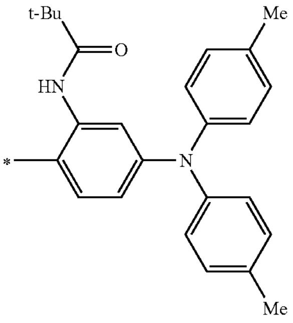

-continued
B-29
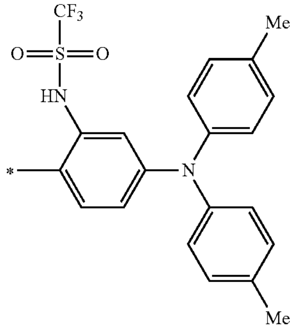
B-30
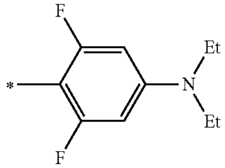
B-31
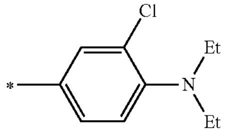
B-32
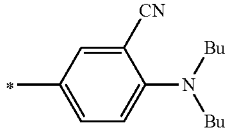
B-33
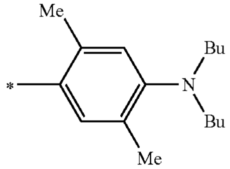
B-36
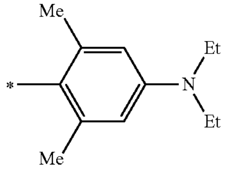
B-37
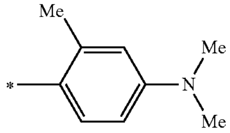
B-38
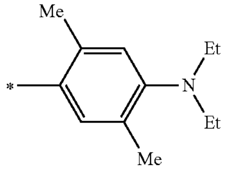
-continued
B-39
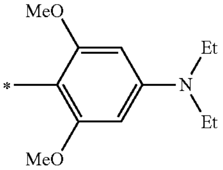
B-40
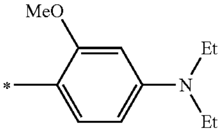
B-41
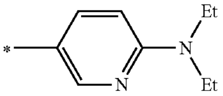
B-42
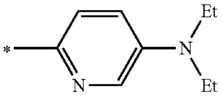
B-43
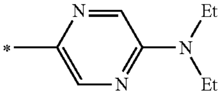
B-44
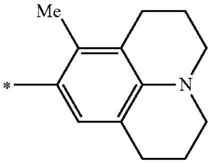
B-45
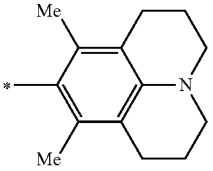
B-46
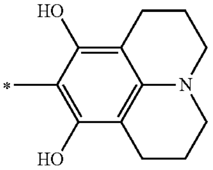
B-47
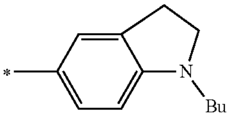
B-48
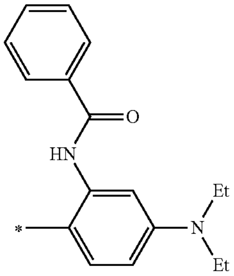

-continued
B-49
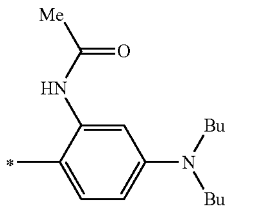
B-50
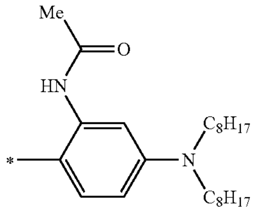
B-51
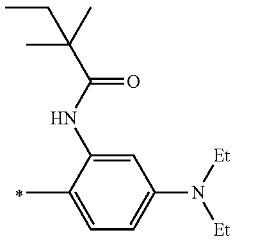
B-52
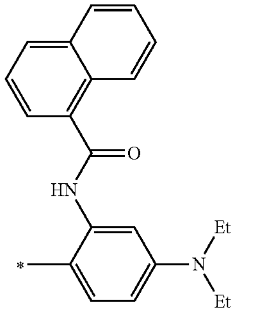
B-53
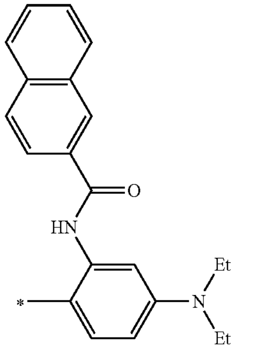
-continued
B-54
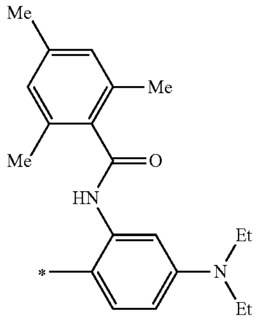
B-55
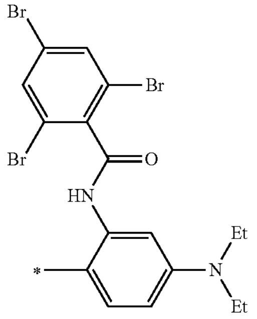
B-56
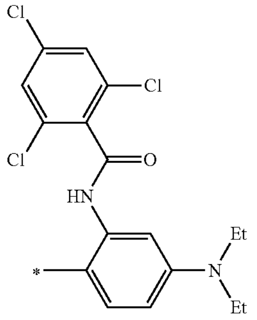
B-57
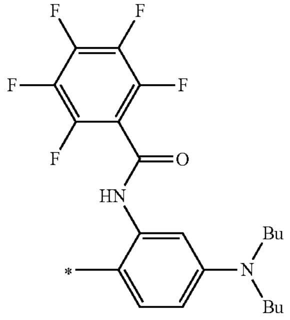
B-58
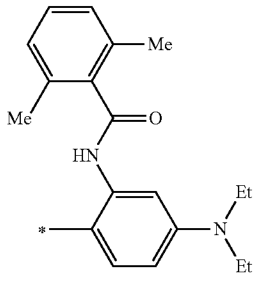

-continued
B-59
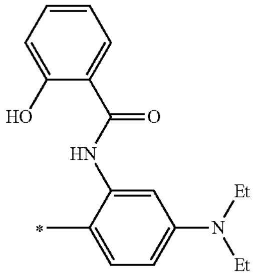
B-60
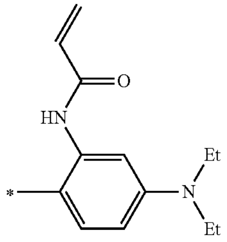
B-61
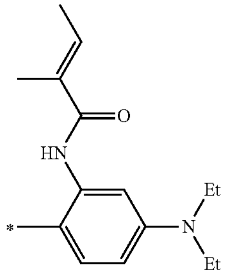
B-62
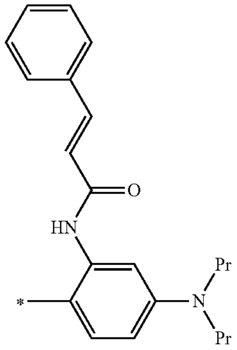
B-63
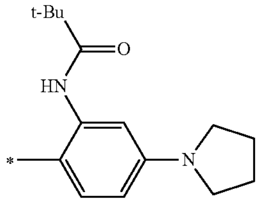
B-64
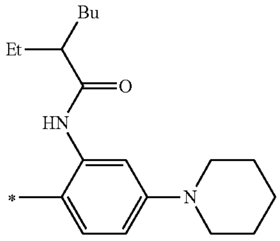
-continued
B-65
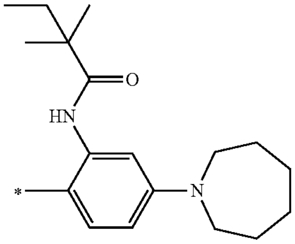
B-66
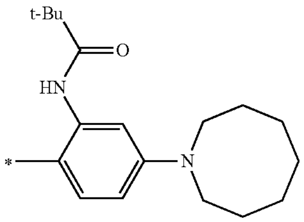
B-67
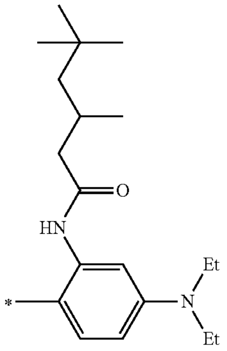
B-68
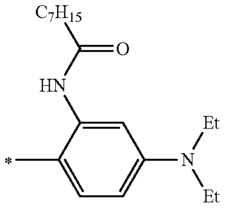
B-69
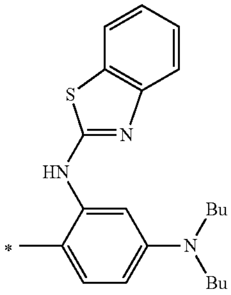
B-70
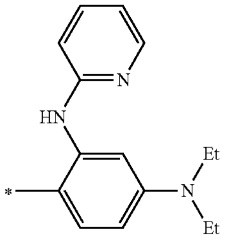

-continued

B-71

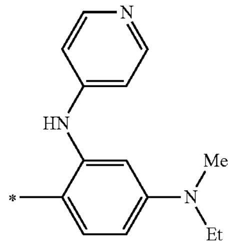

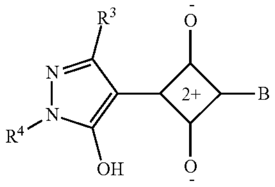

General Formula (3)

| Compound number | $R^3$ | $R^4$ | B |
|---|---|---|---|
| 3-1 | Me | Me | B-3 |
| 3-2 | Me | Me | B-4 |
| 3-3 | Me | Me | B-5 |
| 3-4 | Me | Me | B-10 |
| 3-5 | Me | Me | B-14 |
| 3-6 | Me | Me | B-16 |
| 3-7 | Me | Me | B-17 |
| 3-8 | Me | Me | B-18 |
| 3-9 | Me | Me | B-19 |
| 3-10 | Me | Me | B-20 |
| 3-11 | Me | Me | B-21 |
| 3-12 | Me | Me | B-22 |
| 3-13 | Me | Me | B-23 |
| 3-14 | Me | Me | B-26 |
| 3-15 | Me | Me | B-32 |
| 3-16 | Me | Me | B-33 |
| 3-17 | Me | Me | B-38 |
| 3-18 | Me | Me | B-49 |
| 3-19 | Et | 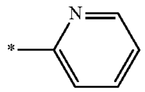 | B-28 |
| 3-20 | Me | 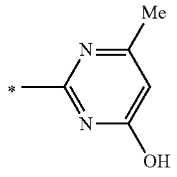 | B-29 |
| 3-21 | H | H | B-23 |
| 3-22 | Et | t-Bu | B-21 |
| 3-23 | t-Bu | Me | B-18 |
| 3-24 | $CF_3$ | i-Pr | B-12 |
| 3-25 | COOEt | Et | B-6 |
| 3-26 | CN | Ph | B-11 |
| 3-27 | $NMe_2$ | Me | B-2 |
| 3-28 | i-Pr | Me | B-17 |
| 3-29 | OEt | Bu | B-27 |
| 3-30 | $NH_2$ | i-Pr | B-9 |
| 3-31 | t-Bu | Me | B-17 |
| 3-32 | t-Bu | Bu | B-21 |
| 3-33 | $CF_3$ | Me | B-18 |
| 3-34 | OEt | Et | B-33 |
| 3-35 | $NMe_2$ | i-Pr | B-2 |

-continued

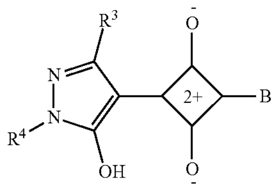

General Formula (3)

| Compound number | $R^3$ | $R^4$ | B |
|---|---|---|---|
| 3-36 | Et | Me | B-17 |
| 3-37 | Bu | Me | B-18 |
| 3-38 | $NH_2$ | Ph | B-19 |
| 3-39 | OEt | 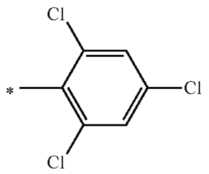 | B-25 |
| 3-40 | Me | 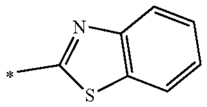 | B-2 |
| 3-41 | Me | Ph | B-17 |
| 3-42 | Me | Ph | B-21 |
| 3-43 | Me | Ph | B-36 |
| 3-44 | Me | t-Bu | B-17 |
| 3-45 | Me | t-Bu | B-18 |
| 3-46 | Me | t-Bu | B-10 |
| 3-47 | OEt | Me | B-17 |
| 3-48 | OEt | Me | B-10 |
| 3-49 | Me | 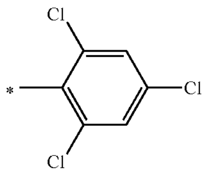 | B-17 |
| 3-50 | Me | 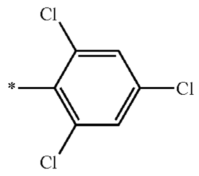 [SMILES: *c1c(Cl)cc(Cl)cc1Cl] | B-19 |
| 3-51 | Me | 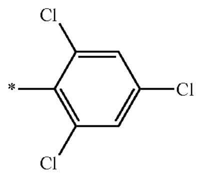 [SMILES: *c1c(Cl)cc(Cl)cc1Cl] | B-21 |
| 3-52 | Me | 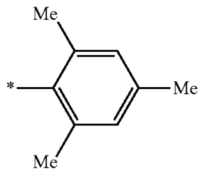 [SMILES: *c1c(C)cc(C)cc1C] | B-17 |

-continued
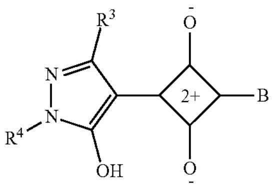
General Formula (3)
| Compound number | $R^3$ | $R^4$ | B |
|---|---|---|---|
| 3-53 | Me | 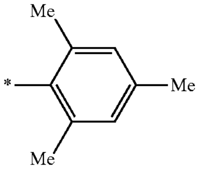 [SMILES: *c1c(C)cc(C)cc1C] | B-20 |
| 3-54 | Me | 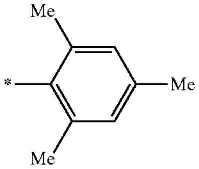 [SMILES: *c1c(C)cc(C)cc1C] | B-21 |
| 3-55 | t-Bu | Me | B-17 |
| 3-56 | t-Bu | Me | B-10 |
| 3-57 | t-Bu | Me | B-44 |
| 3-58 | t-Bu | t-Bu | B-17 |
| 3-59 | t-Bu | t-Bu | B-10 |
| 3-60 | t-Bu | t-Bu | B-6 |
| 3-61 | $NBu_2$ | Me | B-17 |
| 3-62 | $NBu_2$ | Me | B-10 |
| 3-63 | t-Bu | 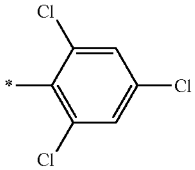 [SMILES: *c1c(Cl)cc(Cl)cc1Cl] | B-17 |
| 3-64 | t-Bu | 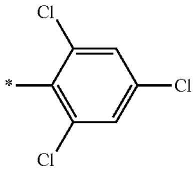 [SMILES: *c1c(Cl)cc(Cl)cc1Cl] | B-19 |
| 3-65 | t-Bu | 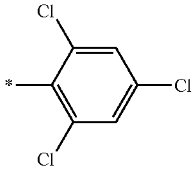 [SMILES: *c1c(Cl)cc(Cl)cc1Cl] | B-21 |
| 3-66 | t-Bu | 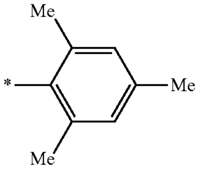 [SMILES: *c1c(C)cc(C)cc1C] | B-17 |
-continued
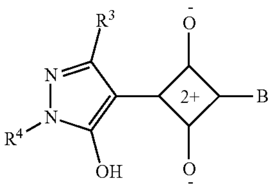
General Formula (3)
| Compound number | $R^3$ | $R^4$ | B |
|---|---|---|---|
| 3-67 | t-Bu | 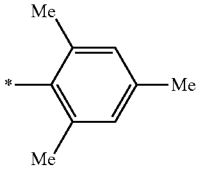 [SMILES: *c1c(C)cc(C)cc1C] | B-20 |
| 3-68 | t-Bu | 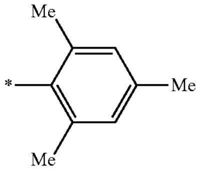 [SMILES: *c1c(C)cc(C)cc1C] | B-21 |
| 3-69 | Me | t-Bu | B-51 |
| 3-70 | Me | t-Bu | B-52 |
| 3-71 | Me | t-Bu | B-54 |
| 3-72 | Me | t-Bu | B-55 |
| 3-73 | Me | t-Bu | B-58 |
| 3-74 | Me | t-Bu | B-60 |
| 3-75 | Me | t-Bu | B-65 |
| 3-76 | Me | t-Bu | B-67 |
| 3-77 | Me | t-Bu | B-68 |
| 3-78 | H | t-Bu | B-51 |
| 3-79 | Et | t-Bu | B-53 |
| 3-80 | Pr | 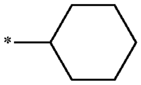 [SMILES: *C1CCCCC1] | B-64 |
| 3-81 | iPr | iPr | B-66 |
| 3-82 | Me | 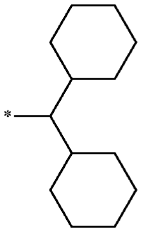 [SMILES: *C(C1CCCCC1)C1CCCCC1] | B-51 |
| 3-83 | Et | Bu | B-56 |
| 3-84 | Me | iPr | B-66 |
| 3-85 | Me | 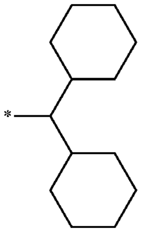 [SMILES: *C(C1CCCCC1)C1CCCCC1] | B-54 |

-continued
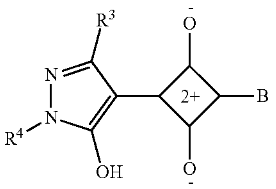
General Formula (3)
| Compound number | $R^3$ | $R^4$ | B |
| --- | --- | --- | --- |
| 3-86 | Me | 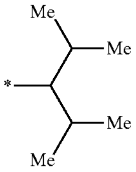 [SMILES: *C(C(C)C)C(C)C] | B-57 |
| 3-87 | Et | 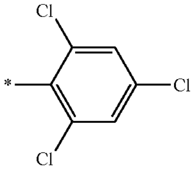 [SMILES: *c1c(Cl)cc(Cl)cc1Cl] | B-60 |
| 3-88 | Me | iPr | B-65 |
| 3-89 | Me | t-Bu | B-69 |
| 3-90 | Me | 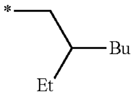 | B-50 |
| 3-91 | Me | 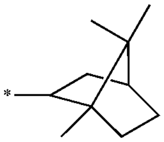 | B-61 |
| 3-92 | Me | 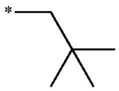 | B-51 |
| 3-93 | Me | 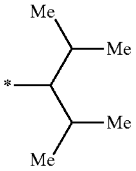 [SMILES: *C(C(C)C)C(C)C] | B-51 |
| 3-94 | Me | 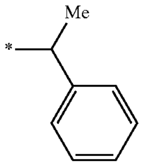 [SMILES: *C(C)c1ccccc1] | B-67 |
-continued
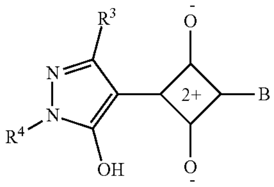
General Formula (3)
| Compound number | $R^3$ | $R^4$ | B |
| --- | --- | --- | --- |
| 3-95 | Me | 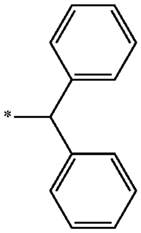 [SMILES: *C(c1ccccc1)c1ccccc1] | B-51 |
| 3-96 | Me | 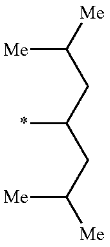 [SMILES: *C(CC(C)C)CC(C)C] | B-51 |
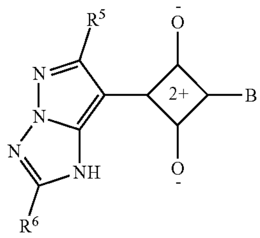
General Formula (4)
| Compound number | $R^5$ | $R^6$ | B |
| --- | --- | --- | --- |
| 4-1 | t-Bu | 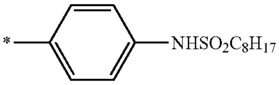 | B-2 |
| 4-2 | t-Bu | 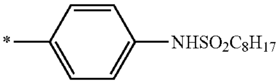 | B-6 |
| 4-3 | t-Bu | 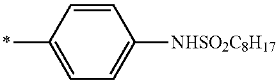 | B-10 |
| 4-4 | Me | 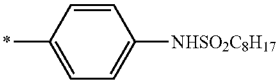 | B-4 |

-continued
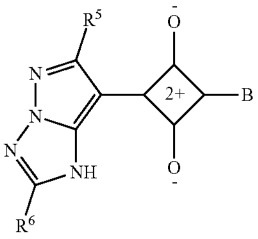
General Formula (4)
| Compound number | $R^5$ | $R^6$ | B |
|---|---|---|---|
| 4-5 | t-Bu | 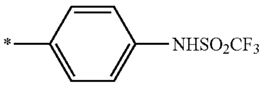 | B-6 |
| 4-6 | t-Bu | 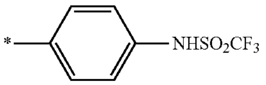 | B-14 |
| 4-7 | $NHCOCH_3$ | 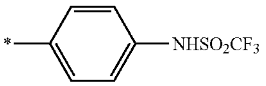 | B-1 |
| 4-8 | t-Bu | 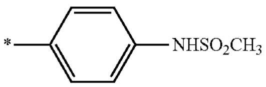 | B-6 |
| 4-9 | t-Bu | 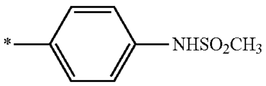 | B-16 |
| 4-10 | OEt | 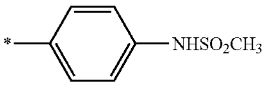 | B-11 |
| 4-11 | t-Bu | 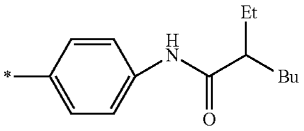 | B-6 |
| 4-12 | t-Bu | 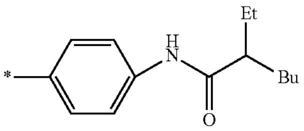 | B-12 |
| 4-13 | OEt | 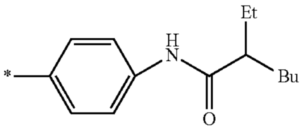 | B-31 |
| 4-14 | H | H | B-22 |
| 4-15 | Me | Me | B-23 |
| 4-16 | Me | Me | B-17 |
| 4-17 | Me | Et | B-18 |
| 4-18 | Ph | Ph | B-8 |
| 4-19 | Et | t-Bu | B-17 |
| 4-20 | OEt | t-Bu | B-3 |
| 4-21 | OEt | Bu | B-26 |
-continued
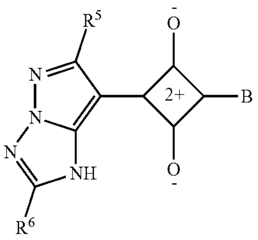
General Formula (4)
| Compound number | $R^5$ | $R^6$ | B |
|---|---|---|---|
| 4-22 | OEt | 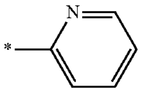 [SMILES: *c1ccccn1] | B-2 |
| 4-23 | CF3 | t-Bu | B-19 |
| 4-24 | $NHCOCH_3$ | t-Bu | B-2 |
| 4-25 | $NHCOCH_3$ | Me | B-1 |
| 4-26 | $NMe_2$ | t-Bu | B-6 |
| 4-27 | $NMe_2$ | Et | B-17 |
| 4-28 | H | Me | B-2 |
| 4-29 | t-Bu | t-Bu | B-18 |
| 4-30 | t-Bu | Me | B-17 |
| 4-31 | t-Bu | 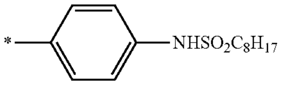 | B-51 |
| 4-32 | tBu | 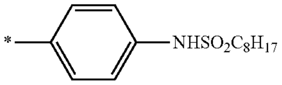 | B-52 |
| 4-33 | t-Bu | 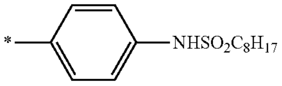 | B-54 |
| 4-34 | Me | 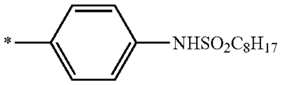 | B-55 |
| 4-35 | t-Bu | 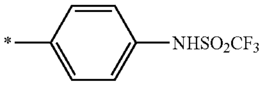 | B-60 |
| 4-36 | Me | Me | B-65 |
| 4-37 | Me | Et | B-67 |
| 4-38 | Ph | Ph | B-48 |
| 4-39 | Et | t-Bu | B-54 |
| 4-40 | Me | Me | B-51 |

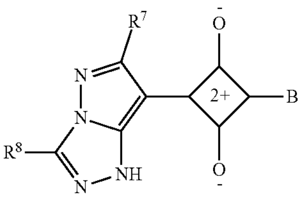
General Formula (5)
| Compound number | $R^7$ | $R^8$ | B |
|---|---|---|---|
| 5-1 | t-Bu | 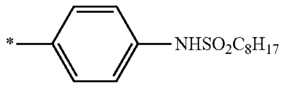 | B-2 |
| 5-2 | Me | 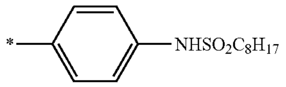 | B-6 |
| 5-3 | t-Bu | 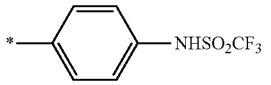 | B-4 |
| 5-4 | Me | 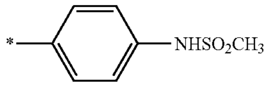 | B-10 |
| 5-5 | t-Bu | 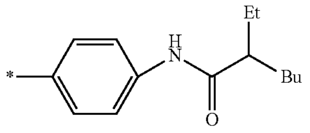 | B-6 |
| 5-6 | t-Bu | 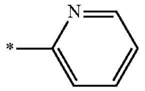 [SMILES: *c1ccccn1] | B-14 |
| 5-7 | Me | 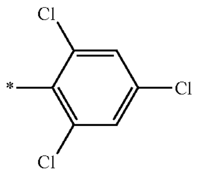 [SMILES: *c1c(Cl)cc(Cl)cc1Cl] | B-1 |
| 5-8 | Me | 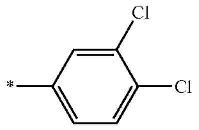 [SMILES: *c1ccc(Cl)c(Cl)c1] | B-6 |
| 5-9 | Me | 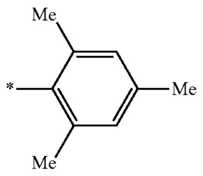 [SMILES: *c1c(C)cc(C)cc1C] | B-16 |
| 5-10 | t-Bu | 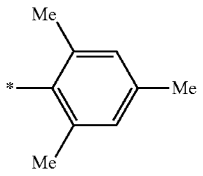 [SMILES: *c1c(C)cc(C)cc1C] | B-11 |
-continued
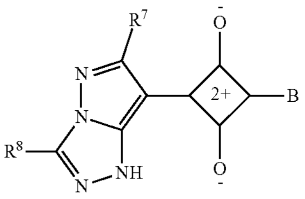
General Formula (5)
| Compound number | $R^7$ | $R^8$ | B |
|---|---|---|---|
| 5-11 | Me | Me | B-17 |
| 5-12 | Me | t-Bu | B-18 |
| 5-13 | Ph | Ph | B-8 |
| 5-14 | Ph | 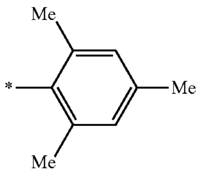 [SMILES: *c1c(C)cc(C)cc1C] | B-17 |
| 5-15 | Et | Ph | B-17 |
| 5-16 | OEt | t-Bu | B-3 |
| 5-17 | OEt | Bu | B-26 |
| 5-18 | CF3 | t-Bu | B-19 |
| 5-19 | NHCOCH3 | t-Bu | B-2 |
| 5-20 | NHCOCH3 | 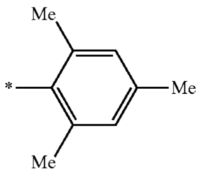 [SMILES: *c1c(C)cc(C)cc1C] | B-1 |
| 5-21 | t-Bu | 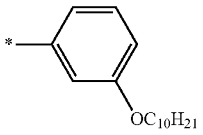 | B-2 |
| 5-22 | Me | 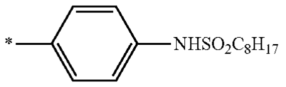 | B-51 |
| 5-23 | t-Bu | 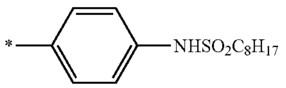 | B-52 |
| 5-24 | Me | 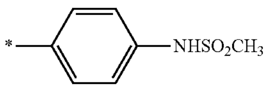 | B-55 |
| 5-25 | t-Bu | 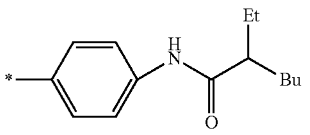 | B-60 |
| 5-26 | Me | Me | B-65 |
| 5-27 | Me | t-Bu | B-67 |
| 5-28 | Ph | Ph | B-50 |

-continued

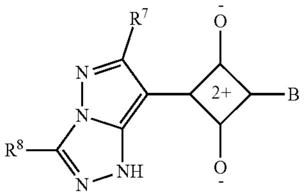

General Formula (5)

| Compound number | $R^7$ | $R^8$ | B |
|---|---|---|---|
| 5-29 | Ph | 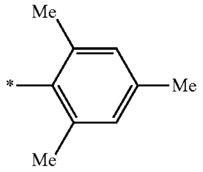 [SMILES: *c1c(C)cc(C)cc1C] | B-23 |
| 5-30 | Et | Ph | B-59 |

(Quencher-Embedded Coloring Agent)

The squarine-based coloring agent represented by General Formula (1) may be a quencher-embedded coloring agent in which a quencher moiety is linked to a coloring agent by a covalent bond with a linking group being interposed therebetween. The quencher-embedded coloring agent can also be preferably used as at least one coloring agent of the dye C. That is, the quencher-embedded coloring agent is counted as the dye C according to the wavelength having the main absorption wavelength band.

Examples of the quencher moiety include the ferrocenyl group in the above-described substituent X. Further, examples thereof include the quencher moiety in the quencher compounds described in paragraphs [0199] to [0212] and paragraphs [0234] to [0310] of WO2019/066043A.

Among the squarine-based coloring agents represented by General Formula (1), specific examples of the coloring agent corresponding to the quencher-embedded coloring agent are shown below. However, the present invention is not limited thereto.

In the following specific examples, Me represents methyl, Et represents ethyl, and Bu represents butyl, respectively.

AA-1

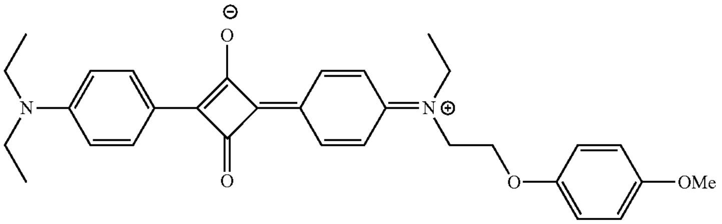

AA-2

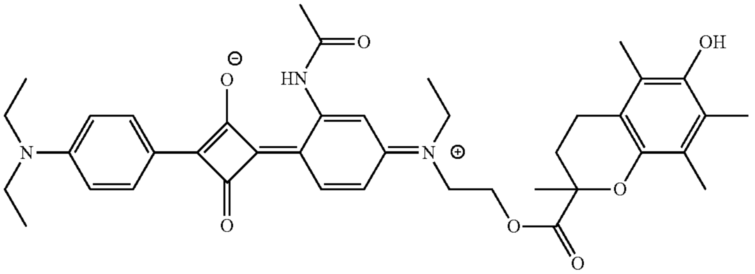

AA-3

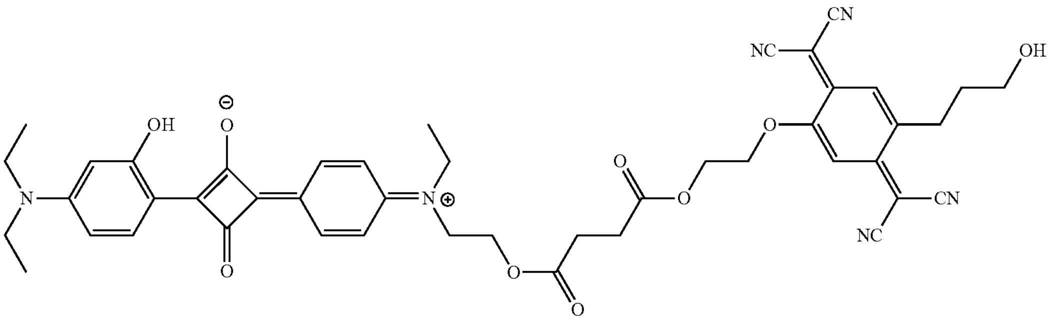

-continued
AA-4
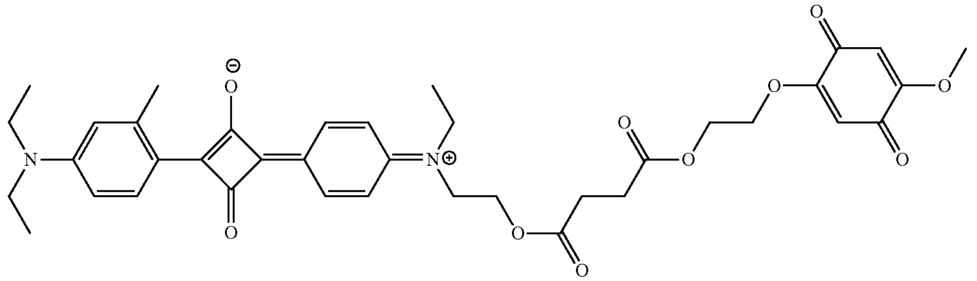
AA-5
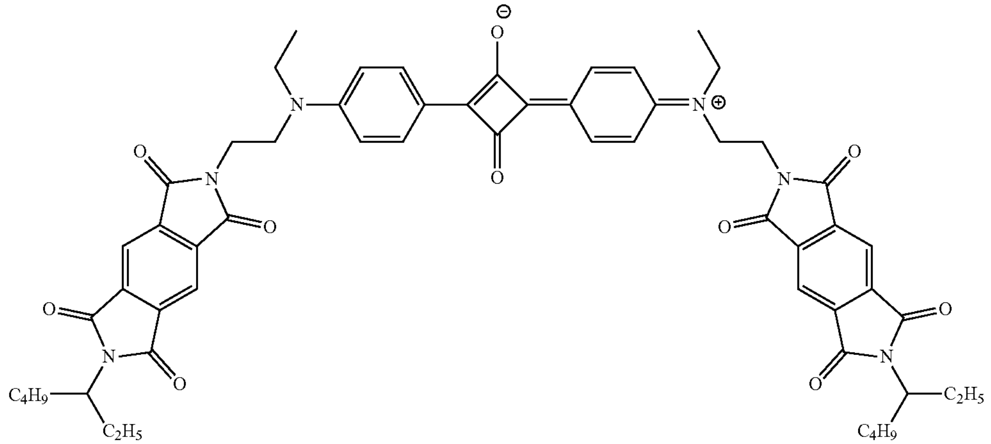
AA-6
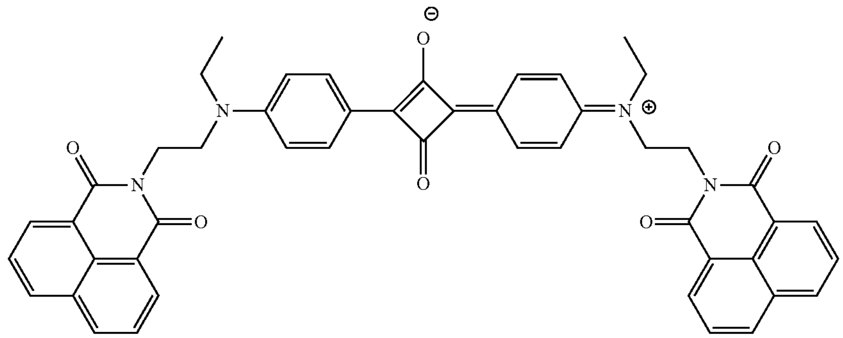
AA-7
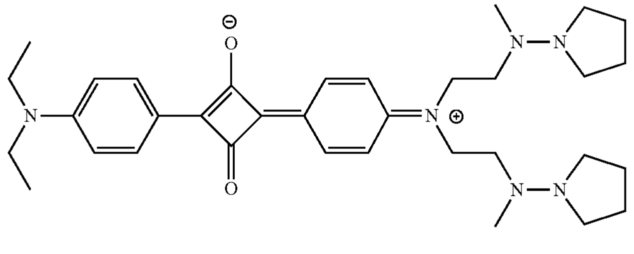
AA-8
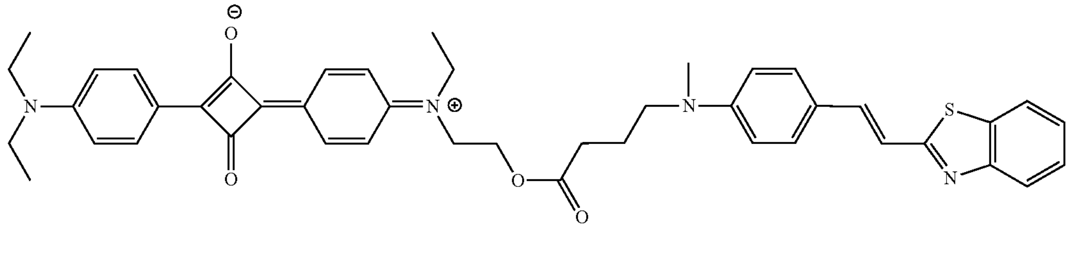

-continued
AA-9
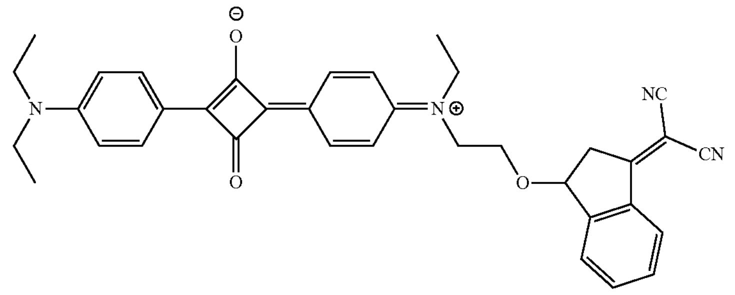
AA-10
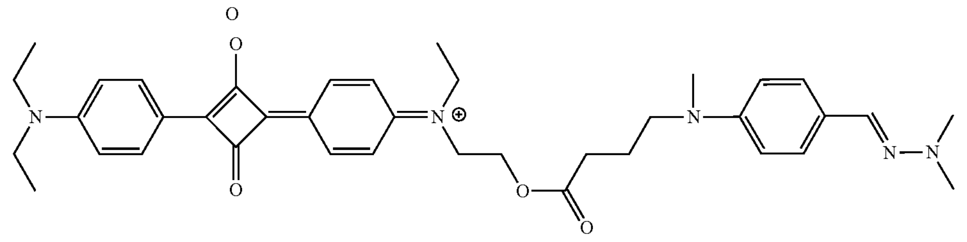
AA-11
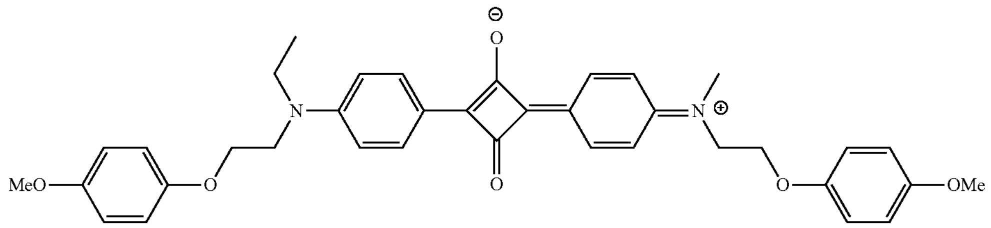
AA-12
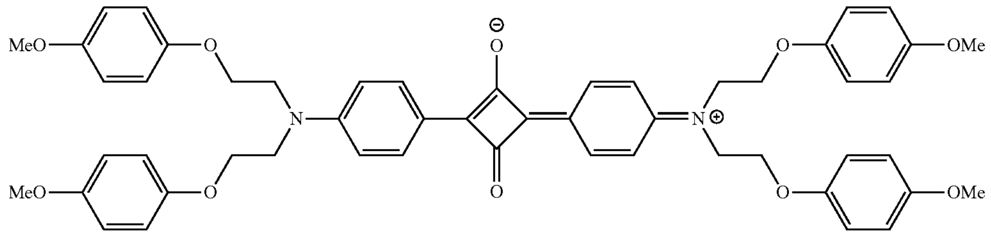
AA-13
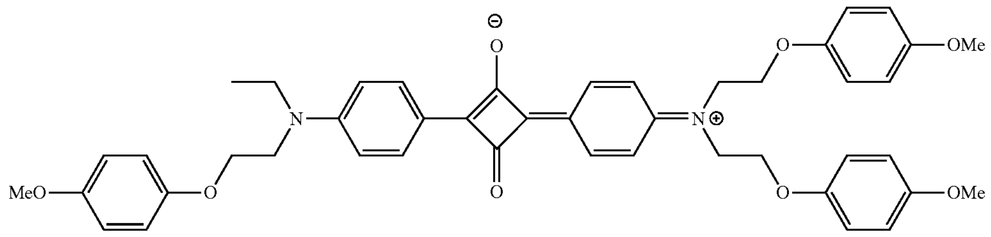

-continued
AA-14
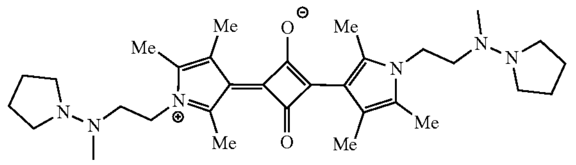
AA-15
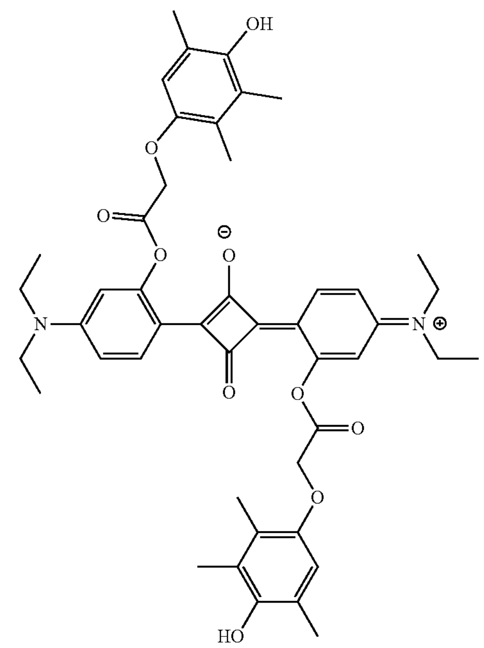
AA-16
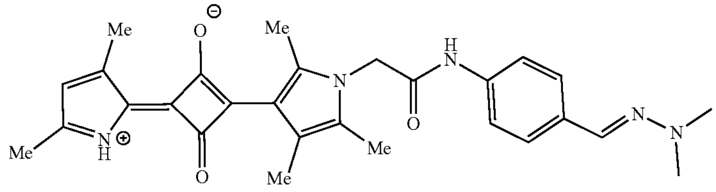
AA-17
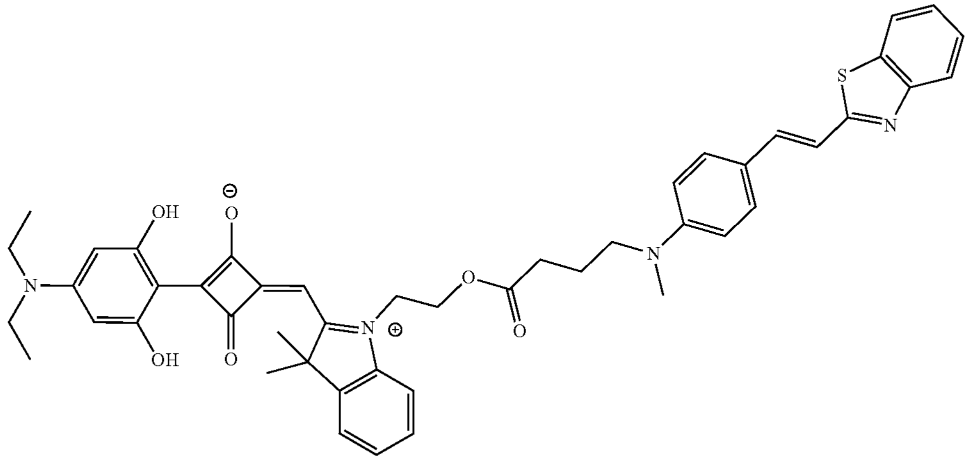
AA-18
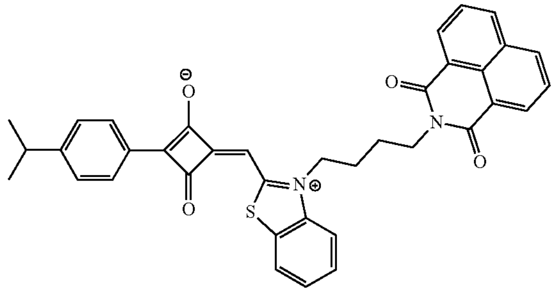
AA-19
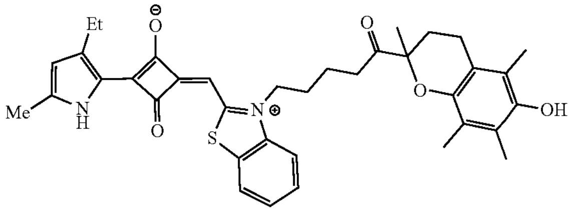

-continued
BB-1
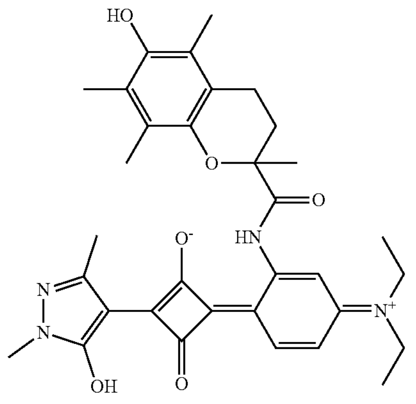
BB-2
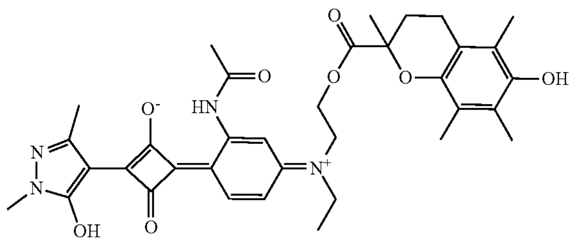
BB-3
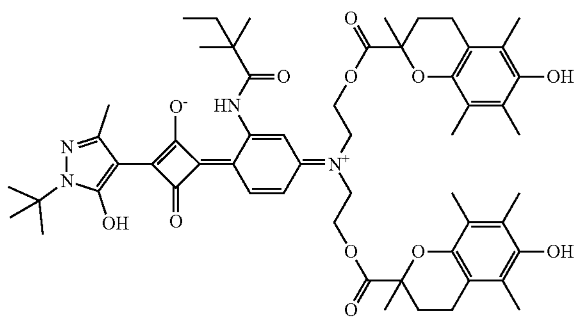
BB-4
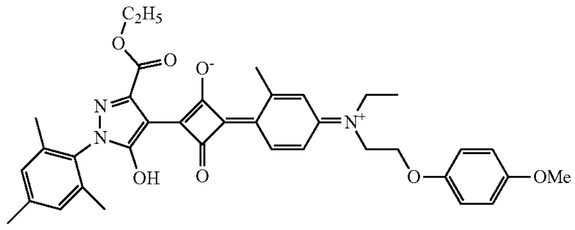
BB-5
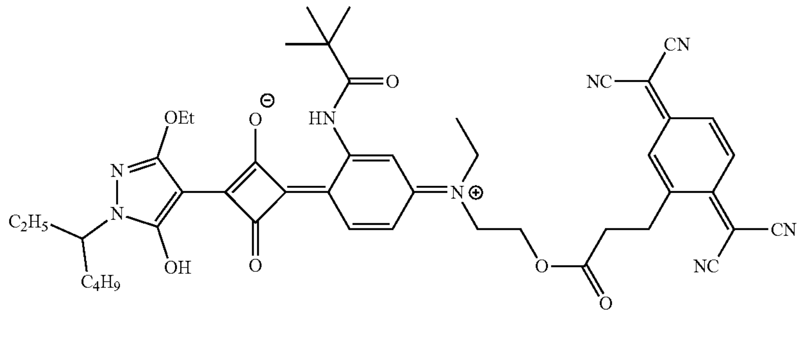
BB-6
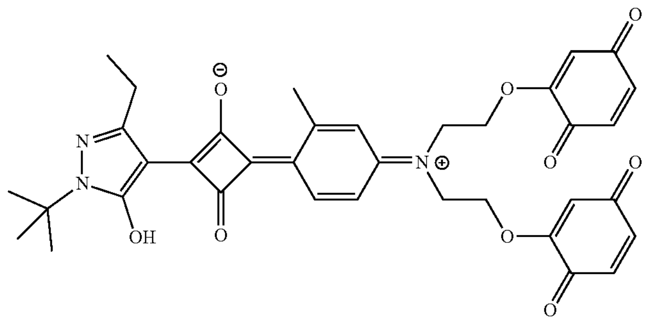

-continued
BB-7
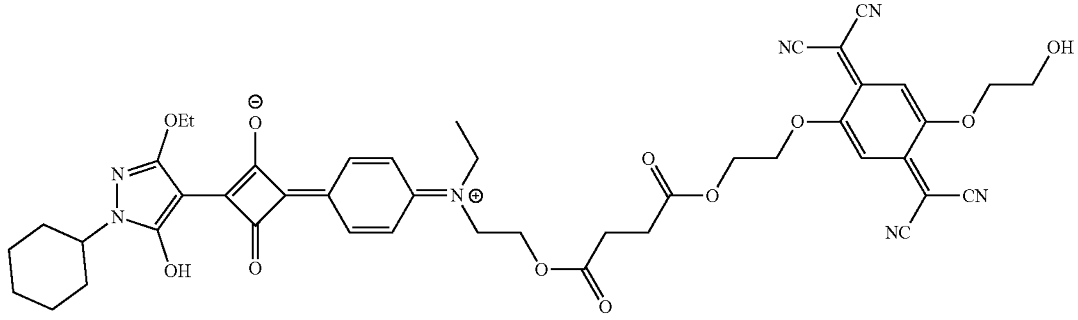
BB-8
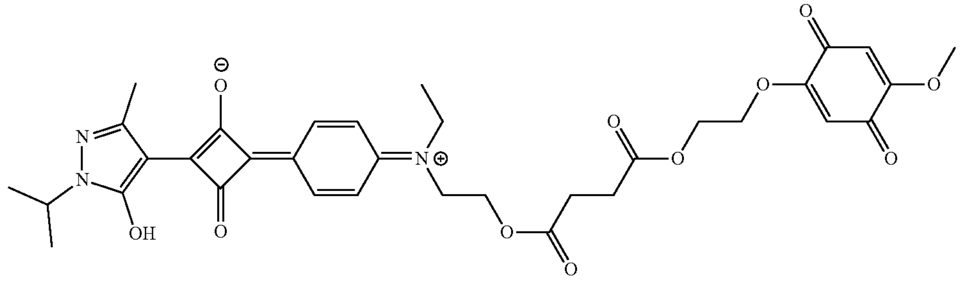
BB-9
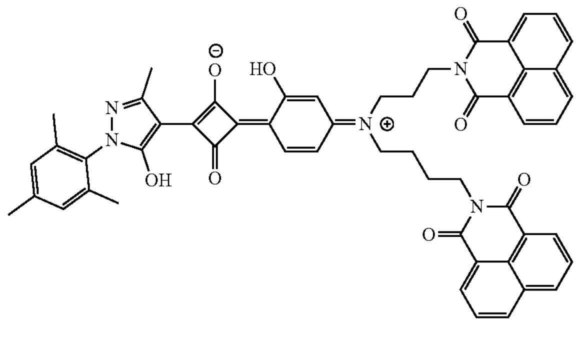
BB-10
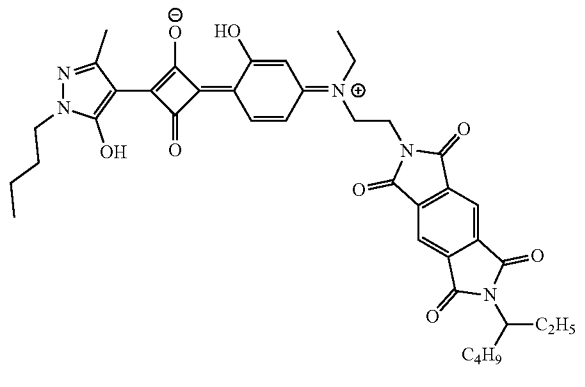
BB-11
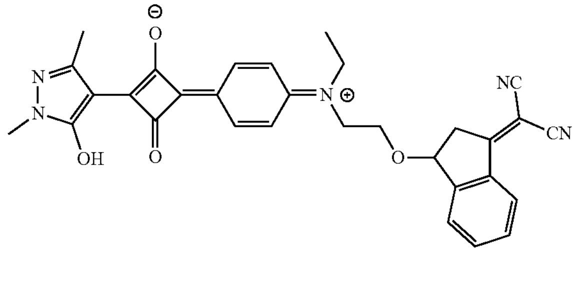
BB-12
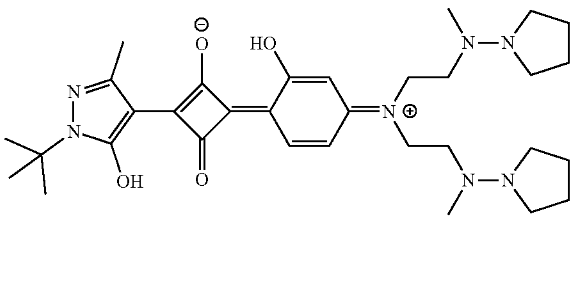

-continued
BB-13
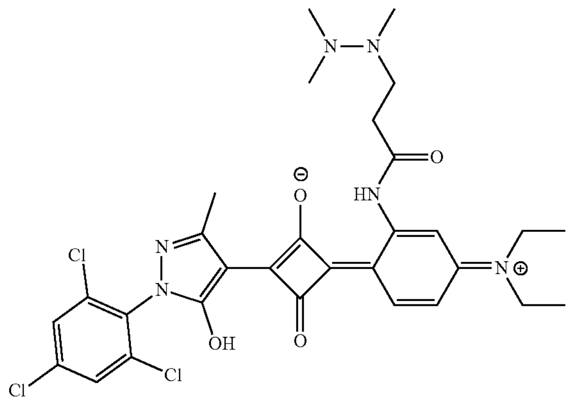
BB-14
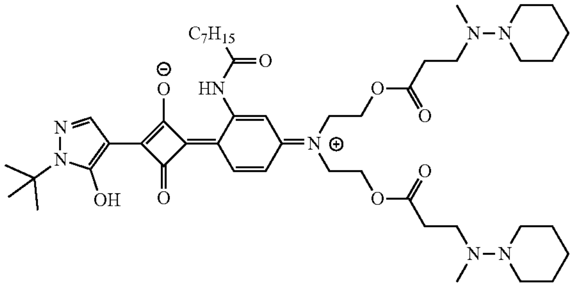
BB-15
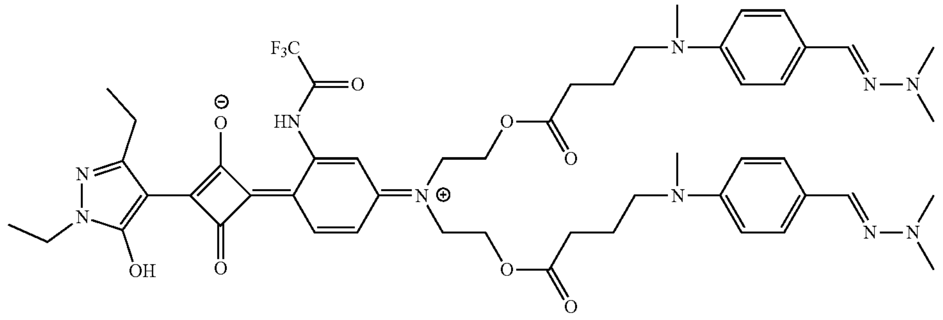
BB-16
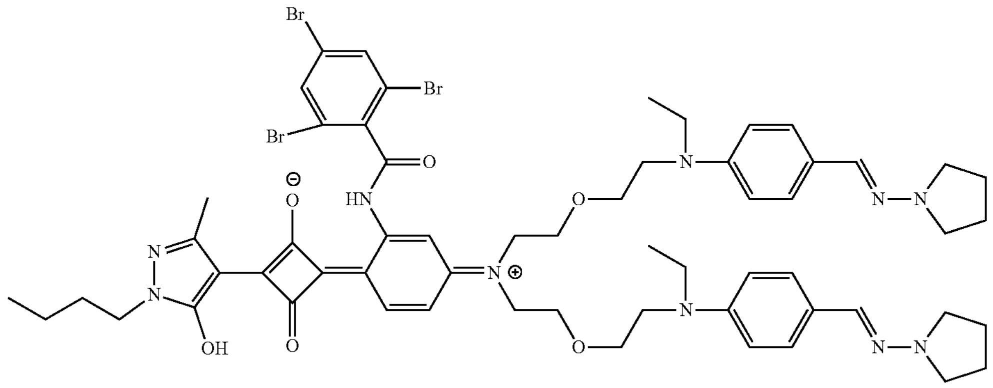
BB-17
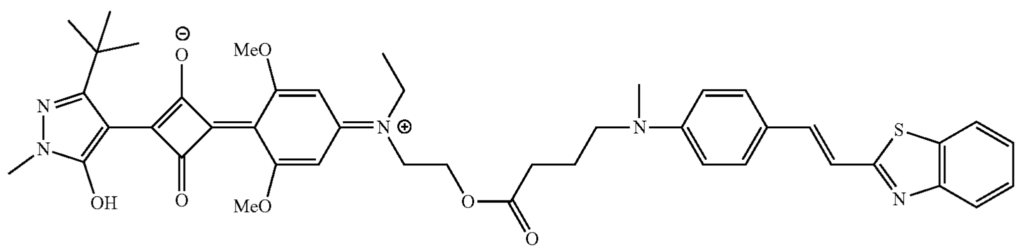

-continued
BB-18
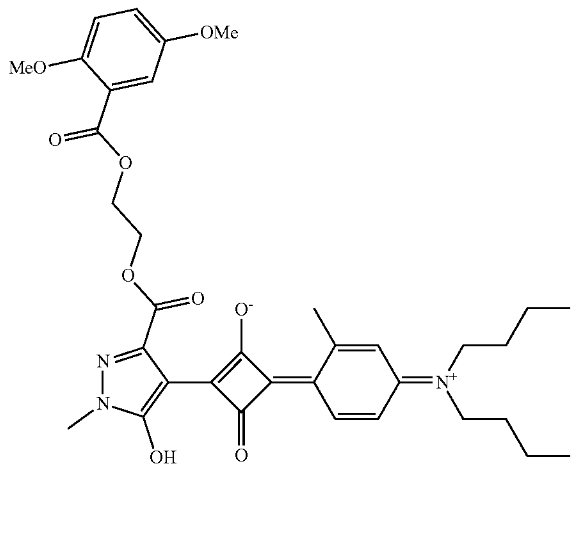
BB-19
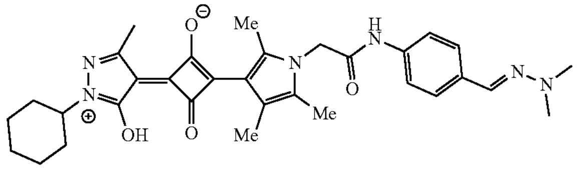
BB-20
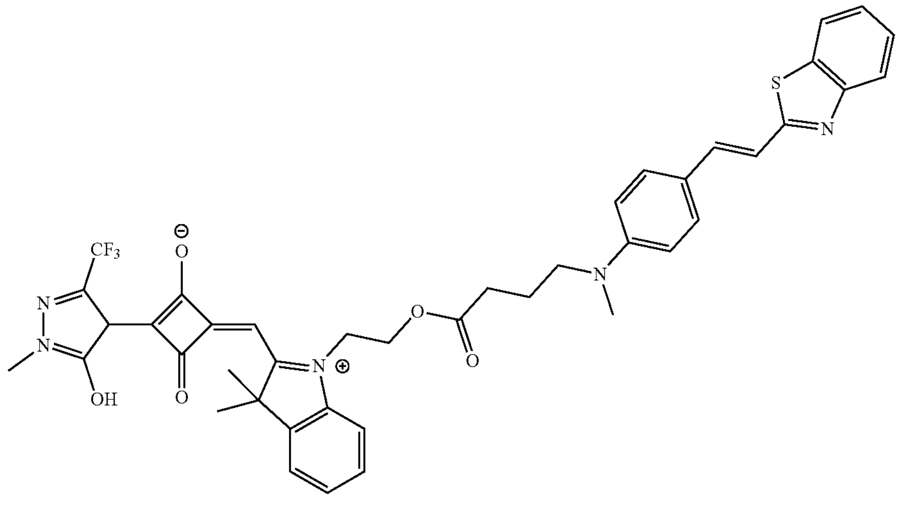
BB-21
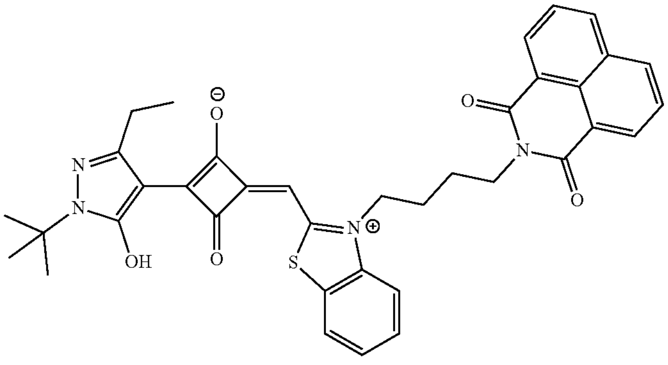

-continued
BB-22
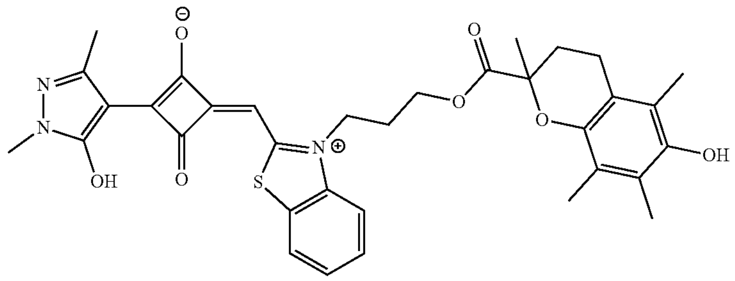
BB-23
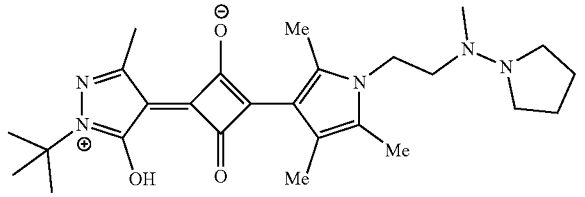
C-19
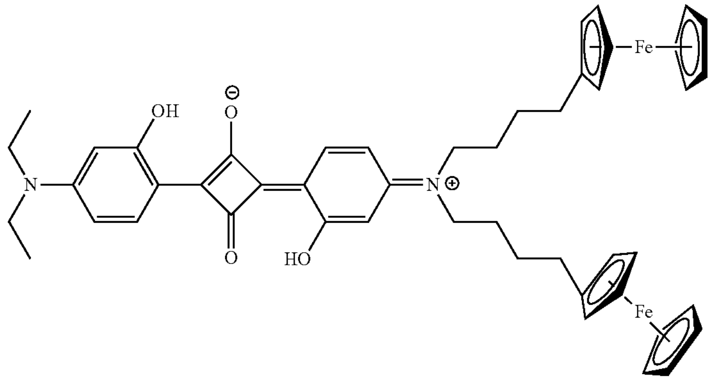
C-20
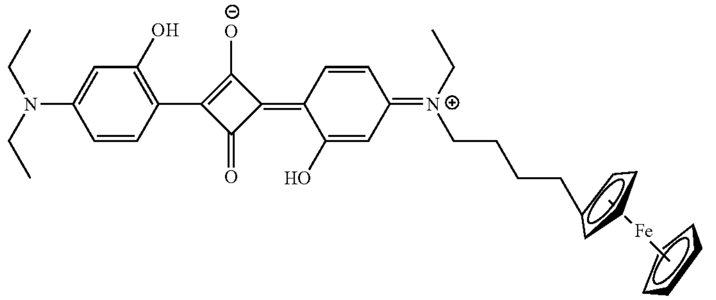
C-21
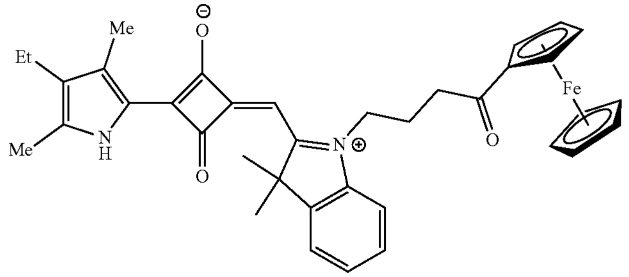

-continued
C-22
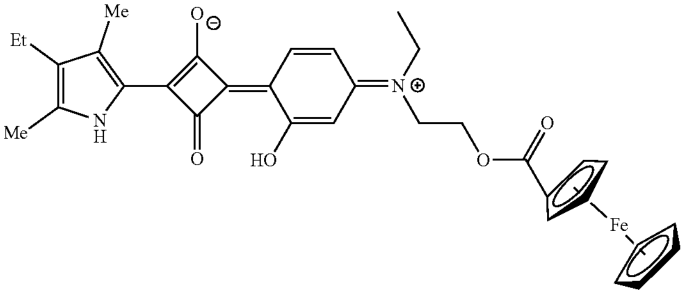
C-23
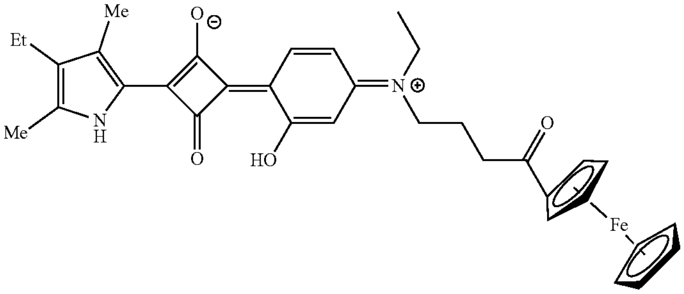
C-24
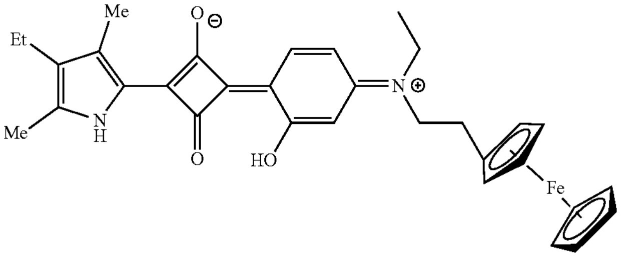
C-25
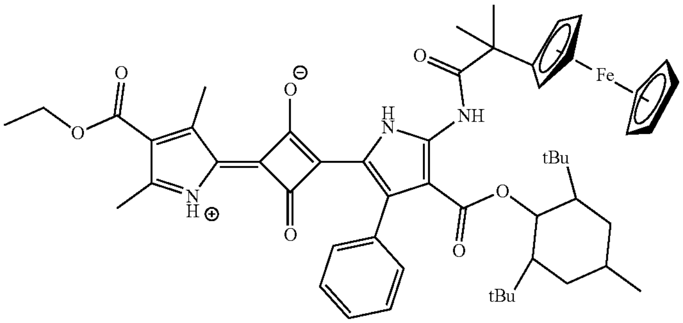

-continued
C-26
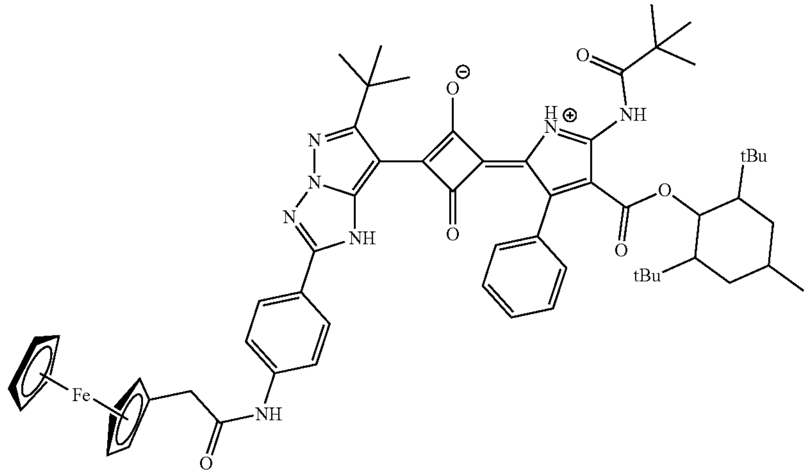
C-27
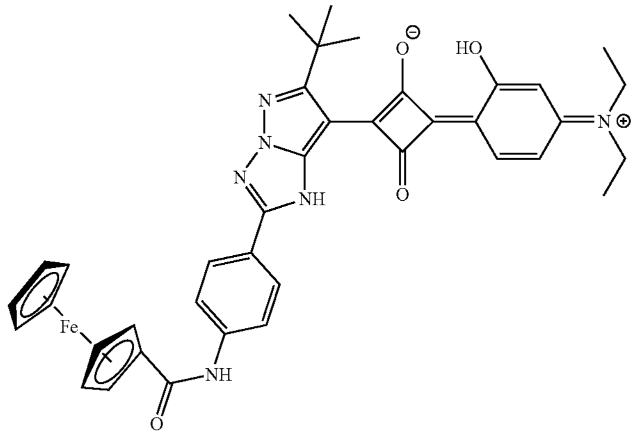
C-28
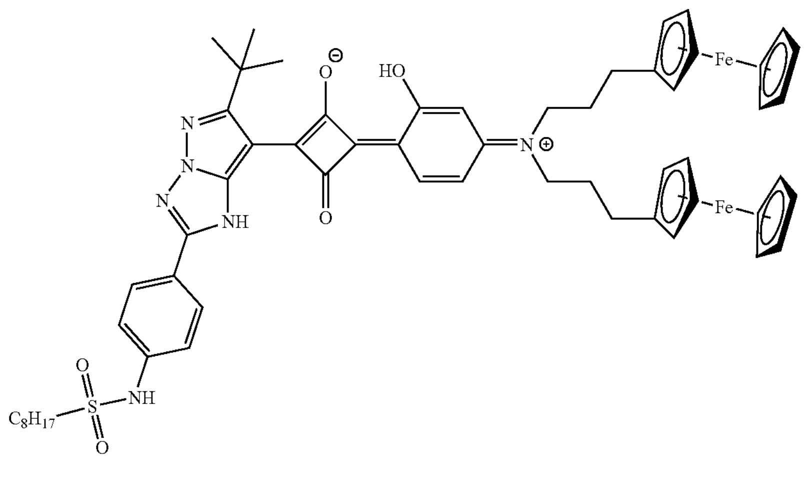

-continued
C-29
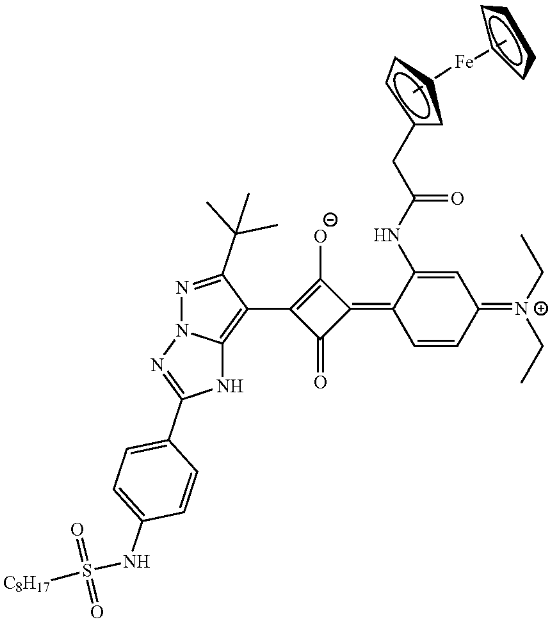
C-30
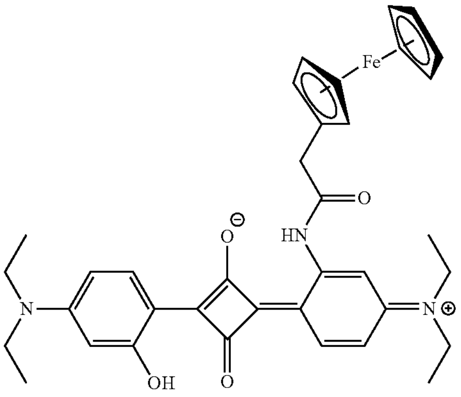
C-31
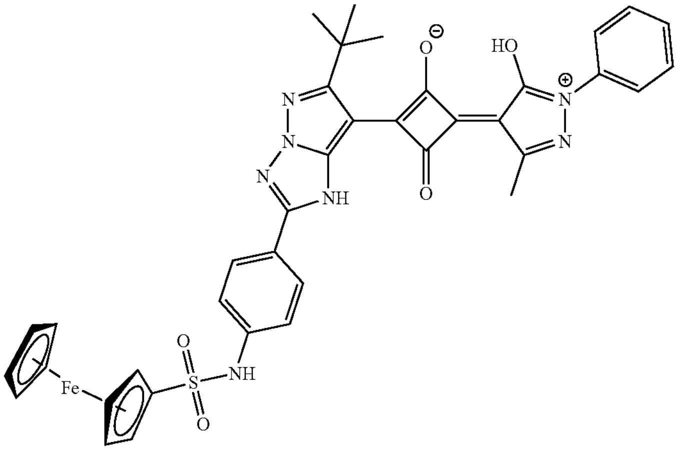

-continued
C-32
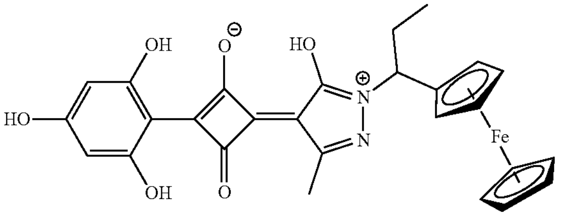
C-33
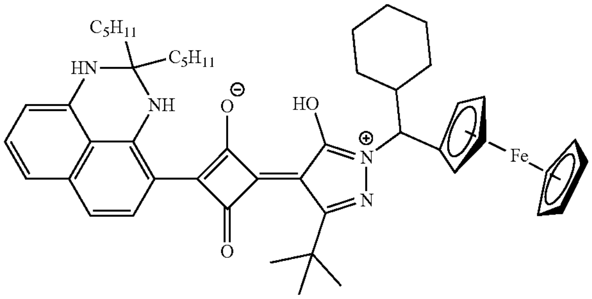
C-34
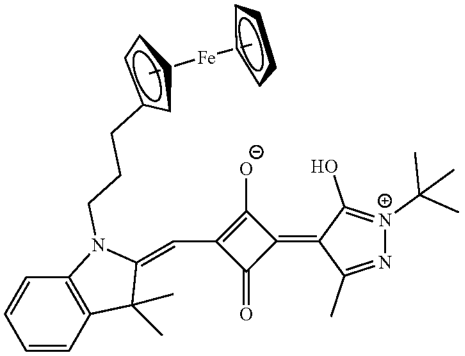
C-35
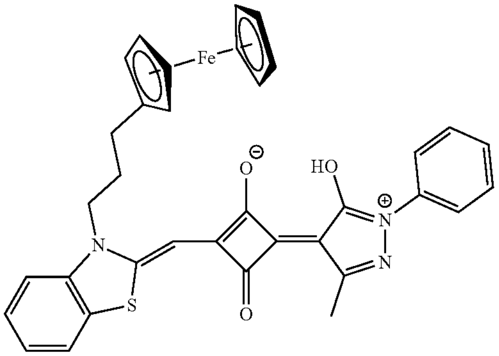

-continued
C-36
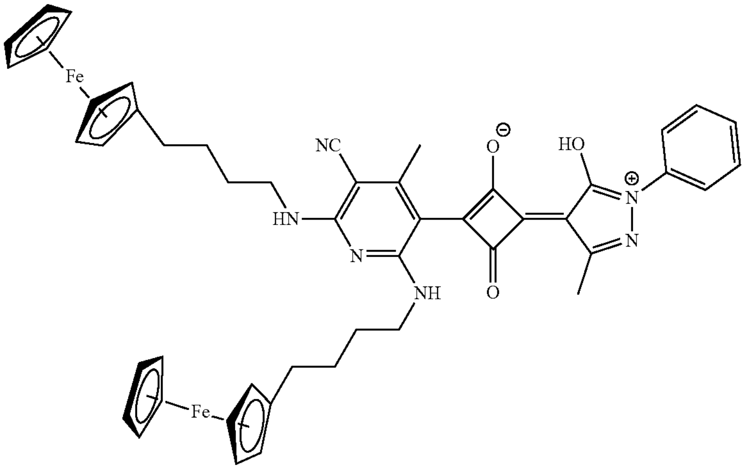
C-37
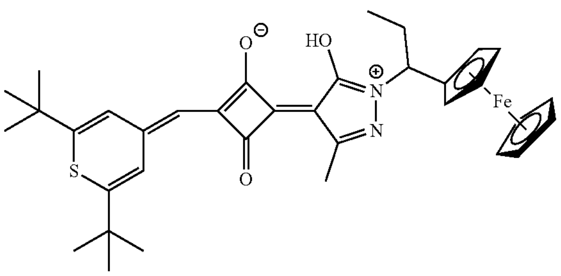
C-38
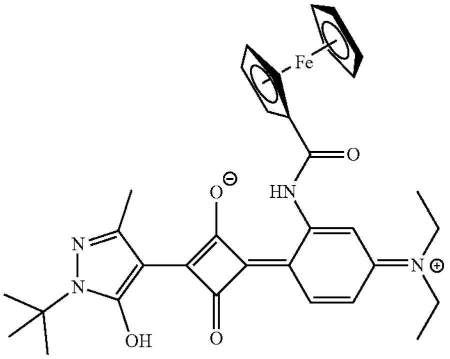
C-39
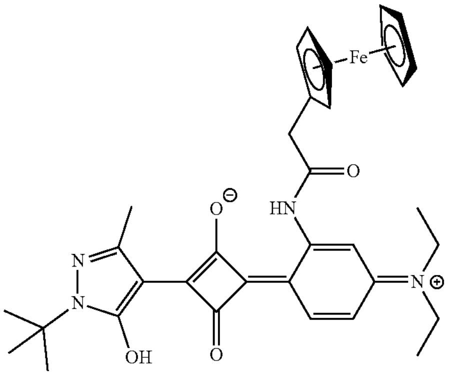
-continued
C-40
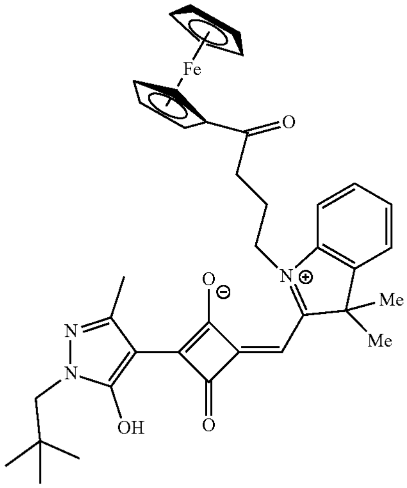
C-41
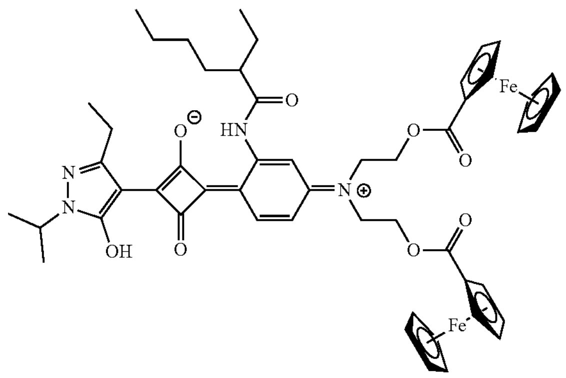

-continued
C-42
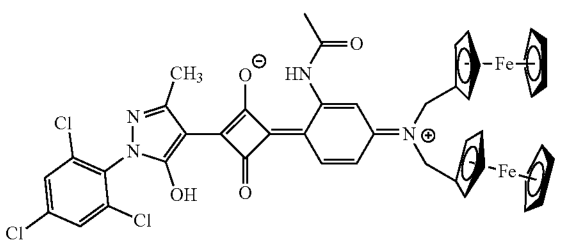
C-43
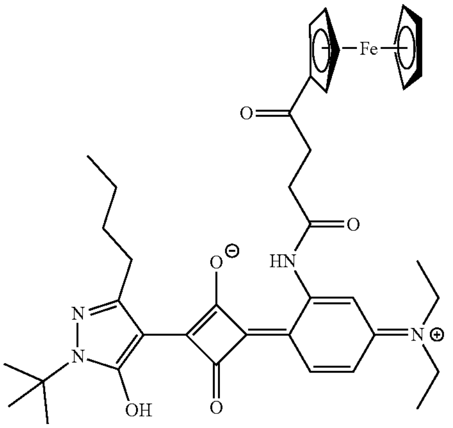
C-44
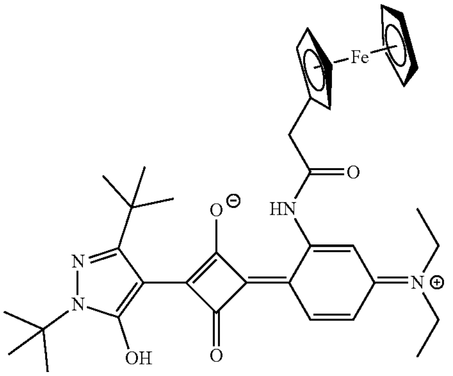
C-45
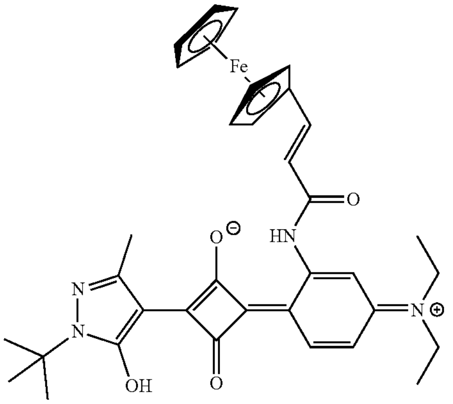
-continued
C-46
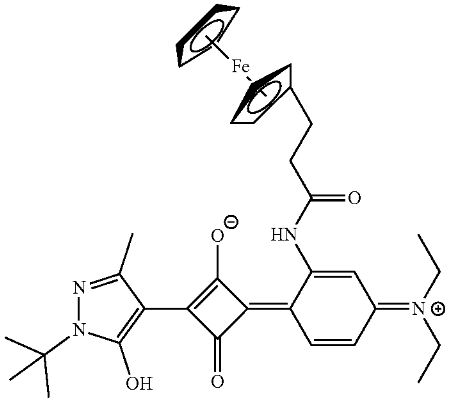
C-47
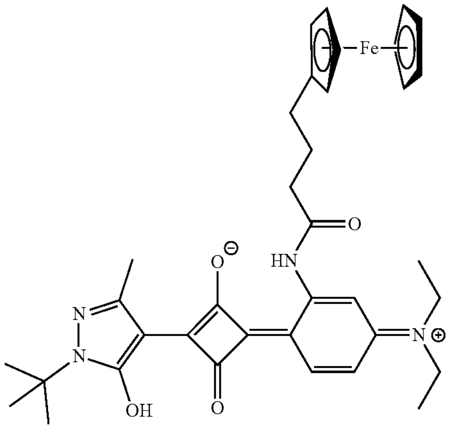
C-48
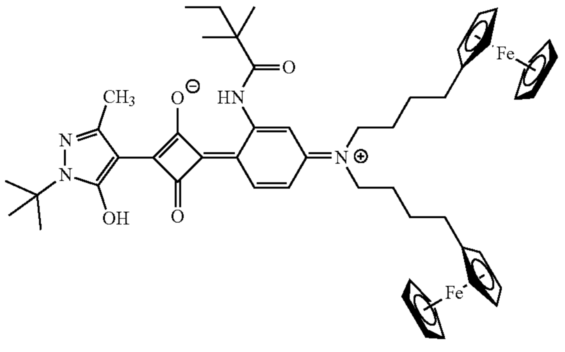
C-49
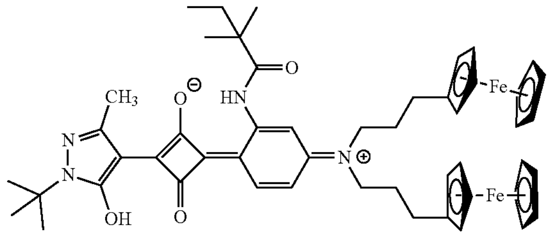

-continued
C-50
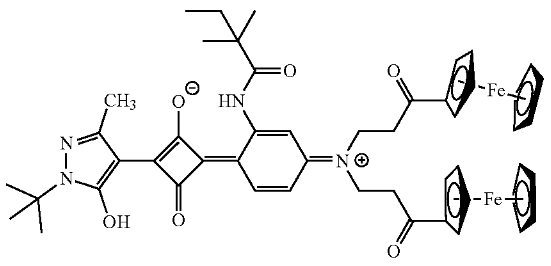
C-51
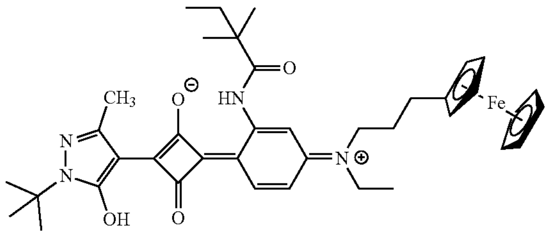
C-52
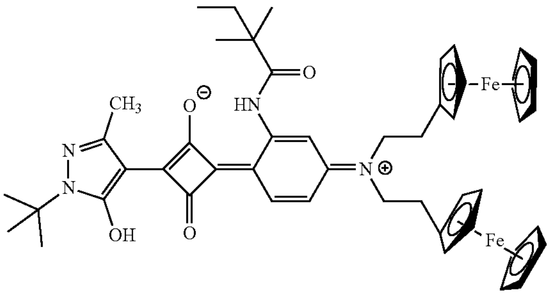
C-53
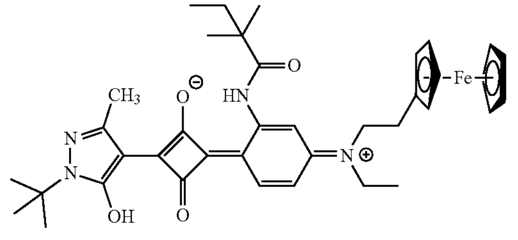
C-54
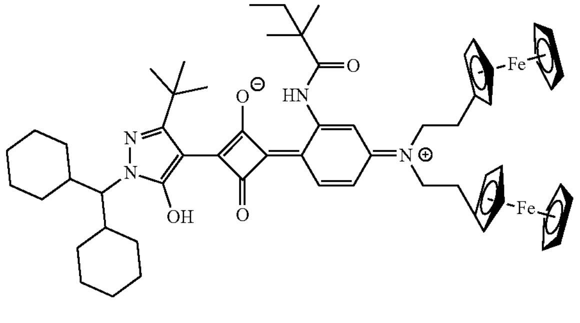
-continued
C-55
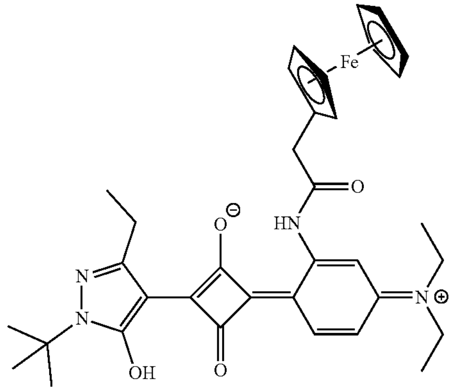
C-56
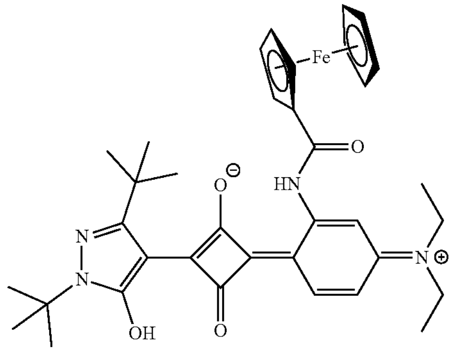
C-57
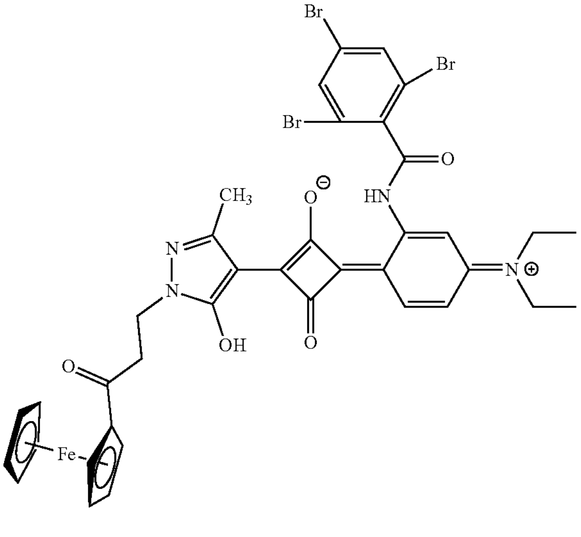

-continued
C-58
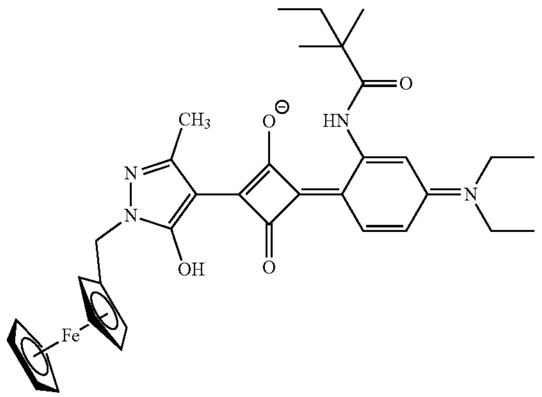
C-59
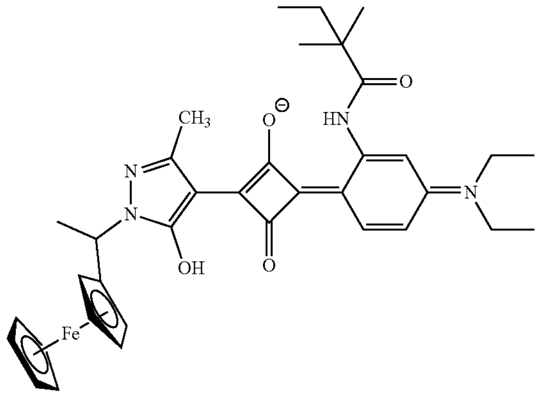
C-60
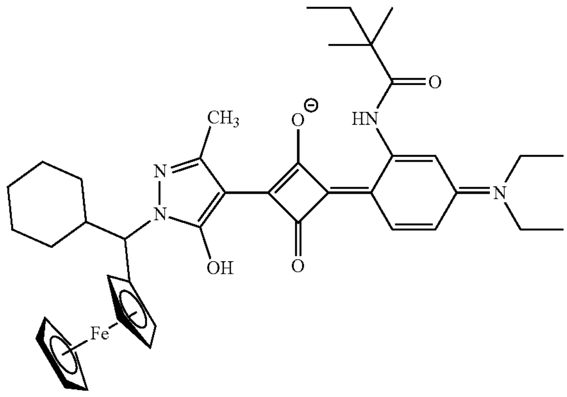
-continued
C-61
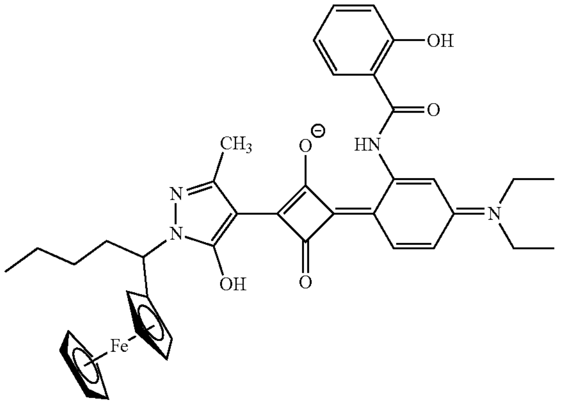
C-62
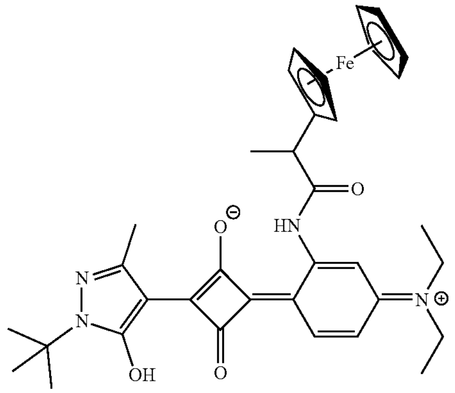
C-63
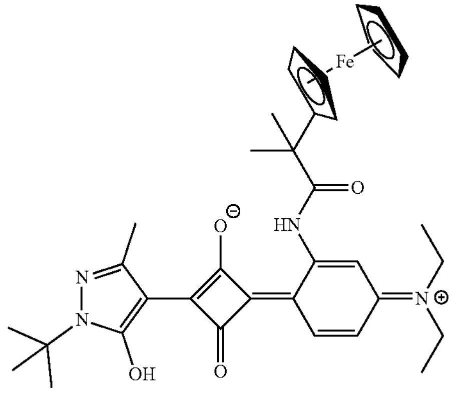

-continued
C-64
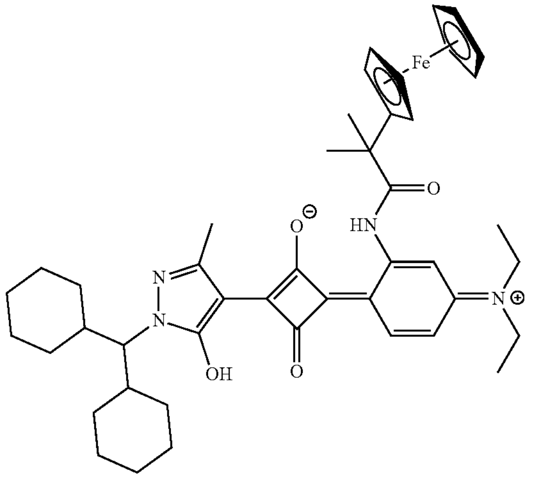
C-65
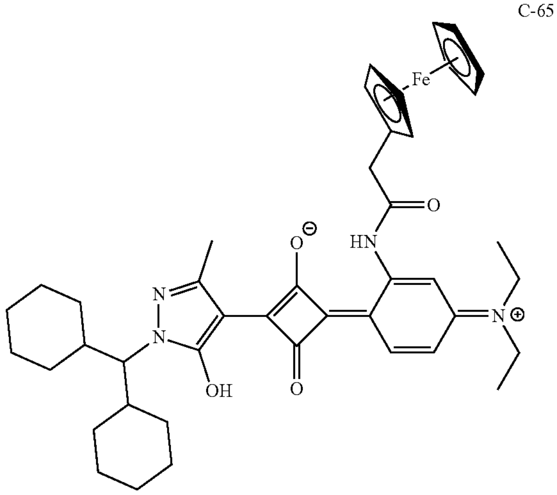
C-66
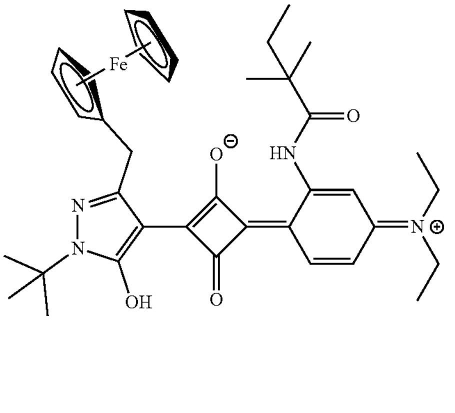
-continued
C-67
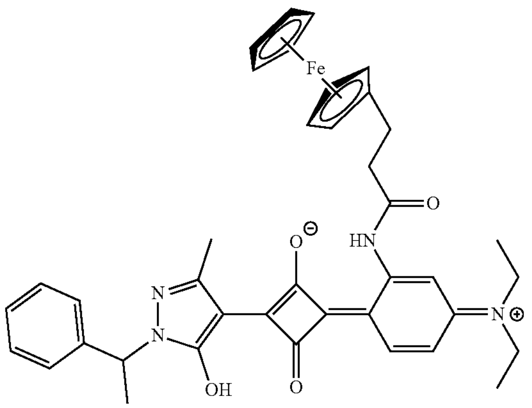
C-68
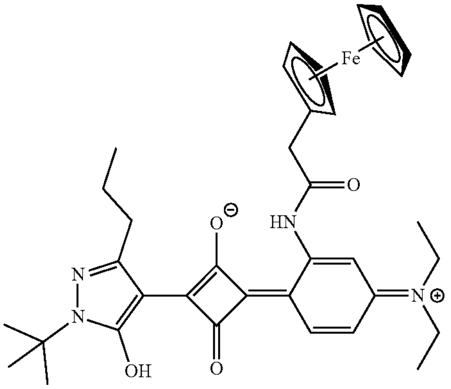
C-69
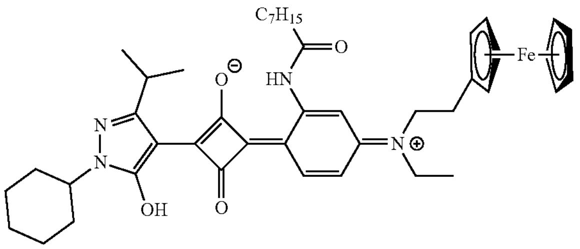
C-70
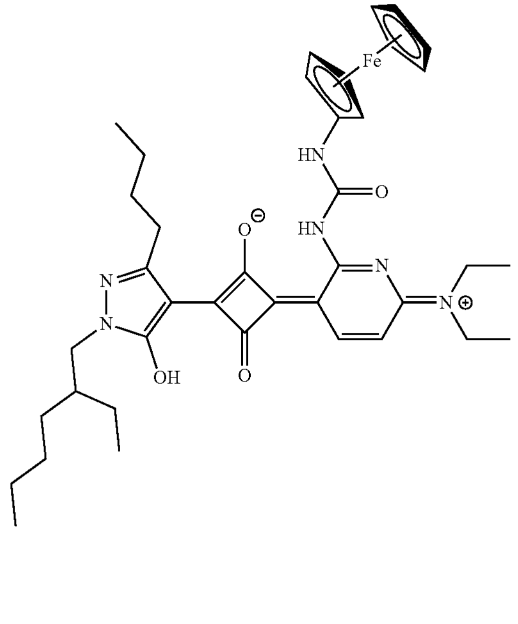

-continued
C-71
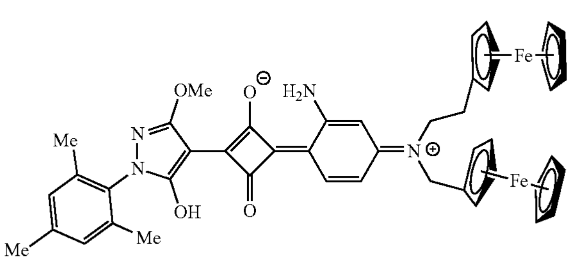
C-72
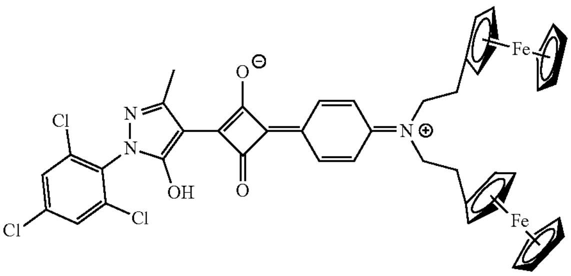
C-73
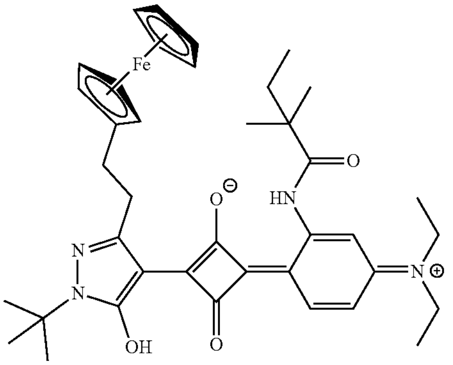
C-74
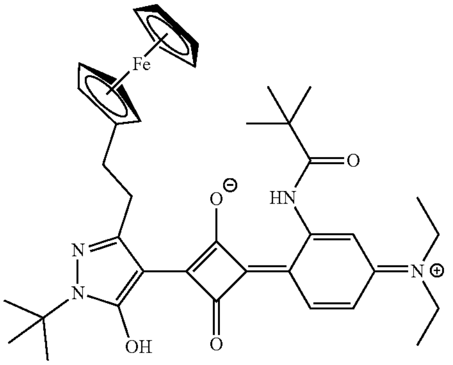
-continued
C-75
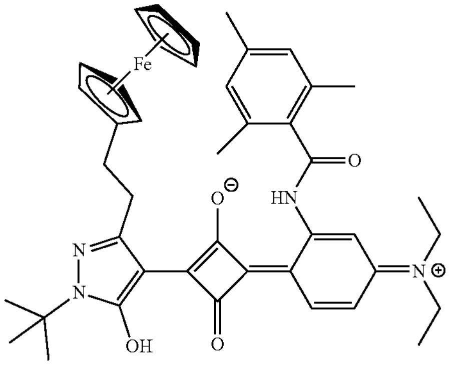
C-76
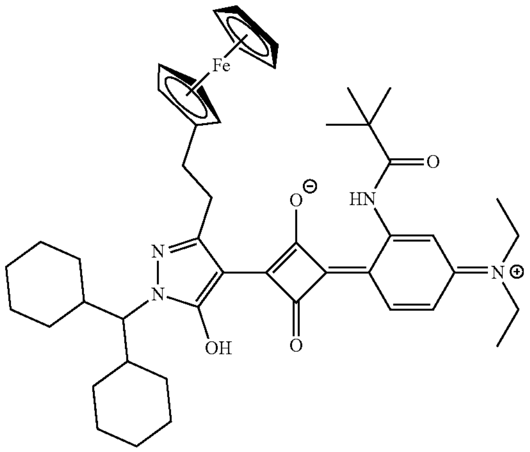
C-77
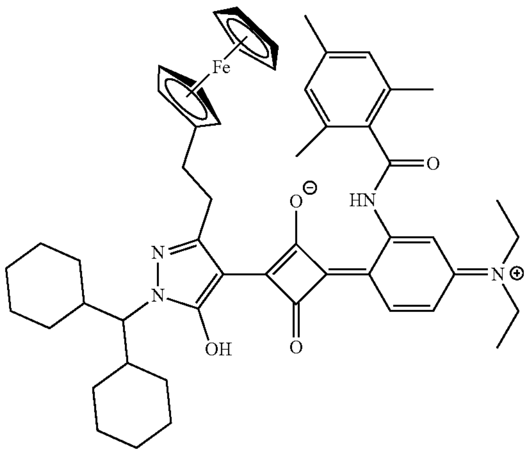

-continued
C-78
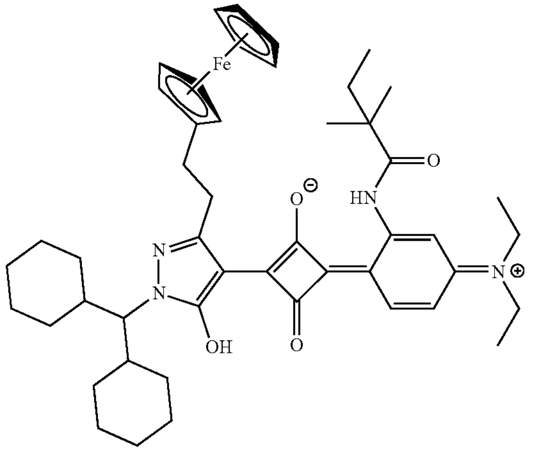
C-79
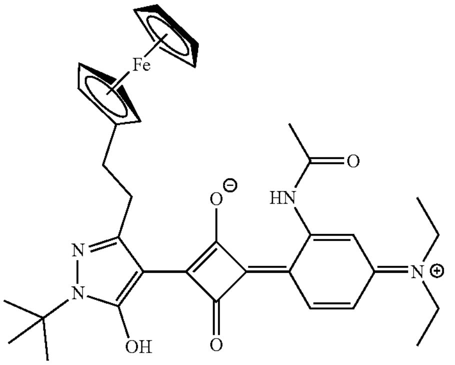
C-80
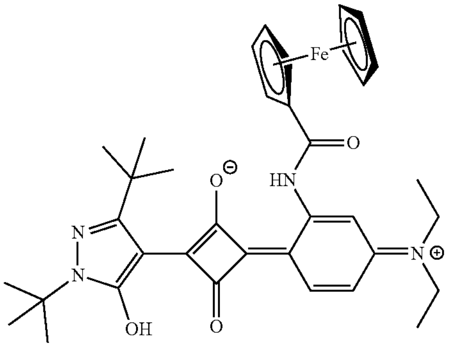
C-81
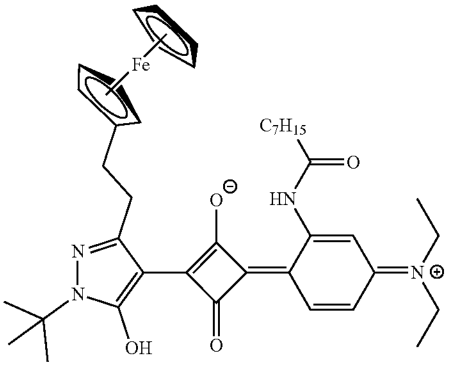
-continued
C-82
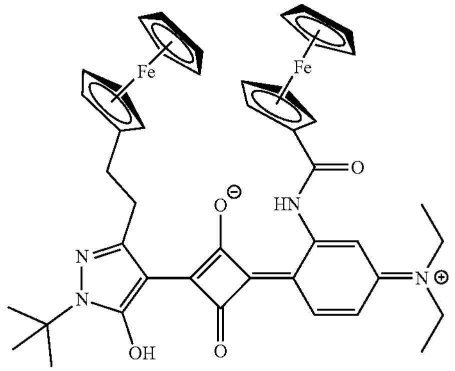
C-83
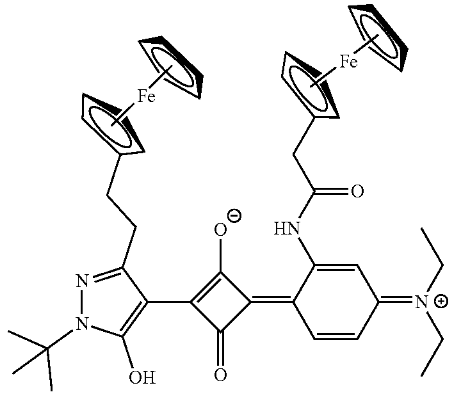
C-84
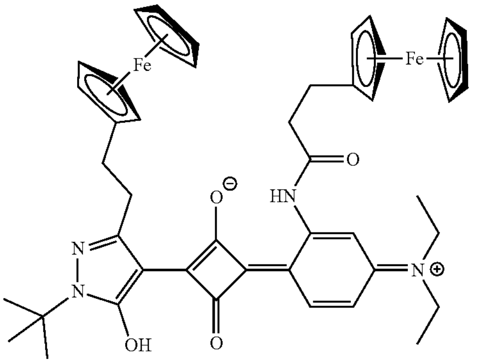
C-85
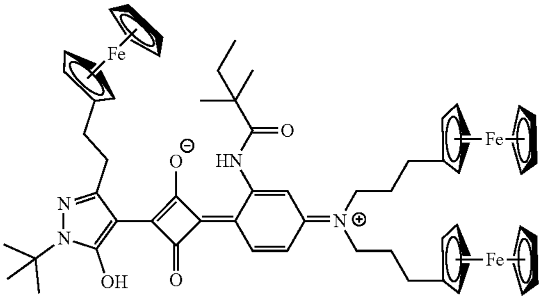

-continued
C-86
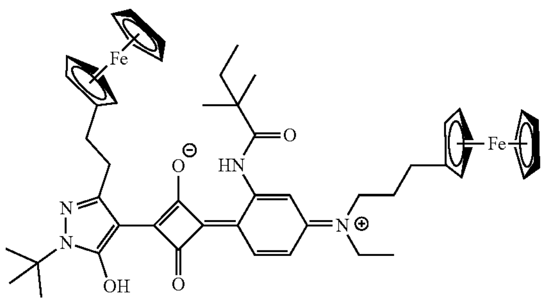
C-87
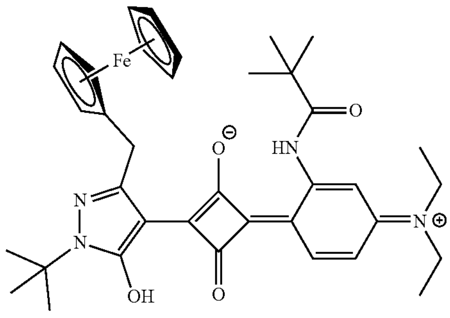
C-88
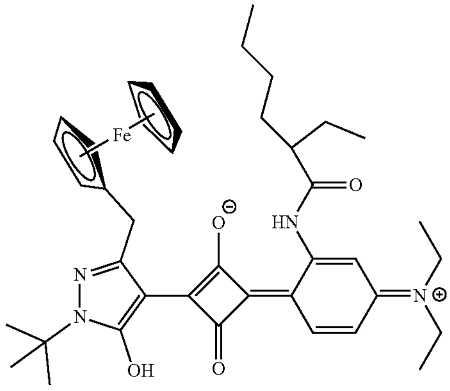
C-89
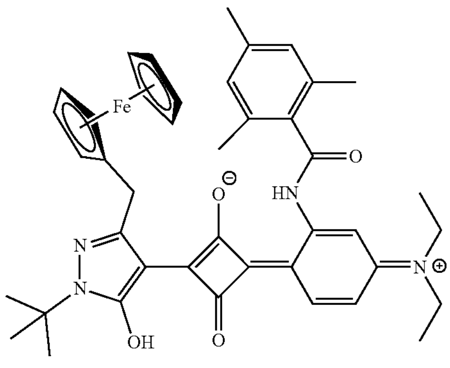
-continued
C-90
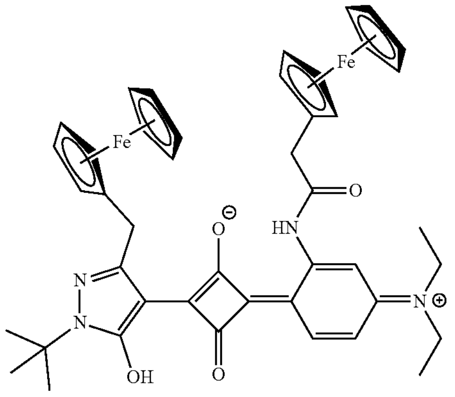
C-93
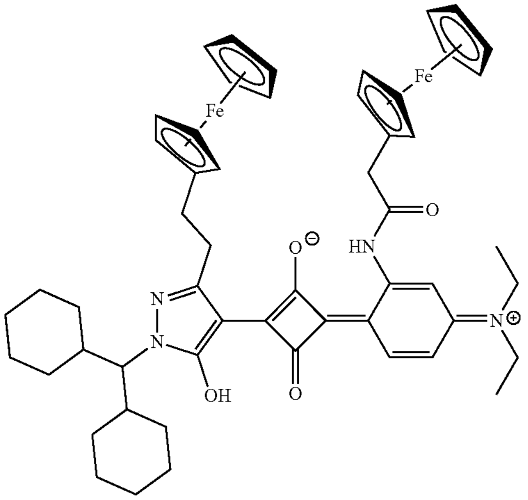
C-94
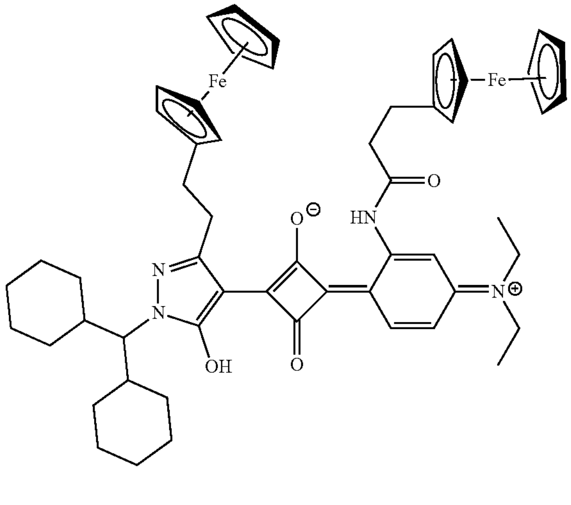

-continued
C-95
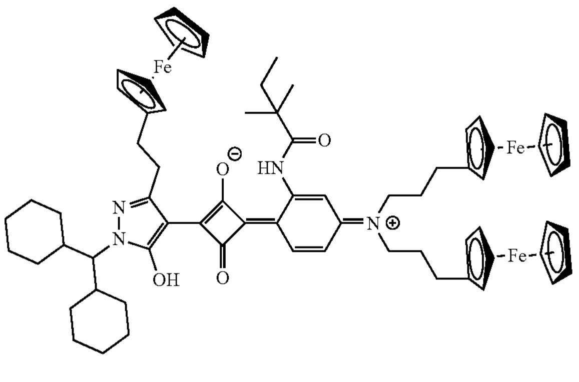
C-96
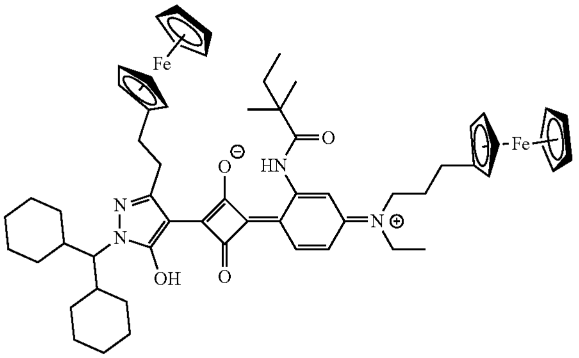
C-97
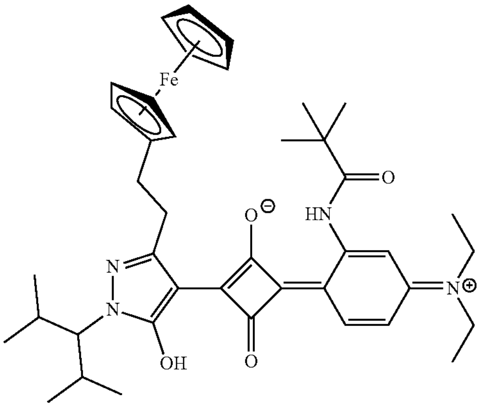
C-98
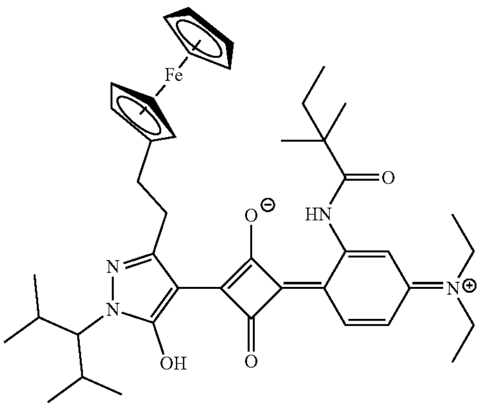
-continued
C-99
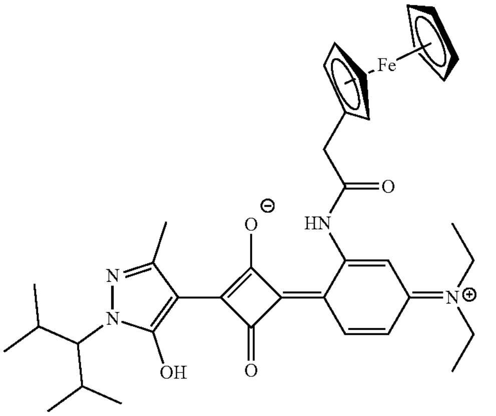
C-100
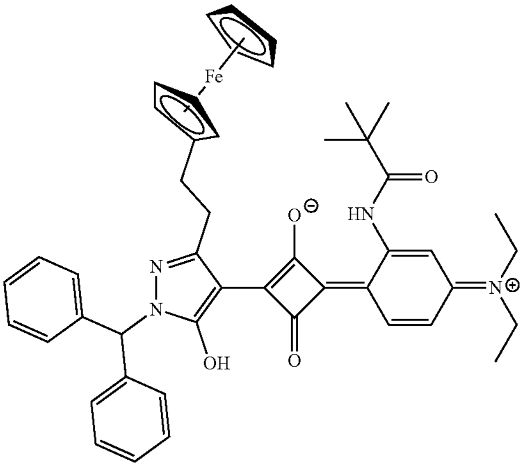
C-101
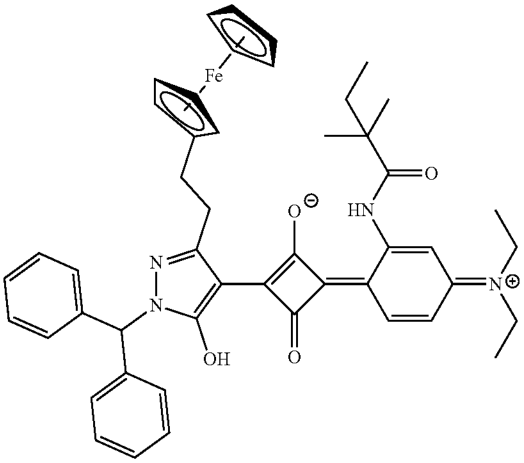

C-102
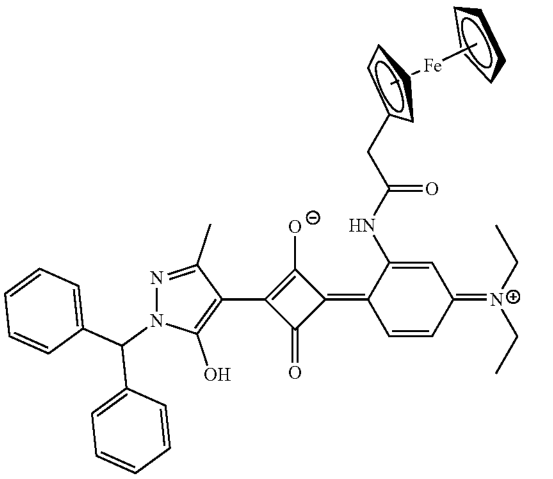
C-103
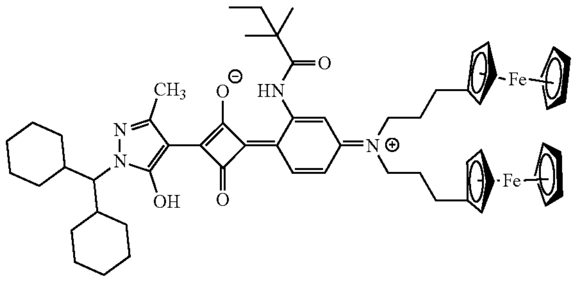
C-104
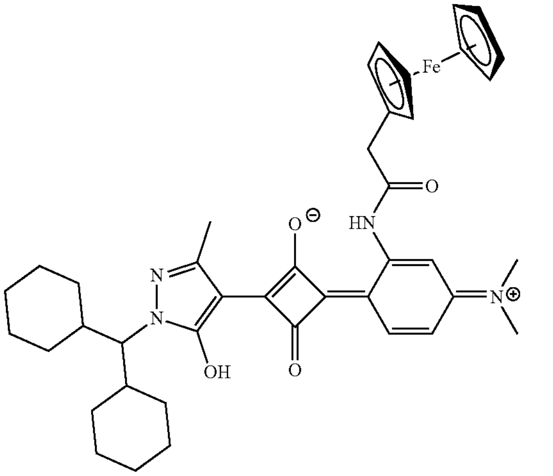
C-105
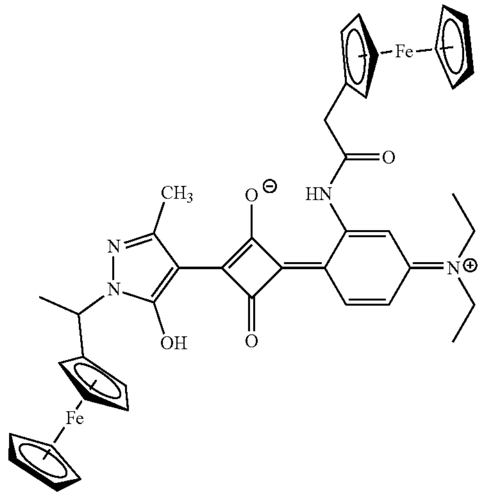
C-106
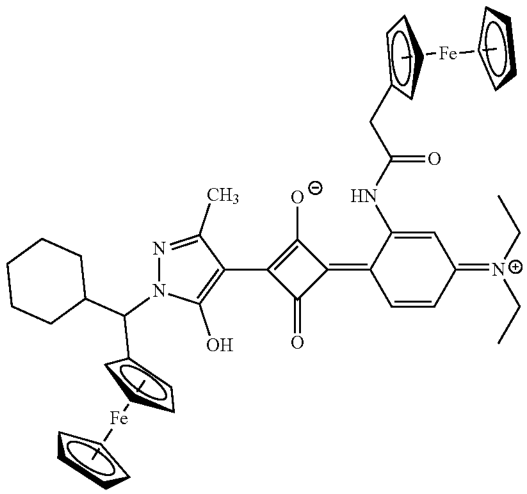
C-107
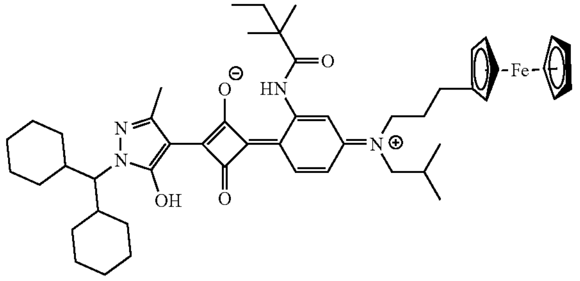

-continued
C-108
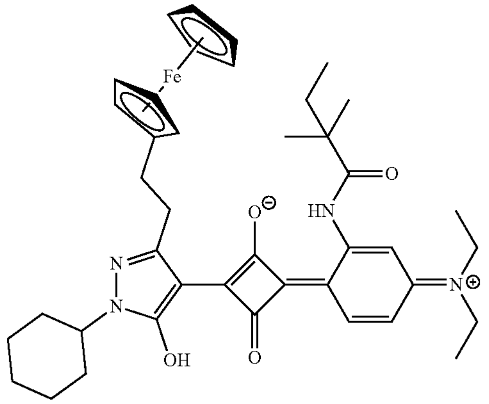
C-109
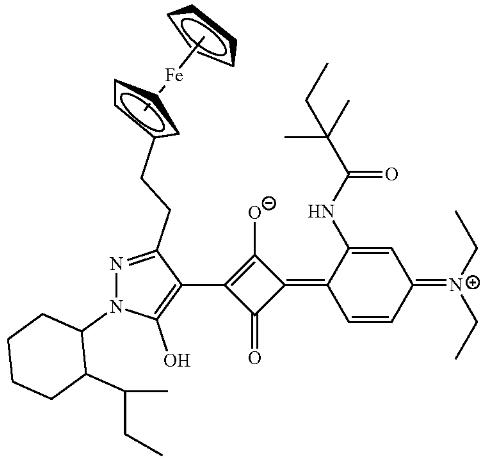
C-110
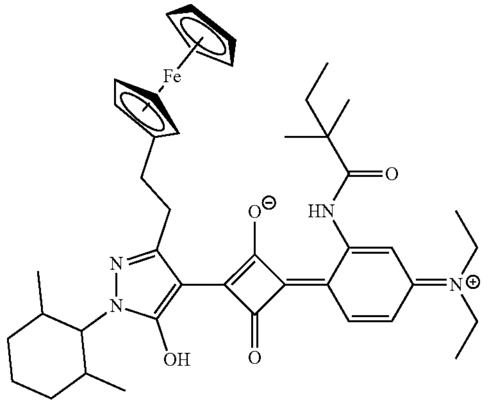
-continued
C-111
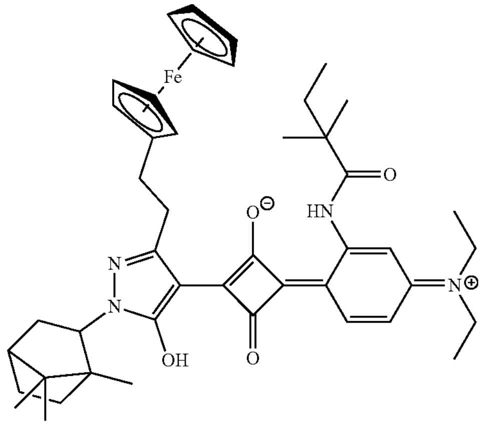
C-111
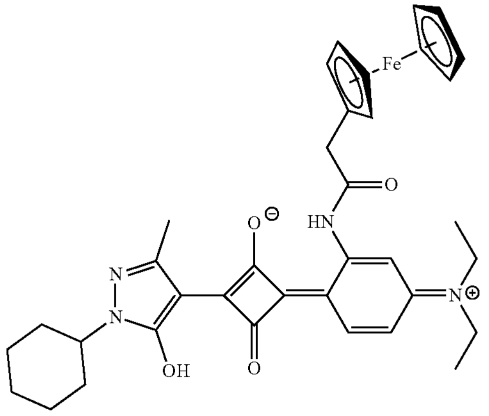
C-113
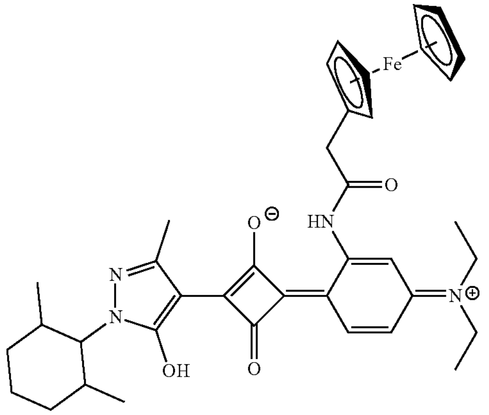

-continued

C-114

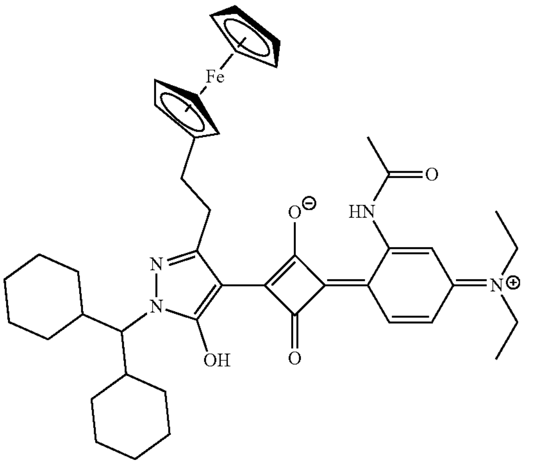

C-115

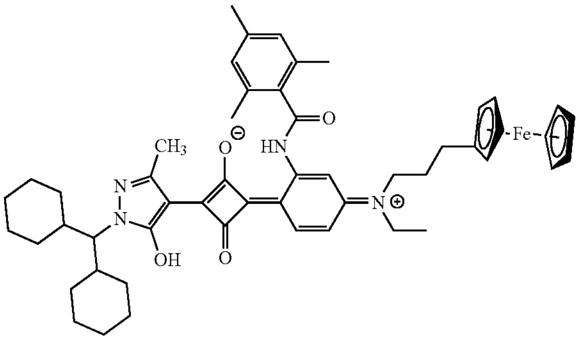

C-116

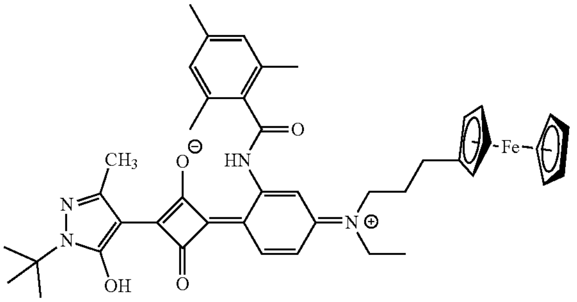

C-117

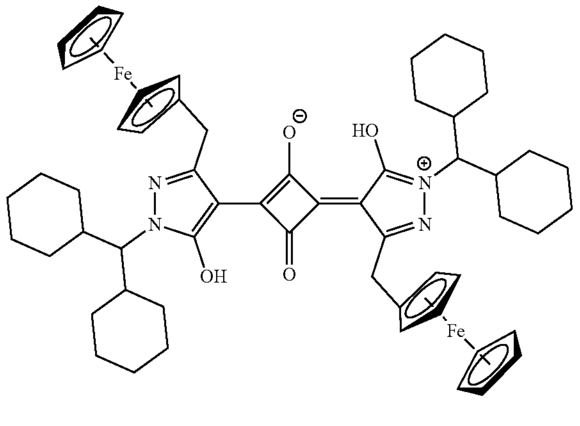

-continued

C-118

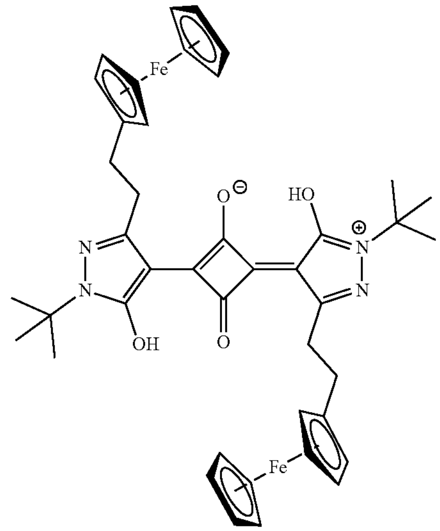

C-119

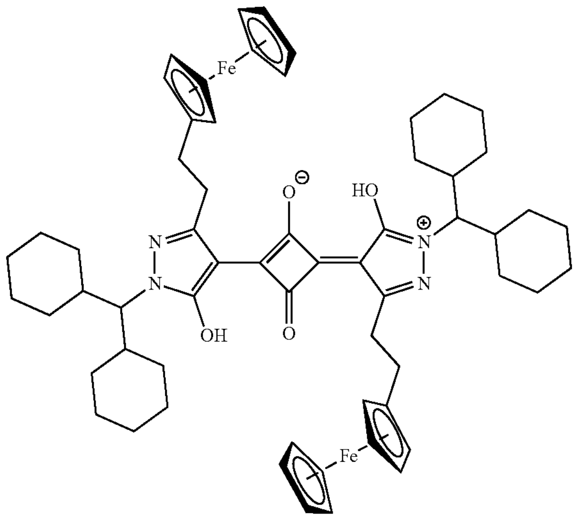

C-120

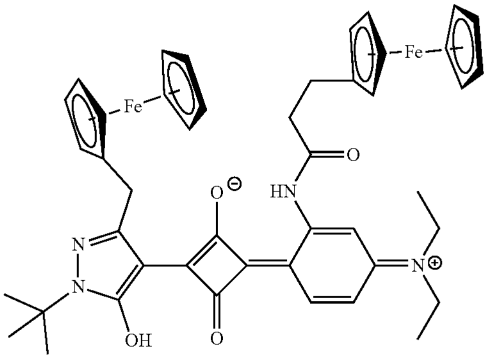

It is preferable that the absorption waveform of the dye C in the min absorption wavelength band is sharp from the viewpoint of brightness.

The main absorption wavelength band of the dye C in the wavelength selective absorption filter is preferably 580 to 600 nm.

The content of the dye A in the wavelength selective absorption filter according to the embodiment of the present invention is not particularly limited as long as the wavelength selective absorption filter according to the embodiment of the present invention exhibits a desired function of adjusting chromaticity, and it can be appropriately adjusted depending on the absorption waveform or molar absorption coefficient in the blue light wavelength range of the dye A. For example, the lower limit value thereof is preferably 0.01% by mass or more and more preferably 0.1% by mass or more. The upper limit value thereof is not particularly limited as long as the wavelength selective absorption filter according to the embodiment of the present invention exhibits a desired relative brightness and correlated color temperature; however, it is, for example, preferably 45% by mass or les and more preferably 30% by mass or less.

The content of the dye C in the wavelength selective absorption filter according to the embodiment of the present invention can be appropriately adjusted so that the wavelength selective absorption filter according to the embodiment of the present invention exhibits a desired correlated color temperature, in accordance with the content of the dye A in the wavelength selective absorption filter according to the embodiment of the present invention. For example, the lower limit value thereof is preferably 0.05% by mass or more and more preferably 0.2% by mass or more and the upper limit value thereof is preferably 50% by mass or less and more preferably 40% by mass or less.

The content proportions of dye A and dye C in the wavelength selective absorption filter according to the embodiment of the present invention are appropriately adjusted according to the kind of each dye, and in terms of the mass ratio (the dye C:the dye A), they are preferably 1:0.1 to 10 and more preferably 1:0.2 to S.

In a case where the dye C is the quencher-embedded coloring agent, it is preferable that the wavelength selective absorption filter according to the embodiment of the present invention contains 0.1% by mass or more of the content of the quencher-embedded coloring agent, in terms of the antireflection effect. The upper limit value thereof is preferably 45% by mass or less.

<Resin>

The resin contained in the wavelength selective absorption filter according to the embodiment of the present invention (hereinafter, also referred to as a "matrix resin") is not particularly limited as long as it can disperse (preferably dissolve) the dye and has the desired light transmittance (the light transmittance is preferably 80% or more in the visible range having a wavelength of 400 to 800 nm).

In a case where the dye C is a squarine-based coloring agent represented by General Formula (1), the matrix resin is preferably a low-polarity matrix resin by which the squarine-based coloring agent can exhibit sharper absorption. Since the squarine-based coloring agent exhibits sharper absorption, the wavelength selective absorption filter according to the embodiment of the present invention can further suppress the decrease in relative brightness. Here, the low polarity means that an fd value defined by Relational Expression I is preferably 0.50 or more.

$$fd=\delta d/(\delta d+\delta p+\delta h) \quad \text{Relational Expression I}$$

In Relational Expression I, δd, δp, and δh respectively indicate a term corresponding to a London dispersion force, a term corresponding to a dipole-dipole force, and a term corresponding to a hydrogen bonding force with respect to a solubility parameter δt calculated according to the Hoy method. A specific calculation method of fd will be described later That is, fd indicates a ratio of δd to the sum of δd, δp, and δt.

In a case where the fd value is set to 0.50 or more, a sharper absorption waveform can be easily obtained.

Further, in a case where the wavelength selective absorption filter according to the embodiment of the present invention contains two or more matrix resins, the fd value is calculated as follows.

$$fd=\Sigma(w_i \cdot fd_i)$$

Here, $w_i$ represents the mass fraction of the $_i$-th matrix resin, and $fd_i$ represents the fd value of the $_i$-th matrix resin.

—Term δd Corresponding to London Dispersion Force—

The term δd corresponding to the London dispersion force refers to δd obtained for the Amorphous Polymers described in the column "2) Method of Hoy (1985, 1989)" on pages 214 to 220 of the document "Properties of Polymers 3$^{rd}$, ELSEVIER, (1990)", and is calculated according to the description in the column of the document.

—Term δp corresponding to Dipole-Dipole Force—

The term δp corresponding to the dipole-dipole force refers to δp obtained for Amorphous Polymers described in the column "2) Method of Hoy (1985, 1989)" on pages 214 to 220 of the document "Properties of Polymers 3$^{rd}$, ELSEVIER, (1990)", and is calculated according to the description in the column of the document.

—Term δh Corresponding to Hydrogen Bonding Force—

The term δh corresponding to the hydrogen bonding force refers to δh obtained for the Amorphous Polymers described in the column "2) Method of Hoy (1985, 1989)" on pages 214 to 220 of the document "Properties of Polymers 3$^{rd}$, ELSEVIER, (1990)", and is calculated according to the description in the column of the document.

In addition, in a case where the matrix resin is a resin exhibiting a certain hydrophobicity, the moisture content of the wavelength selective absorption filter according to the embodiment of the present invention can be set to a low moisture content, for example, 0.5% or lower, and the light resistance of the wavelength selective absorption filter according to the embodiment of the present invention is improved, which is preferable.

The resin may contain any conventional component in addition to a polymer. However, the fd of the matrix ruin is a calculated value for the polymer constituting the matrix resin.

Preferred examples of the matrix resin include a polystyrene resin and a cyclic polyolefin resin, and the polystyrene resin is more preferable. In general, the fd value of the polystyrene resin is 0.45 to 0.60, and the fd value of the cyclic polyolefin resin is 0.45 to 0.70. As described above, it is preferable to se the resin having a fd value of 0.50 or more.

Further, for example, in addition to these preferable resins, it is also preferable to use a resin component, that imparts functionality to the wavelength selective absorption filter, such as an extensible resin component and a peelability control resin component, which will be described later. That is, in the present invention, the matrix resin is used in the meaning of including the extensible resin component and the peelability control resin component in addition to the above-described resins.

It is preferable that the matrix resin includes a polystyrene resin terms of sharpening the absorption waveform of the coloring agent.

(Polystyrene Resin)

The polystyrene contained in the polystyrene resin means a polymer containing a styrene component. The polystyrene preferably contains 50% by mass or more of the styrene component. The wavelength selective absorption filter according to the embodiment of the present invention may contain one kind of polystyrene or two or more kinds thereof. Here, the styrene component is a structural unit derived from a monomer having a styrene skeleton in the structure thereof.

The polystyrene more preferably contains 70% by mass or more of the styrene component, and still more preferably 85% by mass or more of the styrene component, in terms of controlling the photo-elastic coefficient and the hygroscopicity to values in ranges preferable for the wavelength selective absorption filter. It is also preferable that the polystyrene is composed of only a styrene component.

Among polystyrenes, examples of the polystyrene composed of only the styrene component include a homopolymer of a styrene compound and a copolymer of two or more kinds of styrene compounds. Here, the styrene compound is a compound having a styrene skeleton in the structure thereof and is meant to include, in addition to styrene, a compound in which a substituent is introduced within a range where an ethylenically unsaturated bond of styrene can act as a reactive (polymerizable) group.

Specific example of the styrene compound include the following styrenes: alkylstyrene such as α-methylstyrene, o-methylstyrene, m-methylstyrene, p-methylstyrene, 3,5-dimethylstyrene, 2,4-dimethylstyrene, o-ethylstyrene, p-ethylstyrene, and tert-butyl styrene; and substituted styrene having a hydroxyl group, an alkoxy group, a carboxy group, or a halogen atom introduced into the benzene nucleus of styrene, such as hydroxystyrene, tert-butoxy styrene, vinyl benzoic acid, o-chlorostyrene, and p-chlorostyrene. Among these, the polystyrene is preferably a homopolymer of stymie (that is, polystyrene) from the viewpoints of availability and material cost.

The constitutional component other than the styrene component that may be contained in the polystyrene is not particularly limited. That is, the polystyrene may be a styrene-diene copolymer, a styrene-polymerizable unsaturated carboxylic acid ester copolymer, or the like. In addition, it is also possible to use a mixture of polystyrene and synthetic rubber (for example, polybutadiene and polyisoprene). Further, high impact polystyrene (HIPS) obtained by subjecting styrene to graft polymerization with synthetic rubber is also preferable. Further, a polystyrene obtained by dispersing a rubber-like elastic body in a continuous phase of a polymer including a styrene component (for example, a copolymer of a styrene component and a (meth)acrylate ester component), and subjecting the copolymer to graft polymerization with a rubber-like elastic body (referred to as graft type high impact polystyrene "graft HIPS") is also preferable. Furthermore, a so-called styrene-based elastomer can also be sunitably used.

In addition, the polystyrene may be hydrogenated (may be a hydrogenated polystyrene). The hydrogenated polystyrene is not particularly limited, and it is preferably a hydrogenated styrene-diene-based copolymer such as a hydrogenated styrene-butadiene-styrene block copolymer (SEBS) obtained by hydrogenating a styrene-butadiene-styrene block copolymer (SBS) or hydrogenated styrene-isoprene-styrene block copolymer (SEPS) obtained by hydrogenating a styrene-isoprene-styrene block copolymer (SIS). Only one of these hydrogenated polystyrenes may be used, or two or more thereof may be used.

In addition, the polystyrene may be modified polystyrene. The modified polystyrene is not particularly limited, and examples thereof include polystyrene having a reactive group such as a polar group introduced therein. Specific examples thereof preferably include acid-modified polystyrene such a maleic acid-modified and epoxy-modified polystyrene.

As the polystyrene, a plurality of kinds of polystyrene resins having different compositions, molecular weights, and the like may be used in combination.

The polystyrene-based resin can be obtained using a conventional method such as anion, bulk, suspension, emulsification, or a solution polymerization method. In addition, in the polystyrene, at least a part of the unsaturated double bond of the benzene ring of the conjugated diene and the styrene monomer may be hydrogenated. The hydrogenation rate can be measured by a nuclear magnetic resonance apparatus (NMR).

As the polystyrene resin, a commercially available product may be used, and examples thereof include "CLEAREN 530L" and "CLEAREN 730L" manufactured by Denki Kagaku Kogyo Kabushiki Kaisha. "TUFPRENE 126S" and "ASAPRENE T411" manufactured by Asahi Kasai Corporation, "KRATON D1102A", "KRATON D1116A" manufactured by Kraton Polymers Japan Ltd., "STYROLUX S" and "STYROLUX T" manufactured by Styrolution Group, "ASAFLEX 840" and "ASAFLEX 860" manufactured by Asahi Kasei Chemicals Corporation (all are SBS), "679", "HF77", and "SGP-10" manufactured by PS Japan Corporation, "DIC STYRENE XC-515" and "DIC STYRENE XC-535" manufactured by DIC Corporation (all are GPPS), "475D", "H0103", and "HT478" manufactured by PS Japan Corporation, and "DIC STYRENE GH-8300-5" manufactured by DIC Corporation (all are HIPS). Examples of the hydrogenated polystyrene-based resin include "TUFTEC H series" manufactured by Asahi Kai Chemicals Corporation, "KRATON G series" manufactured by Shell Japan Ltd. (all are SEBS), "DYNARON" manufactured by JSR Corporation (hydrogenated styrene-butadiene random copolymer), and "SEPTON" manufactured by Kuraray Co., Ltd. (SEPS). Examples of the modified polystyrene-based resin include "TUFTEC M series" manufactured by Asahi Kasei Chemicals Corporation, "EPOFRIEND" manufactured by Daicel Corporation. "Polar Group Modified DYNARON" manufactured by JSR Corporation, aid "*RESEDA*" manufactured by ToaGosei Co., Ltd.

The wavelength selective absorption filter according to the embodiment of the present invention preferably contains a polyphenylene ether ruin addition to the polystyrene resin. By containing the polystyrene resin and the polyphenylene ether resin together, the toughness of the wavelength selective absorption filter can be improved, and the occurrence of defects such as cracks can be suppressed even in a harsh environment such as high temperature and high humidity.

However, in the calculation of the fd value described above, the fd value of the polyphenylene ether resin is not taken into consideration, in a case where the wavelength selective absorption filter according to the embodiment of the present invention contains a polyphenylene ether resin addition to the polystyrene resin.

As the polyphenylene ether resin, ZYLON S201A, ZYLON 202A, ZYLON S203A, and the like, manufactured by Asahi Kasai Corporation, can be preferably used. In addition, a resin which the polystyrene resin mid the polyphenylene ether resin are mixed in advance may also be used. As the mixed resin of the polystyrene resin and the polyphenylene ether resin, for example, ZYLON 1002H, ZYLON 1000H, ZYLON 600H, ZYLON 500H, ZYLON 400H, ZYLON 300H, ZYLON 200K, and the like manufactured by Asahi Kasei Corporation can be preferably used.

In a case where the polystyrene resin and the polyphenylene ether resin are contained in the wavelength selective absorption filter according to the embodiment of the present invention, the mass ratio of both resins is preferably 99/1 to 50/50, more preferably 98/2 to 60/40, and still more preferably 95/5 to 70/30, in terms of the polystyrene resin/polyphenylene ether resin. In a case where the formulation ratio of the polyphenylene ether resin is set within the above-described preferred rage, the wavelength selective absorption filter can have sufficient toughness, and a solvent can be properly volatilized in a case where a film formation is carried out with a solution.

(Cyclic Polyolefin Resin)

The cyclic olefin compound that forms the cyclic polyolefin contained in the cyclic polyolefin resin is not particularly limited as long as the compound has a ring structure including a carbon-carbon double bond, and examples thereof include a norbornene compound and a monocyclic olefin compound, a cyclic conjugated diene compound, and a vinyl dicyclic hydrocarbon compound, which are not the norbornene compound.

Examples of the cyclic polyolefin include (1) polymers including a structural unit derived from a norbornene compound; (2) polymers including a structural unit derived from a monocyclic olefin compound other than the norbornene compound; (3) polymers including a structural unit derived from a cyclic conjugated diene compound; (4) polymers including a structural unit derived from a vinyl alicyclic hydrocarbon compound; and hydrides of polymers including a structural unit derived from each of the compounds (1) to (4).

In the present invention, ring-opening polymers of the respective compounds are included in the polymers including a structural unit derived from a norbornene compound and the polymers including a structural unit derived from a monocyclic olefin compound.

The cyclic polyolefin is not particularly limited; however, it is preferably a polymer having a structural unit derived from a norbornene compound, which is represented by General Formula (A-II) or (A-III). The polymer having the structural unit represented by General Formula (A-II) is an addition polymer of a norbornene compound, and the polymer having the structural unit represented by General Formula (A-III) is a ring-opening polymer of a norbornene compound.

General Formula (A-II)

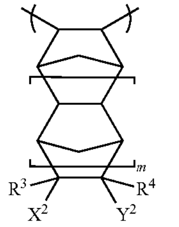

General Formula (A-III)

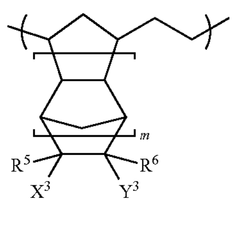

In General Formulae (A-II) and (A-III), an is an integer of 0 to 4, and preferably 0 or 1.

In General Formulae (A-II) and (A-III), $R^3$ to $R^6$ each independently represent a hydrogen atom or a hydrocarbon group having 1 to 10 carbon atoms.

The hydrocarbon group in General Formulae (A-I) to (A-II) is not particularly limited a long a the hydrocarbon group is a group consisting of a carbon atom and a hydrogen atom, and examples thereof include an alkyl group, an alkenyl group, an alkynyl group, and an aryl group (an aromatic hydrocarbon group). Among these, an alkyl group or an aryl group is preferable.

In General Formula (A-II) or (A-III), $X^2$ and $X^3$, and $Y^2$ and $Y^3$ each independently represent a hydrogen atom, a hydrocarbon group having 1 to 10 carbon atoms, a halogen atom, a hydrocarbon group having 1 to 10 carbon atoms, which is substituted with a halogen atom, $—(CH_2)_nCOOR^{11}$, $—(CH_2)_nOCOR^{12}$, $—(CH_2)_nNCO$, $—(CH_2)_nNO_2$, $—(CH_2)_nCN$, $—(CH_2)_nCONR^{13}R^{14}$, $—(CH_2)_nNR^{13}R^{14}$, $—(CH_2)_nOZ$ or $—(CH_2)_nW$, or $(—CO)_2O$ or $(—CO)_2NR^{15}$ which is formed by $X^2$ and $Y^2$ or $X^3$ and $Y^3$ being bonded to each other.

Here. $R^{11}$ to $R^{15}$ each independently represent a hydrogen atom or a hydrocarbon group having 1 to 20 carbon atoms, Z represents a hydrocarbon group or a hydrocarbon group substituted with halogen, W represents $Si(R^{16})_pD_{(3-p)}$ ($R^{16}$ represents a hydrocarbon group having 1 to 10 carbon atoms, D represents a halogen atom, $—OCOR^{17}$, or $—OR^{17}$ ($R^{17}$ represents a hydrocarbon group having 1 to 10 carbon atoms), and p is an integer of 0 to 3). n is an integer of 0 to 10, preferably 0 to 8, and more preferably 0 to 6.

In General Formulae (A-II) and (A-III), $R^3$ to $R^6$ are each preferably a hydrogen atom or $—CH_3$, and, in terms of moisture permeability, more preferably a hydrogen atom.

$X^2$ and $X^3$ are each preferably a hydrogen atom. $—CH_3$, or $—C_2H_5$ and, in terms of moisture permeability, more preferably a hydrogen atom.

$Y^2$ and $Y^3$ are each preferably a hydrogen atom, a halogen atom (particularly a chlorine atom), or $—(CH_2)_nCOOR^{11}$ (particularly $—COOCH_3$) and, in terms of moisture permeability, more preferably a hydrogen atom.

Other groups are appropriately selected.

The polymer having the structural unit represented by General Formula (A-II) or (A-III) may further include at least one or more structural units represented by General Formula (A-I).

General Formula (A-I)

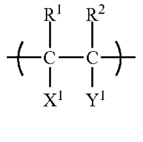

In General Formula (A-I), $R^1$ and $R^2$ each independently represent a hydrogen atom or a hydrocarbon group having 1 to 10 carbon atoms, and $X^1$ and $Y^1$ each independently represent a hydrogen atom, a hydrocarbon group having 1 to 10 carbon atoms, a halogen atom, a hydrocarbon group having 1 to 10 carbon atoms, which is substituted with a halogen atom, $—(CH_2)_nCOOR^{11}$, $—(CH_2)_nOCOR^{12}$, $—(CH_2)_nNCO$, $—(CH_2)_nNO_2$, $—(CH_2)_nCN$, $—(CH_2)_nCONR^{13}R^{14}$, $—(CH_2)_nNR^{13}R^{14}$, $—(CH_2)_nOZ$, $—(CH_2)_nW$, or $(—CO)_2O$ or $(—CO)_2NR^{15}$ which is formed by $X^1$ and $Y^1$ being bonded to each other.

Here, $R^{11}$ to $R^{15}$ each independently represent a hydrogen atom or a hydrocarbon group having 1 to 20 carbon atoms, Z represents a hydrocarbon group or a hydrocarbon group substituted with halogen, W represents $Si(R^{16})_pD_{(3-p)}$ ($R^{16}$ represents a hydrocarbon group having 1 to 10 carbon atoms, D represents a halogen atom, —$OCOR^{17}$, or —$OR^{17}$ ($R^{17}$ represents a hydrocarbon group having 1 to 10 carbon atoms), and p is an integer of 0 to 3). n is an integer of 0 to 10.

From the viewpoint of adhesiveness, the content of the structural unit derived from a norbomene compound in the cyclic polyolefin having the structural unit represented by General Formula (A-II) or (A-Ill) is preferably 90% by mass or less, more preferably 30% to 85% by mass, still more preferably 50% to 79% by mass, and most preferably 60% to 75% by mass with respect to the total mass of the cyclic polyolefin. Here, the proportion of the structural unit derived from a norbomene compound represents the average value in the cyclic polyolefin.

The addition (co)polymer of a norbomene compound is described in JP1998-7732A (JP-H10-7732A), JP2002-504184A, US2004/229157A1A, and WO2004/070463A.

The polymer of a norbomene compound is obtained by the addition polymerization of norbomene compounds (for example, polycyclic unsaturated compounds of norbomene).

In addition, as the polymer of a norbomene compound, copolymers obtained by the addition copolymerization of, as necessary, a norbomene compound, olefin such as ethylene, propylene, and butene, conjugated diene such as butadiene and isoprene, unconjugated diene such as ethylidene norbomene, and an ethylenically unsaturated compound such as acrylonitrile, acrylic acid, methacrylic acid, maleic acid anhydride, acrylic acid ester, methacrylic acid ester, maleimide, vinyl acetate, and vinyl chloride are exemplified. Among these, a copolymer of a norbomene compound and ethylene is preferable.

Examples of the addition (co)polymers of a norbomene compound include APL8008T (Tg: 70° C.), APL6011T (Tg: 105° C.), APL6013T (Tg: 125° C.), and APL6015T (Tg: 145° C.), which are on the market by Mitsui Chemicals, Inc. under a product name of APEL and have mutually different glass transition temperatures (Tg). In addition, pellets such as TOPAS8007, TOPAS6013, and TOPAS6015 are commercially available from Polyplastics Co., Ltd. Further, Appear 3000 is commercially available from Film Ferrania S. R. L.

As the polymer of a norbomene compound, a commercially available product can be used. For example, it is commercially available from JSR Corporation under a product name of Anon G or Anon F, and it is also commercially available from Zeon Corporation under a product name of Zeonor ZF14, ZF16, Zeonex 250, or Zeonex 280.

The hydride of a polymer of a norbomene compound can be synthesized by the addition polymerization or the metathesis ring-opening polymerization of a norbomene compound or the like and then the addition of hydrogen. The synthesis method is described in, for example, JP1989-240517A (JP-H1-240517A), JP1995-196736A (JP-H7-196736A), JP1985-26024A (JP-S60-26024A), JP1987-19801 A (JP-S62-19801 A), JP2003-159767A, and JP2004-309979A.

The molecular weight of the cyclic polyolefin is appropriately selected depending on the intended use, and it is a mass average molecular weight measured in terms of polyisoprene or polystyrene by the gel permeation chromatography of a cyclohexane solution (a toluene solution in a case where the polymer is not dissolved). In general, it is 5,000 to 500,000, preferably 8.000 to 200,000, and more preferably 10,000 to 100,000. A polymer having a molecular weight in the above-described range is capable of satisfying both the mechanical strength of a molded body and the molding workability of compacts at a high level in a well-balanced manner.

In the wavelength selective absorption filter according to the embodiment of the present invention, the content of the matrix resin is preferably 5% by mass or more, more preferably 20% by mass or more, still more preferably 50% by mass or more, and particularly preferably 70% by mass or more.

The content of the matrix resin the wavelength selective absorption filter according to the embodiment of the present invention is usually 99.90% by mass or less, and preferably 99.85% by mass or less.

The cyclic polyolefin contained in the wavelength selective absorption filter according to the embodiment of the present invention may be two or more kinds, and polymers having different at least one of a compositional ratio or a molecular weight may be used in combination. In this case, the total content of the respective polymers is in the above range.

(Extensible Resin Component)

The wavelength selective absorption filter according to the embodiment of the present invention can appropriately select and contain a component exhibiting extensibility (also referred to as an extensible resin component) as a resin component. Specific examples thereof include an acrylonitrile-butadiene-styrene resin (an ABS resin), a styrene-butadiene resin (an SB resin), an isoprene resin, a butadiene resin, a polyether-urethane resin, and a silicone resin. Further, these resins may be further hydrogenated as appropriate.

As the extensible resin component, it is preferable to use an ABS resin or an SB resin, and it is more preferable to use an SB resin.

As the SB resin, for example, a commercially available one can be used. Examples of such commercially available products include TR2000, TR2003, and TR2250 (all, product name, manufactured by JSR Corporation); CLEAREN 210M, 220M, and 730V (all, product name, manufactured by Denka Corporation); ASAFLEX 800S, 805, 810, 825, 830, and 840 (all, product name, manufactured by Asahi Kasei Corporation); and EPOREX SB2400, SB2610, and SB2710 (all, product name, Sumitomo Chemical Co., Ltd.).

The wavelength selective absorption filter according to the embodiment of the present invention preferably contains an extensible resin component in the matrix resin an amount of 15% to 95% by mass, more preferably 20% to 50% by mass, and still more preferably 25% to 45% by mass.

The extensible resin component is preferably an extensible resin component having a breaking elongation of 10% or more and more preferably an extensible resin component having a breaking elongation of 20% or more, in a case where a sample having a form with a thickness of 30 μm and a width of 10 mm is produced by using the extensible resin component alone and the breaking elongation at 25° C. is measured in accordance with JIS 7127.

(Peelability Control Resin Component)

The wavelength selective absorption filter according to the embodiment of the present invention can contain, as a resin component, a component that controls the peelability (a peelability control resin component) in a case of being produced according to a method including a step of peeling the wavelength selective absorption filter according to the embodiment of the present invention from a release film, among the manufacturing methods for the wavelength selective absorption filter according to the embodiment of the present invention described later, which is preferable. In a case of controlling the peelability of the wavelength selective absorption filter according to the embodiment of the present invention from the release film, it is possible to prevent a peeling mark from being left on the wavelength selective absorption filter according to the embodiment of the present invention after peeling, and it is possible to cope with various processing speeds in the peeling step. As a result, a preferred effect can be obtained for improving the quality and productivity of the wavelength selective absorption filter according to the embodiment of the present invention.

The peelability control resin component is not particularly limited and can be appropriately selected depending on the kind of the release film. In a case where a polyester-based polymer film is used as the release film as described later, for example, a polyester resin (also referred to as a polyester-based additive) is suitable as the peelability control resin component.

The polyester-based additive can be obtained by a conventional method such as a dehydration condensation reaction of a polyhydric basic acid and a polyhydric alcohol and an addition of a dibasic anhydride to a polyhydric alcohol and a dehydration condensation reaction, and a polycondensation ester formed from a dibasic acid and a diol is preferable.

The mass average molecular weight (Mw) of the polyester-based additive is preferably 500 to 50,000, more preferably 750 to 40,000, and still more preferably 2,000 to 30,000.

In a case where the mass average molecular weight of the polyester-based additive is equal to or larger than the above-described preferred lower limit value, it is preferable from the viewpoint of brittleness and moisture-heat resistance, and in a case where the mass average molecular weight thereof is equal to or smaller than the above-described preferred upper limit value, it is preferable from the viewpoint of compatibility with the resin.

The mass average molecular weight of the polyester-based additive is a value of the mass average molecular weight (Mw) in terms of standard polystyrene measured under the following conditions. The molecular weight distribution (Mw/Mn) can also be measured under the same conditions. Mn is a number average molecular weight in terms of standard polystyrene.

GPC: Gel permeation chromatograph device (HLC-8220GPC manufactured by Tosoh Corporation,
column: Guard column HXL-H manufactured by Tosoh Corporation, where TSK gel G7000HXL, TSK gel GMHXL 2 pieces, and TSK gel G2000HXL are connected in sequence,
eluent: tetrahydrofuran,
flow velocity: 1 mL/min,
sample concentration: 0.7% to 0.8% by mass,
sample injection volume: 70 μL,
measurement temperature: 40° C.,
detector: differential refractometer (RI) meter (40° C.), and
standard substance: TSK standard polystyrene manufactured by Tosoh Corporation)

Preferred examples of the dibasic acid component constituting the polyester-based additive include dicarboxylic acid.

Examples of the dicarboxylic acid include an aliphatic dicarboxylic acid and an aromatic dicarboxylic acid. An aromatic dicarboxylic acid or a mixture of an aromatic dicarboxylic acid and an aliphatic dicarboxylic acid can be preferably used.

Among the aromatic dicarboxylic acids, an aromatic dicarboxylic acid having 8 to 20 carbon atoms is preferable, and an aromatic dicarboxylic acid having 8 to 14 carbon atoms is more preferable. Specifically, preferred examples thereof include at least one of phthalic acid, isophthalic acid, or terephthalic acid.

Among the aliphatic dicarboxylic acids, an aliphatic dicarboxylic acid having 3 to 8 carbon atoms is preferable, and an aliphatic dicarboxylic acid having 4 to 6 carbon atoms is more preferable. Specifically, preferred examples thereof include at least one of succinic acid, maleic acid, adipic acid, or glutaric acid, and at least one of succinic acid or adipic acid is more preferable.

Examples of the diol component constituting the polyester-based additive include an aliphatic diol and an aromatic diol, and aliphatic diol is preferable.

Among the aliphatic diols, an aliphatic diol having 2 to 4 carbon atoms is preferable, and an aliphatic diol having 2 to 3 carbon atoms is more preferable.

Examples of the aliphatic diol include ethylene glycol, diethylene glycol, 1,2-propylene glycol, 1,3-propylene glycol, 1,3-butylene glycol, and 1,4-butylene glycol. These aliphatic diols can be used alone, or two or more kinds thereof can be used in combination.

The polyester-based additive is particularly preferably a compound obtained by fusing at least one of phthalic acid, isophthalic acid, or terephthalic acid with an aliphatic diol.

The terminal of the polyester-based additive may be sealed by reacting with a monocarboxylic acid. The monocarboxylic acid that is used for sealing is preferably an aliphatic monocarboxylic acid. Preferred examples thereof include acetic acid, propionic acid, butanoic acid, benzoic acid, and a derivative thereof, where acetic acid or propionic acid is more preferable and acetic acid is still more preferable.

Examples of the commercially available polyester-based additive include ester-based resin polyesters manufactured by Nippon Synthetic Chemical Industry Co., Ltd. (for example, LP050, TP290, LP035, LP033, TP217, and TP220) and ester-based resins Byron manufactured by Toyobo Co., Ltd. (for example, Byron 245, Byron GK890, Byron 103, Byron 200, and Byron 550, and Byron GK880).

The content of the peelability control resin component in the wavelength selective absorption filter according to the embodiment of the present invention is preferably 0.05% by mass or more, and more preferably 0.1% by mass or more in the matrix resin. In addition, the upper limit value thereof is preferably 25% by mass or less, more preferably 20% by mass or less, and still more preferably 15% by mass or less. From the viewpoint of obtaining proper adhesiveness, the above-described preferred range is preferable.

<Antifading Agent>

The wavelength selective absorption filter according to the embodiment of the present invention preferably contains an antifading agent for a dye (simply, also referred to as an antifading agent) in order to prevent the fading of the above-described dye A and dye C.

As the antifading agent, it is possible to use commonly used antifading agents without particular limitation, such as the antioxidants described in paragraphs [0143] to [0165] of WO2015/005398A, the radical scavengers described in paragraphs [0166] to [0199] of WO2015/005398A, and the deterioration preventing agents described in paragraphs [0205] to [0206] of WO2015/005398A.

The compound represented by General Formula (IV) below can be preferably used as the antifading agent.

General Formula (IV)

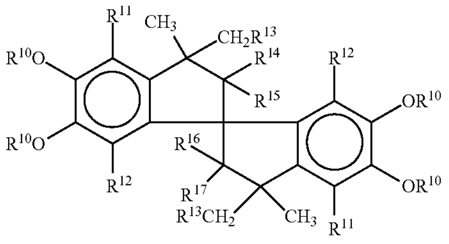

In General Formula (IV), $R^{10}$ represents an alkyl group, an alkenyl group, an aryl group, a heterocyclic group, or a group represented by $R^{18}CO$—, $R^{19}SO_2$— or $R^{20}NHCO$—. Here, $R^{18}$, $R^{19}$, and $R^{20}$ each independently represent an alkyl group, an alkenyl group, an aryl group, or a heterocyclic group. $R^{11}$ and $R^{12}$ each independently represent a hydrogen atom, a halogen atom, an alkyl group, an alkenyl group, an alkoxy group, or an alkenyloxy group, and $R^{13}$, $R^{14}$, $R^{15}$, $R^{16}$, and $R^{17}$ each independently represent a hydrogen atom, an alkyl group, an alkenyl group, or an aryl group.

However, the alkyl group in $R^{10}$ to $R_{20}$ includes an aralkyl group.

Examples of the alkyl group represented by $R^{10}$ in General Formula (IV) include methyl, ethyl, propyl, and benzyl; examples of the alkenyl group include allyl: examples of the aryl group include phenyl; and examples of the heterocyclic group include tetrahydropyranyl and pyrimidyl. $R^{18}$, $R^{19}$, and $R^{20}$ each independently represent an alkyl group (for example, methyl, ethyl, n-propyl, n-butyl, or benzyl), an alkenyl group (for example, allyl), an aryl group (for example, phenyl, or methoxyphenyl), or a heterocyclic group (for example, pyridyl, or pyrimidyl).

Examples of the halogen atom represented by $R^{11}$ and $R^{12}$ in General Formula (TV) include chlorine and bromine; examples of the alkyl group include methyl, ethyl, n-butyl, and benzyl; examples of the alkenyl group include allyl; examples of the alkoxy group include methoxy, ethoxy, and benzyloxy; and examples of the alkenyloxy group include 2-propenyloxy.

Examples of the alkyl group represented by $R^{13}$, $R^{14}$, $R^{15}$, $R^{16}$, or $R^{17}$ in General Formula (IV) include methyl, ethyl, n-butyl, and benzyl; examples of the alkenyl group include 2-propenyl: and examples of the aryl group include phenyl, methoxyphenyl, and chlorophenyl.

$R^{10}$ to $R^{20}$ may further have a substituent, and examples of the substituent include each group represented by $R^{10}$ to $R^{20}$.

Specific examples of the compound represented by General Formula (IV) are shown below. However, the present invention is not limited thereto.

General Formula (IV)

IV-1

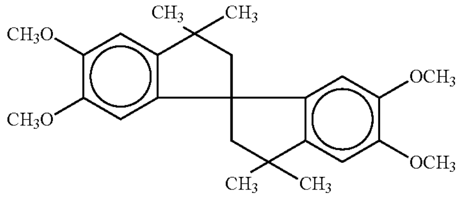

IV-2

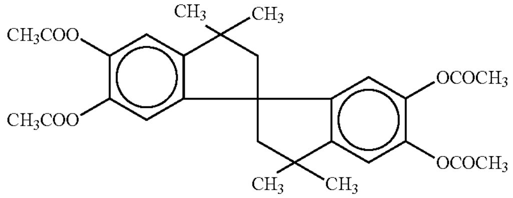

IV-3

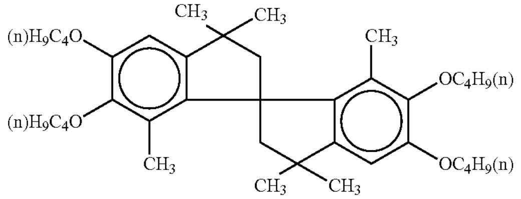

IV-4

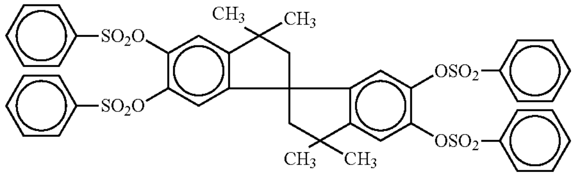

IV-5

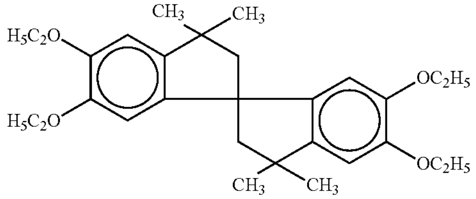

IV-7

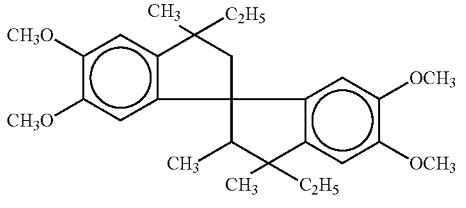

IV-7

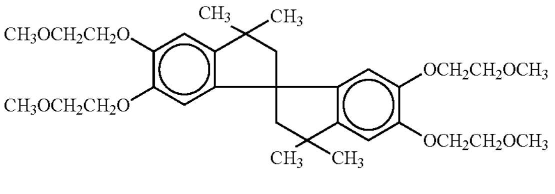

-continued

IV-8

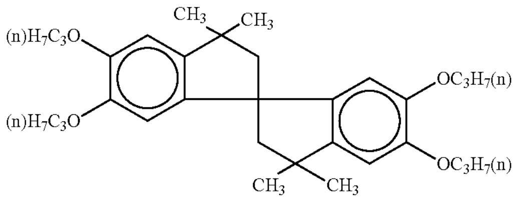

IV-9

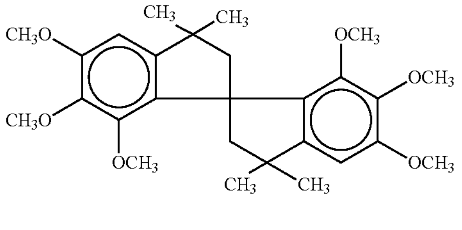

As the antifading agent, the compound represented by General Formula [III] can also be preferably used.

General Formula (III)

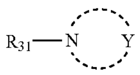

In General Formula [111], $R^{31}$ represents an aliphatic group or an aromatic group, and Y represents a non-metal atomic group necessary for forming a 5- to 7-membered ring with a nitrogen atom.

Next, in General Formula [III], $R^{31}$ represents an aliphatic group or an aromatic group, and is preferably an alkyl group, an aryl group, or a heterocyclic group (preferably, an aliphatic heterocyclic group), and more preferably an aryl group.

Examples of the heterocyclic ring formed by Y together with the nitrogen atom include a piperidine ring, a piperazine ring, a morpholine ring, a thiomorpholine ring, a thiomorpholine-1,1-dione ring, a pyrrolidine ring, and an imidazolidine ring.

In addition, the heterocyclic ring may further have a substituent, and examples of the substituent include an alkyl group and an alkoxy group.

Specific examples of the compound represented by General Formula [III] are shown below. However, the present invention is not limited thereto.

III - 1

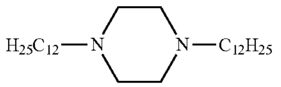

III - 2

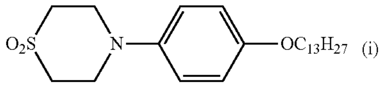

III - 3

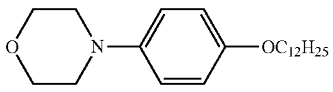

III - 4

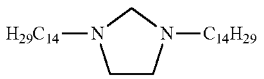

-continued

III - 5

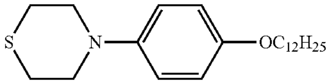

In addition to the above specific examples, specific examples of the compound represented by General Formula [III] above include exemplary compounds B-1 to B-65 described on pages 8 to 11 of JP2004-167543A (JP-H2-167543A), and exemplary compounds (1) to (120) described on pages 4 to 7 of JP1988-95439A (JP-S63-95439A).

The content of the antifading agent in the wavelength selective absorption filter according to the embodiment of the present invention is preferably 1% to 15% by mass, more preferably 5% to 15% by mass, still more preferably 5% to 12.5% by mass, and particularly preferably 10% to 12.5% by mass.

In a case where the antifading agent is contained within the above-described preferred range, the wavelength selective absorption filter according to the embodiment of the present invention can improve the light resistance of the dye (the coloring agent) without causing side effects such as discoloration of the wavelength selective absorption layer.

<Other Components>

In addition to the dye, the matrix resin, and the antifading agent for a dye described above, the wavelength selective absorption filter according to the embodiment of the present invention may contain a matting agent, a leveling agent (a surfactant).

(Matting Agent)

In order to impart sliding properties and prevent blocking, fine particles may be added on the surface of the wavelength selective absorption filter according to the embodiment of the present invention, as long as the effects of the present invention are not impaired. As the fine particles, silica (silicon dioxide, $SiO_2$) of which the surface is coated with a hydrophobic group and which has an aspect of secondary particles is preferably used. As the fine particles, in addition to or instead of silica, fine particles of titanium dioxide, aluminum oxide, zirconium oxide, calcium carbonate, talc, clay, calcined kaolin, calcined calcium silicate, hydrated calcium silicate, aluminum silicate, magnesium silicate, and calcium phosphate may be used. Examples of the commercially available product of the fine particles include the R972 or NX90S (product name, both manufactured by Nippon Aerosil Co., Ltd.).

The fine particles function as a so-called matting agent, and the addition of the fine particles forms minute unevenness on the surface of the wavelength selective absorption filter according to the embodiment of the present invention. Due to the unevenness, even in a case where the wavelength selective absorption filters according to the embodiment of the present invention overlap each other or the wavelength selective absorption filter according to the embodiment of the present invention and other films overlap each other, the films do not stick to each other and sliding properties are secured.

In a case where the wavelength selective absorption filter according to the embodiment of the present invention contains a matting agent as fine particles, and in the fine irregularities due to the protrusions in which fine particles protrude from the filter surface, there are $10^4$/mm$^2$ or more of protrusions having a height of 30 nm or more, the effect of improving sliding properties and blocking properties is particularly large.

It is preferable to apply the matting agent fine particles particularly onto the surface layer in order to improve the blocking properties and the sliding properties. Examples of the method of applying fine particles onto the surface layer include methods such as multilayer casting and coating.

The content of the matting agent in the wavelength selective absorption filter according to the embodiment of the present invention is appropriately adjusted depending on the intended purpose.

However, in a case where a gas barrier layer described later is provided in the wavelength selective absorption filter according to the embodiment of the present invention, the above-described matting agent fine particles are preferably applied onto the surface of the wavelength selective absorption filter in contact with the gas barrier layer: as long as the gas barrier properties are not impaired.

(Leveling Agent)

A leveling agent (a surfactant) can be appropriately mixed with the wavelength selective absorption filter according to the embodiment of the present invention. As the leveling agent, a commonly used compound can be used, and a fluorine-containing surfactant is particularly preferable. Specific examples thereof include the compounds described in paragraphs [(028] to [0056] of JP2001-330725A.

The content of the leveling agent in the wavelength selective absorption filter according to the embodiment of the present invention is appropriately adjusted depending on the intended purpose.

The wavelength selective absorption filter according to the embodiment of the present invention may contain, in addition to the above components, a low-molecular plasticizer, an oligomer-based plasticizer, a retardation modifier, an ultraviolet absorbing agent, a deterioration preventing agent, a peeling accelerating agent, an infrared absorbing agent, an antioxidant, a filler, a compatibilizer.

<Manufacturing Method for Wavelength Selective Absorption Filter>

The wavelength selective absorption filter can be produced by a solution film forming method, a melt extrusion method, or a method of forming a coating layer on a base material film (a release film) (a coating method) according to any method, according to a conventional method, and stretching can also be appropriately combined. The wavelength selective absorption filter according to the embodiment of the present invention is preferably produced by a coating method.

(Solution Film Forming Method)

In the solution film forming method, a solution in which a material constituting the wavelength selective absorption filter according to the embodiment of the present invention is dissolved in an organic solvent or water is prepared, a concentration step, a filtration step, and the like are appropriately carried out, and then the solution is uniformly cast on a support. Next, the raw dry film is peeled off from the support, both ends of a web are appropriately held by clips or the like, and the solvent is dried in the drying zone. In addition, stretching can be carried out separately while or after the film is dried.

(Melt Extrusion Method)

In the melt extrusion method, a material constituting the wavelength selective absorption filter according to the embodiment of the present invention (hereinafter, also simply referred to as a "material of the wavelength selective absorption filter") is melted by heat, a filtration step or the like is appropriately carried out, and then the material is uniformly casted on a support. Next, a film solidified by cooling or the like can be peeled off and appropriately stretched. In a case where the main material of the wavelength selective absorption filter according to the embodiment of the present invention is a thermoplastic polymer resin, a thermoplastic polymer resin can be selected as the main material of the release film, and the polymer resin a molten state can be formed into a film by a known co-extrusion method. In this case, by adjusting the kind of polymer of the wavelength selective absorption filter according to the embodiment of the present invention and the release film and the additives mixed in each layer, or by adjusting the stretching temperature, the stretching speed, the stretching ratio, and the like of the co-extruded film, the adhesive force between the wavelength selective absorption filter according to the embodiment of the present invention and the release film can be controlled.

Examples of the co-extrusion method include a co-extrusion T die method, a co-extrusion inflation method, and a co-extrusion lamination method. Among these, the co-extrusion T die method is preferable. The co-extrusion T die method includes a feed block method and a multi-manifold method. Among these, the multi-manifold method is particularly preferable from the viewpoint that a variation in thickness can be reduced.

In a case where the co-extrusion T die method is adopted, the melting temperature of the resin an extruder having a T-die is set to be a temperature higher than the glass transition temperature (Tg) of each resin by preferably 80° C. or higher and more preferably 100° C. or higher, and it is set to be a temperature higher than the glass transition temperature (Tg) of each resin by preferably 180° C. or lower and more preferably 150° C. or lower. In a case where the melting temperature of the resin the extruder is set to be equal to or larger than the lower limit value of the above-described preferred range, the fluidity of the resin can be sufficiently enhanced, and in a case where the melting temperature is set to the upper limit value or less of the above-described preferred range, the resin can be prevented from being deteriorated.

In general, the sheet-shaped molten resin extruded from the opening portion of the die is brought into close contact with the cooling drum. The method of bringing the molten resin into close contact with the cooling drum is not particularly limited, and examples thereof include an air knife method, a vacuum box method, and an electrostatic contact method.

The number of cooling drums is not particularly limited; however, it is generally 2 or more. In addition, the method of disposing the cooling drum is not particularly limited, and examples of the disposition form include a linear form, a Z form, and an L form. Further, the method of passing the molten resin extruded from the opening portion of the die through the cooling drum is not particularly limited.

The degree of close contact of the extruded sheet-shaped resin with the cooling drum changes depending on the temperature of the cooling drum. In a case where the temperature of the cooling drum is raised, the intimate attachment is improved, but in a case where the temperature is raised too much, the sheet-shaped resin may not be peeled off from the cooling drum and may be wound around the drum. Therefore, the temperature of the cooling drum is preferably (Tg+30°) C. or lower, and still more preferably in a range of (Tg−5°) C. to (Tg−45°) C. in a case where Tg is the glass transition temperature of the resin of the layer that is brought into contact with the drum in the resin extruded from the die. In a case where the cooling drum temperature is set within the above-described preferred range, problems such as sliding and scratches can be prevented.

Here, it is preferable to reduce the content of the residual solvent in the film before stretching. Examples of the method of reducing the content include methods of (1) reducing the amount of the residual solvent of the resin as the raw material: and (2) predrying the resin before forming the film before stretching. Predrying is carried out, for example, by making the resin into a form of a pellet or the like and using a hot air dryer or the like. The drying temperature is preferably 100° C. or higher, and the drying time is preferably 2 hours or longer. In a case of carrying out predrying, it is possible to reduce the residual solvent in the film before stretching and to prevent the extruded sheet-shaped resin from foaming.

(Coating Method)

In the coating method, a solution of a material of the wavelength selective absorption filter is applied to a release film to form a coating layer. A release agent or the like may be appropriately applied to the surface of the release film in advance in order to control the adhesiveness to the coating layer. The coating layer can be used by peeling off the release film after being laminated with another member while interposing an adhesive layer in a later step. Any adhesive can be appropriately used as the adhesive constituting the adhesive layer. The release film can be appropriately stretched together with the release film coated with the solution of the material of the wavelength selective absorption filter or with the coating layer laminated.

The solvent that is used for the solution of the wavelength selective absorption filter material can be appropriately selected from the viewpoints that the wavelength selective absorption filter material can be dissolved or dispersed, a uniform surface shape can be easily achieved during the coating step and drying step, liquid storability can be secured, and a proper saturated vapor pressure is provided.

—Addition of Dye (Coloring Agent) and Antifading Agent—

The timing of adding the dye to the wavelength selective absorption filter material is not particularly limited as long as the dye and the antifading agent are added at the time of film formation. For example, the dye may be added at the time of synthesizing the matrix resin or may be mixed with the wavelength selective absorption filter material at the time of preparing the coating liquid for the wavelength selective absorption filter material. In addition, the same applies to other components that may be contained in the wavelength selective absorption filter, such as the antifading agent.

—Release Film—

The release film that is used for forming the wavelength selective absorption filter according to the embodiment of the present invention by a coating method or the like preferably has a film thickness of 5 to 100 μm, more preferably 10 to 75 μm, and still more preferably 15 to 55 μm. In a case where the film thickness is equal to or larger than the above-described preferred lower limit value, sufficient mechanical strength can be easily secured, and failures such as curling, wrinkling, and buckling are less likely to occur. In addition, in a case where the film thickness is equal to or smaller than the above-described preferred upper limit value, in the storage of a multi-layer film of the release film and the wavelength selective absorption filter according to the embodiment of the present invention, for example, in the form of a long roll, the surface pressure applied to the multi-layer film is easily adjusted to be in an appropriate range, and adhesion defect is less likely to occur.

The surface energy of the release film is not particularly limited, and in a case of adjusting the relationship between the surface energy of the material of the wavelength selective absorption filter or coating solution and the surface energy of the surface of the release film on which the wavelength selective absorption filter according to the embodiment of the present invention is to be formed, it is possible to adjust the adhesive force between the wavelength selective absorption filter according to the embodiment of the present invention and the release film. In a case where the surface energy difference is reduced, the adhesive force tends to increase, and in a case where the surface energy difference is increased, the adhesive force tends to decrease, and thus the surface energy can be set appropriately.

The surface energy of the release film can be calculated from the contact angle value between water and methylene iodide using the Owen's method. For the measurement of the contact angle, for example, DM901 (contact angle meter, manufactured by Kyowa Interface Science Co., Ltd.) can be used.

The surface energy of the surface of the release film on which the wavelength selective absorption filter according to the embodiment of the present invention is to be formed is preferably 41.0 to 48.0 mN/m and more preferably 42.0 to 48.0 mN/m. In a case where the surface energy is equal to or larger than the above-described preferred lower limit value, the evenness of the thickness of the wavelength selective absorption filter according to the embodiment of the present invention is increased. In a case where the surface energy is equal to or smaller than the above-described preferred upper limit value, it is easy to control the peeling force of the wavelength selective absorption filter according to the embodiment of the present invention from the release film within an appropriate range.

The surface unevenness of the release film is not particularly limited. However, the surface unevenness of the release film can be adjusted in response to the relationship between the surface energy, hardness, and surface unevenness of the surface of the wavelength selective absorption filter according to the embodiment of the present invention, and the surface energy and hardness of the surface of the release film opposite to the side on which the wavelength selective absorption filter according to the embodiment of the present invention is formed, for example, in order to prevent adhesion defect in a case where the multi-layer film of the release film and the wavelength selective absorption filter according to the embodiment of the present invention is stored in the form of a long roll. In a case where the surface unevenness is increased, adhesion defect tends to be suppressed, and in a case where the surface unevenness is reduced, the surface unevenness of the wavelength selective absorption filter according to the embodiment of the present invention tends to be decreased and the haze of the wavelength selective absorption filter according to the embodiment of the present invention tends to be small. Thus, the surface unevenness can be set appropriately.

For such a release film, any material and film can be appropriately used. Specific examples of the material include a polyester-based polymer (including polyethylene terephthalate-based film), an olefin-based polymer, a cycloolefin-based polymer, a (meth)acrylic polymer, a cellulose-based polymer, and a polyamide-based polymer. In addition, a surface treatment can be appropriately carried out for the intended purpose of adjusting the surface properties of the release film. For example, a corona treatment, a room temperature plasma treatment, or a saponification treatment can be carried out to decrease the surface energy, and a silicone treatment, a fluorine treatment, an olefin treatment, or the like can be carried out to raise the surface energy.

—Peeling Force Between Wavelength Selective Absorption Filter and Release Film—

In a case where the wavelength selective absorption filter according to the embodiment of the present invention is formed by a coating method, the peeling force between the wavelength selective absorption filter according to the embodiment of the present invention and the release film can be controlled by adjusting the material of the wavelength selective absorption filter according to the embodiment of the present invention, the material of the release film, and the internal strain of the wavelength selective absorption filter. The peeling force can be measured by, for example, a test of peeling off the release film in a direction of 90°, and the peeling force in a case of being measured at a rate of 300 mm/min is preferably 0.001 to 5 N/25 mm, more preferably 0.01 to 3 N/25 mm, and still more preferably 0.05 to 1 N/25 mm. In a case where the peeling force is equal to or larger than the above-described preferred lower limit value, peeling off the release film in a step other than the peeling step can be prevented, and in a case where the peeling force is equal to or smaller than the above-described preferred upper limit value, peeling failure in the peeling step (for example, zipping and cracking of the wavelength selective absorption filter according to the embodiment of the present invention) can be prevented.

<Film Thickness of Wavelength Selective Absorption Filter According to Embodiment of Present Invention>

The film thickness of the wavelength selective absorption filter according to the embodiment of the present invention is not particularly limited, and it is preferably 1 to 18 μm, more preferably 1 to 12 μm, and still more preferably 2 to 8 μm. In a case where the film thickness is equal to or smaller than the above-described preferred upper limit value, it is also possible for the effect of the antifading agent to be easily exhibited by adding the dye into a thin film at a high concentration. On the other hand, in a case where the film thickness is equal to or larger than the above-described preferred lower limit value, it becomes easy to maintain the evenness of the in-plane absorbance.

In the present invention, the film thickness of 1 to 18 μm means that the thickness of the wavelength selective absorption filter according to the embodiment of the present invention is within a range of 1 to 18 μm at any portion. The same applies to the film thicknesses of 1 to 12 μm and 2 to 8 μm. The film thickness can be measured with an electronic micrometer manufactured by Anritsu Corporation.

<Relative Brightness>

In a case where the wavelength selective absorption filter according to the embodiment of the present invention is used on the front surface of the image display device, the relative brightness is preferably 82.0% or more and more preferably 82.4% or more. The upper limit value thereof is not particularly limited; however, it is practically 95% or less.

The relative brightness is a value calculated according to the method described in Examples described later, and it is a relative brightness based on, as the reference value, the brightness of a display device equipped with a control filter that does not contain the dye A and the dye C.

<Color Gamut of Wavelength Selective Absorption Filter According to Embodiment of Present Invention>

In addition, in the color reproduction range in a case where the wavelength selective absorption filter according to the embodiment of the present invention is used on the front surface of the image display device, the coverage rate with respect to the color gamut defined by DC1-P3 is preferably 80.0% or more, more preferably 83.0% or more, and still more preferably 85.0% or more. The upper limit value thereof is not particularly limited; however, it is practically 99% or less.

In addition, in the color reproduction range in a case where the wavelength selective absorption filter according to the embodiment of the present invention is used on the front surface of the image display device, the coverage rate with respect to the color gamut defined by NTSC is preferably 77.0% or more. The upper limit value thereof is not particularly limited; however, it is practically 99% or less.

The value of the color gamut described above is a value calculated from a display device equipped with the wavelength selective absorption filter according to the embodiment of the present invention, according to the method described in Examples described later.

<Light Resistance of Wavelength Selective Absorption Filter According to Embodiment of Present Invention>

The wavelength selective absorption filter according to the embodiment of the present invention preferably has light resistance from the viewpoint of preventing deterioration of display performance due to external light. Specifically, the light resistance is evaluated as follows.

The wavelength selective absorption filter according to the embodiment of the present invention is irradiated with light for 200 hours in an environment of 60° C. and 50% relative humidity using Super Xenon Weather Meter SX75 (product name, light source: 7.5 kW, a water-cooling type xenon lamp, irradiation illuminance: 150 W/m$^2$) (ultraviolet rays of 300 nm to 400 nm)) manufactured by Suga Test Instruments Co., Ltd. The maximal absorption values before and after this light irradiation are measured respectively, and the light resistance is calculated according to the following expression.

[Light resistance(%)]=([a maximal absorption value after light irradiation for 200 hours]/[a maximal absorption value before light irradiation])×100

Since the above light resistance test corresponds to an acceleration test, there is no problem as long as the light resistance is 10°% or more as the practical level. The light resistance of the wavelength selective absorption filter according to the embodiment of the present invention is preferably 50% or more and more preferably 70% or more. The upper limit value thereof is not particularly limited; however, it is practically 98% or less.

<Absorbance of Wavelength Selective Absorption Filter of According to Embodiment According to Embodiment of Present Invention>

In the wavelength selective absorption filter according to the embodiment of the present invention, the absorbance at the maximal absorption wavelength at which the highest absorbance is exhibited at a wavelength of 400 to 450 nm (hereinafter, also simply referred to as "Ab ($\lambda_{max}$)") is preferably 0.05 or more, more preferably 0.10 or more, and still more preferably 0.20 or more.

In the wavelength selective absorption filter according to the embodiment of the present invention, the absorbance at the maximal absorption wavelength at which the highest absorbance is exhibited at a wavelength of 560 to 600 nm (hereinafter, also simply referred to as "Ab ($\lambda_{max}$)") is preferably 0.10 or more, more preferably 0.20 or more, and still more preferably 0.30 or more.

However, the absorbance of the wavelength selective absorption filter according to the embodiment of the present invention can be adjusted by the kind, adding amount, or film thickness of the dye.

The absorbance can be measured and calculated according to the methods described in Examples.

<Moisture Content of Wavelength Selective Absorption Filter According to Embodiment of Present Invention>

From the viewpoint of the durability, the moisture content of the wavelength selective absorption filter according to the embodiment of the present invention is preferably 0.5% by mass or less, and more preferably 0.3% by mass or less, in conditions of 25° C. and 80% relative humidity, regardless of the film thickness.

In the present specification, the moisture content of the wavelength selective absorption filter according to the embodiment of the present invention can be measured by using a sample having a thick film thickness as necessary. The moisture content can be calculated by humidity-conditioning the sample for 24 hours or longer, then measuring a moisture content (g) by the Karl Fischer method with a water measuring instrument and a sample drying apparatus "CA-03" and "VA-05" (both manufactured by Mitsubishi Chemical Corporation), and dividing the moisture content (g) by the sample mass (g, including the moisture content).

<Treatment of Wavelength Selective Absorption Filter According to Embodiment of Present Invention>

It is preferable that the wavelength selective absorption filter according to the embodiment of the present invention is subjected to, for example, a hydrophilic treatment by a predetermined glow discharge treatment, corona discharge treatment, alkali saponification treatment, or the like, and a corona discharge treatment is most preferably used. It is also preferable to apply the method disclosed in JP1994-94915A (JP-H6-94915A) and JP1994-118232A (JP-H6-118232A).

As necessary, the obtained film may be subjected to a heat treatment step, a superheated steam contact step, an organic solvent contact step, or the like. In addition, a surface treatment may be appropriately carried out.

Further, as the pressure sensitive adhesive layer, a layer consisting of a pressure sensitive adhesive composition in which a (meth)acrylic resin, a styrene-based resin, a silicone-based resin, or the like is used as a base polymer, and a crosslinking agent such as an isocyanate compound, an epoxy compound, or an aziridine compound is added thereto can be applied.

Preferably, the description for the pressure sensitive adhesive layer in the OLED display device described later can be applied.

<Use Application of Wavelength Selective Absorption Filter According to Embodiment of Present Invention>

The wavelength selective absorption filter according to the embodiment of the present invention can be suitably applied to an image display device such as a television, a notebook type or desktop type personal computer, a smartphone, or a tablet.

Hereinafter, among the image display devices, a liquid crystal display device and an OLED display device will be described in detail.

[Liquid Crystal Display Device]

The liquid crystal display device according to the embodiment of the present invention includes the wavelength selective absorption filter according to the embodiment of the present invention.

In the liquid crystal display device according to the embodiment of the present invention, the wavelength selective absorption filter according to the embodiment of the present invention may be used as at least any one of a polarizing plate-protective film or a pressure sensitive adhesive layer as described later, or it may be included in a backlight unit that is used in the liquid crystal display device.

It is preferable that the liquid crystal display device includes a wavelength selective absorption filter, polarizing plates including a polarizer and a polarizing plate-protective film, a pressure sensitive adhesive layer, and a liquid crystal cell, and it is preferable that the polarizing plates are bonded to the liquid crystal cell with a pressure sensitive adhesive layer being interposed. In the liquid crystal display device, the wavelength selective absorption filter may also serve as the polarizing plate-protective film or the pressure sensitive adhesive layer. That is, it is divided into a case where the liquid crystal display device includes polarizing plates including a polarizer and a wavelength selective absorption filter (a polarizing plate-protective film), a pressure sensitive adhesive layer, and a liquid crystal cell, and a case where the liquid crystal display device includes polarizing plates including a polarizer and a polarizing plate-protective film, a wavelength selective absorption filter (a pressure sensitive adhesive layer), and a liquid crystal cell.

FIG. 1 is a schematic view illustrating an example of the liquid crystal display device according to the embodiment of the present invention. In FIG. 1, a liquid crystal display device 10 consists of a liquid crystal cell that has a liquid crystal layer 5 and a liquid crystal cell having a liquid crystal cell upper electrode substrate 3 and a liquid crystal cell lower electrode substrate 6, which are respectively disposed above and below the liquid crystal layer 5; and an upper polarizing plate 1 and a lower polarizing plate 8, which are respectively disposed on both sides of the liquid crystal cell. A color filter layer may be laminated on the upper electrode substrate 3 or the lower electrode substrate 6. A backlight is disposed on the rear surface of the liquid crystal display device 10. As a light source of the backlight, those described in the above backlight unit can be used.

Each of the upper polarizing plate 1 and the lower polarizing plate 8 has a configuration in which each of them is laminated such that a polarizer is sandwiched between two polarizing plate-protective films, and in the liquid crystal display device 10, at least one polarizing plate is preferably a polarizing plate including the wavelength selective absorption filter according to the embodiment of the present invention.

In addition, in the liquid crystal display device 10, the liquid crystal cell and the polarizing plate (upper polarizing plate 1 and/or lower polarizing plate 8) may be bonded to each other while interposing a pressure sensitive adhesive layer (not illustrated in the drawing). In this case, the wavelength selective absorption filter according to the embodiment of the present invention may also serve as the above-described pressure sensitive adhesive layer.

The liquid crystal display device 10 includes an image direct vision-type liquid crystal display device, an image projection-type liquid crystal display device, and a light modulation-type liquid crystal display device. An active matrix liquid crystal display device in which a three-terminal or two-terminal semiconductor element such as TFT or Metal-Insulator-Metal (MIM) is used is effective for the present invention. In addition, a passive matrix liquid crystal display device represented by a super twisted nematic (STN) mode which is called as the time division driving is also effective.

In a case where the wavelength selective absorption filter according to the embodiment of the present invention is included in the backlight unit, the polarizing plate of the liquid crystal display device may be a typical polarizing plate (a polarizing plate that does not include the wavelength selective absorption filter according to the embodiment of the present invention) or may be a polarizing plate that includes the wavelength selective absorption filter according to the embodiment of the present invention. In addition, the pressure sensitive adhesive layer may be a typical pressure sensitive adhesive layer (which does not correspond to the wavelength selective absorption filter according to the embodiment of the present invention) or may be a pressure sensitive adhesive layer formed of the wavelength selective absorption filter according to the embodiment of the present invention.

The in plane switching (IPS) mode liquid crystal display device described in paragraphs 0128 to 0136 of JP2010-102296A is preferable as the liquid crystal display device according to the embodiment of the present invention except that the wavelength selective absorption filter according to the embodiment of the present invention s used. That is, for the liquid crystal display device according to the embodiment of the present invention, the description of the IPS mode liquid crystal display device described in JP2010-102296A can be preferably applied except that the wavelength selective absorption filter according to the embodiment of the present invention is included as described above.

<Polarizing Plate>

The polarizing plate that is used in the present invention includes a polarizer and at least one polarizing plate-protective film.

The polarizing plate that is used in the present invention is more preferably a polarizing plate having a polarizer and polarizing plate-protective films on both surfaces of the polarizer, and it is preferable that at least one surface of the polarizer includes the wavelength selective absorption filter according to the embodiment of the present invention as the polarizing plate-protective film. The surface of the polarizer opposite to the surface having the wavelength selective absorption filter according to the embodiment of the present invention (the polarizing plate-protective film according to the embodiment of the present invention) may have a typical polarizing plate-protective film.

The film thickness of the polarizing plate-protective film is generally preferably 5 μm or more and 120 μm or less, and more preferably 10 μm or more and 100 μm or less. A thinner film is preferable since in a case of being incorporated in the liquid crystal display device, the display unevenness after elapse of time in high temperature and high humidity is less likely to occur. On the other hand, in a case where the film is too thin, it is difficult to transport the film stably in a case of producing the film and producing the polarizing plate. In a case where the wavelength selective absorption filter according to the embodiment of the present invention also serves as the polarizing plate-protective film, it is preferable that the thickness of the wavelength selective absorption filter satisfies the above-described range.

—Performance of Polarizing Plate—

The polarizing plate that is used in the present invention has a degree of polarization of preferably 99.950% or more, more preferably 99.970%, and most preferably 99.990% or more.

In the present invention, the degree of polarization of the polarizing plate is calculated according to the following expression from an orthogonal transmittance and a parallel transmittance measured at a wavelength of 380 to 700 nm using an automatic polarizing film measurement device: VAP-7070 (product name, manufactured by JASCO Corporation).

$$\text{Degree of polarization}(\%)=[(\text{parallel transmittance}-\text{orthogonal transmittance})/(\text{parallel transmittance}+\text{orthogonal transmittance})]^{1/2}\times 100$$

The degree of polarization can be measured as follows. Two samples (5 cm×5 cm) in which a polarizing plate has been stuck to glass with a pressure sensitive adhesive being interposed are produced. The orthogonal transmittance and the parallel transmittance are measured by setting a glass side of the sample toward a light source. The two samples are measured, and the average values thereof are defined as the orthogonal transmittance and the parallel transmittance, respectively. In a case of investigating the influence on the degree of polarization with the polarizing plate-protective film, In general, the polarizing plate-protective film to be evaluated is stuck to the glass while being disposed on the glass side.

Other preferred optical properties of the polarizing plate that is used in the present invention are described in [0238] to [0255] of JP2007-086748A, and it is preferable to satisfy these characteristics.

—Shape and Configuration—

The shape of the polarizing plate that is used in the present invention includes not only a polarizing plate of an aspect of a film piece cut into a size capable of being incorporated in the liquid crystal display device as it is, but also a polarizing plate of an aspect in which the polarizing plate is produced in a longitudinal shape by a continuous production and wound up in a rolled shape (for example, an aspect having a roll length of 2,500 m or more or 3,900 m or more). In order to use the polarizing plate as a large-sized screen liquid crystal display device, the width of the polarizing plate is preferably 1,470 mm or more.

The polarizing plate that is used in the present invention is composed of a polarizer and at least one polarizing plate-protective film; however, it is also preferable that the polarizing plate is further composed by bonding a separate film on one surface of the polarizing plate.

The separate film is used for the intended purpose of protecting the polarizing plate during the shipping of the polarizing plate and the examination of the product. The separate film is used for the intended purpose of covering an adhesive layer which is bonded to a liquid crystal plate, and it is used on a surface where the polarizing plate is bonded to the liquid crystal plate.

(Polarizer)

The polarizer that is used in the polarizing plate that is used in the present invention will be described.

The polarizer which can be used for the polarizing plate that is used in the present invention is preferably configured of polyvinyl alcohol (PVA) and a dichroic molecule, but as described in JP1999-248937A (JP-H11-248937A), a polyvinylene-based polarizer in which a polyene structure is generated by dehydrating PVA or dechlorinating polyvinyl chloride and aligning the polyene structure can also be used.

—Film Thickness of Polarizer—

The film thickness of the polarizer before stretching is not particularly limited; however, from the viewpoint of stability of retaining film and homogeneity of stretching, it is preferably 1 μm to 1 mm and particularly preferably 5 to 200 μm. In addition, as described in JP2002-236212A, a thin PVA film of which the stress generated in a case of being stretched 4 to 6 times in water is 10 N or less may be used.

—Manufacturing Method for Polarizer—

The manufacturing method for a polarizer is not particularly limited, and it is preferable that, for example, the PVA is formed into a film and then a dichroic molecule is introduced thereto to constitute the polarizer. The PVA film can be produced with reference to the method described in [0213] to 102371 of JP2007-86748A, JP3342516B, JP1997-328593A (JP-H09-328593 A), JP2001-302817A, JP2002-144301 A, and the like.

(Method of Laminating Polarizer and Polarizing Plate-Protective Film)

The polarizing plate that is used in the present invention is manufactured by adhering (laminating) at least one polarizing plate-protective film (preferably the wavelength selective absorption filter according to the embodiment of the present invention) on at least one surface of the above-described polarizer.

The polarizing plate that is used in the present invention is preferably produced by a method in which a polarizing plate-protective film is subjected to an alkali treatment, and is attached, using a completely saponified polyvinyl alcohol aqueous solution, to both surfaces of a polarizer produced by dipping and stretching a polyvinyl alcohol film in an iodine solution.

Examples of an adhesive used to attach the treated surface of the polarizing plate-protective film to the polarizer include polyvinyl alcohol-based adhesives such as polyvinyl alcohol and polyvinyl butyral and vinyl-based latex such as butyl acrylate.

In the polarizing plate that is used in the present invention, the bonding of the polarizing plate-protective film to the polarizer is preferably such bonding that the transmission axis of the polarizer and the slow axis of the polarizing plate-protective film are substantially parallel, orthogonal, or 45°.

The slow axis can be measured by various known methods, for example, using a birefringence meter (KOBRADH, manufactured by Oji Scientific Instruments).

Here, "substantially parallel" refers to that the direction of the main refractive index nx of the polarizing plate-protective film and the direction of the transmission axis of the polarizing plate intersect at an angle within ±5°, preferably at an angle within ±1°, and more preferably angle within ±0.5°. In a case where the intersecting angle is within ±1°, polarization performance under polarizing plate crossed nicols is less likely to be deteriorated and light leakage does not easily occur, which is preferable.

The same applies to "substantially orthogonal or 45°", and thus the description that the direction of the main refractive index nx and the direction of the transmission axis are orthogonal or 45° means that the angle at which the direction of the main refractive index nx and the direction of the transmission axis intersect is within a range of ±5° with respect to an exact angle of being orthogonal and 45°, and the difference with respect to the exact angle is preferably within a range of ±1° and more preferably within a range of ±0.5°.

(Functionalization of Polarizing Plate)

The polarizing plate that is used in the present invention is preferably used as a functionalized polarizing plate complexed with an antireflection film for improving the visibility of a display, a brightness improving film, or an optical film having a functional layer such as a hard coat layer, a forward scattering layer, an antiglare layer, an antifouling layer, and an antistatic layer. The antireflection film for functionalization, the brightness improving film, other functional optical films, the hard coat layer, the forward scattering layer, and the antiglare layer are described in [0257] to [0276] of JP2007-86748A, and a functionalized polarizing plate can be produced based on the description.

It suffices that the liquid crystal display device according to the embodiment of the present invention includes the wavelength selective absorption filter according to the embodiment of the present invention, and it is preferable that at least one surface of the polarizer includes the wavelength selective absorption filter according to the embodiment of the present invention as the polarizing plate-protective film.

For the polarizing plate according to the embodiment of the present invention, the above-described description relating to the polarizing plate that is used in the present invention can be applied except that the wavelength selective absorption filter according to the embodiment of the present invention is included.

<Pressure Sensitive Adhesive Layer>

In the liquid crystal display device according to the embodiment of the present invention, the polarizing plate is preferably bonded to the liquid crystal cell while interposing a pressure-sensitive adhesive layer. The wavelength selective absorption filter according to the embodiment of the present invention may also serve as the pressure sensitive adhesive layer. In a case where the wavelength selective absorption filter according to the embodiment of the present invention does not serve as the pressure sensitive adhesive layer, a typical pressure sensitive adhesive layer can be used as the pressure sensitive adhesive layer.

The pressure-sensitive adhesive layer is not particularly limited as long as the pressure-sensitive adhesive layer can attach the polarizing plate to the liquid crystal cell, and for example, an acrylic type, a urethane type, polyisobutylene, or the like is preferable.

In a case where the wavelength selective absorption filter according to the embodiment of the present invention also serves as a pressure sensitive adhesive layer, the pressure sensitive adhesive layer includes the coloring agent and the binder resin, and further contains a crosslinking agent, a coupling agent, or the like to impart adhesiveness.

In a case where the wavelength selective absorption filter additionally serves as a pressure sensitive adhesive layer, the pressure sensitive adhesive layer includes the binder resin in an amount of preferably 90% to 99.94% by mass and preferably 95% to 99.7% by mass. The content of the coloring agent is as described above.

The thickness of the pressure sensitive adhesive layer is not particularly limited; however, it is preferably 1 to 50 μm and more preferably 3 to 30 μm.

<Liquid Crystal Cell>

The liquid crystal cell is not particularly limited, and a typical liquid crystal cell can be used.

[OLED Display Device]

The organic electroluminescent display device according to the embodiment of the present invention (referred to as an organic electroluminescence (EL) display device or an organic light emitting diode (OLED) display device, and abbreviated as an OLED display device in the present invention) includes the wavelength selective absorption filter according to the embodiment of the present invention.

The OLED display device equipped with the wavelength selective absorption filter according to the embodiment of the present invention can realize high color reproducibility while suppressing a decrease in relative brightness.

As another configuration of the OLED display device according to the embodiment of the present invention, the configuration of the typically used OLED display device can be used without particular limitation, as long as the wavelength selective absorption filter according to the embodiment of the present invention is included. The configuration example of the OLED display device according to the embodiment of the present invention is not particularly limited, and examples thereof include a display device including glass, a layer containing a thin film transistor (TFT), an OLED display element, a barrier film, a color filter, glass, a pressure sensitive adhesive layer, the wavelength selective absorption filter according to the embodiment of the present invention, and a surface film, in order from the opposite side to external light. It is noted that in a case where the gas barrier layer is provided, it is provided to be positioned at least on the external light side from the wavelength selective absorption filter according to the embodiment of the present invention.

The OLED display element has a configuration in which an anode electrode, a light emitting layer, and a cathode electrode are laminated in this order. In addition to the light emitting layer, a hole injection layer, a hole transport layer, an electron transport layer, an electron injection layer: and the like are included between the anode electrode and the cathode electrode. In addition, for example, the description in JP2014-132522A can also be referenced.

Further, as the color filter, in addition to a typical color filter, a color filter in which quantum dots are laminated can also be used.

A resin film can be used instead of the above glass.

The method of forming an OLED color image applicable to the OLED display device according to the embodiment of the present invention is not particularly limited, and any of a three-color painting method, a color conversion method, and a color filter method of red (R), green (G), and blue (B) can be used, and the three-color painting method can be suitably used. As a result, as the light source of the OLED display device according to the embodiment of the present invention, each light emitting layer corresponding to the above image forming method can be applied. For example, blue (B, 460 nm), green (G, 520 nm), and red (R, 620 nm) are used as the light emitting source of the OLED display device.

<Pressure Sensitive Adhesive Layer>

In the OLED display device according to the embodiment of the present invention, it is preferable that the wavelength selective absorption filter according to the embodiment of the present invention is bonded to the glass (the base material) with a pressure sensitive adhesive layer being interposed, on a surface positioned opposite to the side of the external light. As the pressure sensitive adhesive, those described in the section of the liquid crystal display device can be used.

<Base Material>

In the OLED display device according to the embodiment of the present invention, it is preferable that the wavelength selective absorption filter according to the embodiment of the present invention is bonded to the glass (the base material) with a pressure sensitive adhesive layer being interposed, on a surface positioned opposite to the side of the external light.

The method of forming the pressure sensitive adhesive layer is not particularly limited, and for example, a method of applying the pressure sensitive adhesive composition to the wavelength selective absorption filter according to the embodiment of the present invention by a usual means such as a bar coater, drying, and curing the pressure sensitive adhesive composition; a method of applying the pressure sensitive adhesive composition first to the surface of a peelable base material, and drying the composition, and then transferring the pressure sensitive adhesive layer using the peelable base material to the wavelength selective absorption filter according to the embodiment of the present invention and then aging and curing the composition is used.

The peelable base material is not particularly limited, and any peelable base material can be used. For example, the release film in the manufacturing method for the wavelength selective absorption filter according to the embodiment of the present invention described above is exampled.

In addition, the conditions of application, drying, aging, and curing can be appropriately adjusted based on a conventional method.

Examples

Hereinafter, the present invention will be described in more detail based on Examples. The materials, using amount, ratio, details of treatment, procedures of treatment, and the like described in Examples below can be appropriately changed without departing from the spirit of the present invention. Therefore, it is to be understood that the scope of the present invention is not limited to Examples described below.

It is noted that "parts" and "%" that indicate the composition in Examples below are based on mass unless otherwise specified.

In addition, all steps from a preparation step of a wavelength selective absorption filter forming liquid to a production step of a base material-attached wavelength selective absorption filter using the wavelength selective absorption filter forming liquid and to the use thereof in the light resistance test were carried out under a yellow lamp to avoid ultraviolet irradiation.

Examples

[1. Production of Wavelength Selective Absorption Filter]

The materials used in the production of the wavelength selective absorption filter are shown below.

<Matrix Resin>

(Resin 1)

A polystyrene resin (PSJ-polystyrene GPPS SGP-10 (product name), Tg: 100° C., fd: 0.56) manufactured by PS Japan Corporation was heated at 110° C., allowed to cool to room temperature (23° C.), and used as a resin 1.

(Resin 2)

A polyphenylene ether resin (manufactured by Asahi Kasei Corporation, Zylon S201 A (product name), poly(2,6-dimethyl-1,4-phenylene oxide), Tg: 210° C.)

(Extensible Resin Component 1)

ASAFLEX 810 (product name, manufactured by Asahi Kasei Corporation, a styrene-butadiene resin)

(Peelability Control Resin Component 1)

Byron 550 (product name, manufactured by Toyobo Co., Ltd., a polyester-based additive)

<Dye A>

Coloring agent represented by General Formula (A1)

Exemplary compound E-24

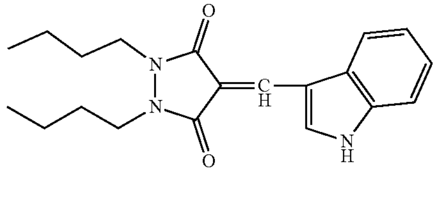

-continued

Exemplary compound E-13

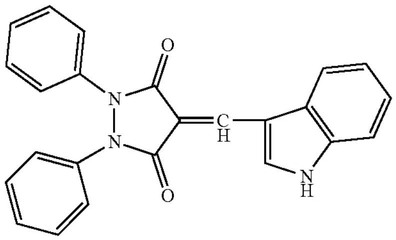

The following dyes used in Example of JP2017-142412A

Coloring agent (B-3)

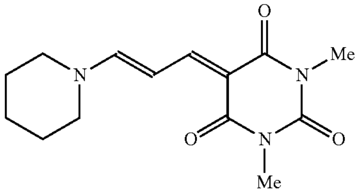

<Dye C>

C-73

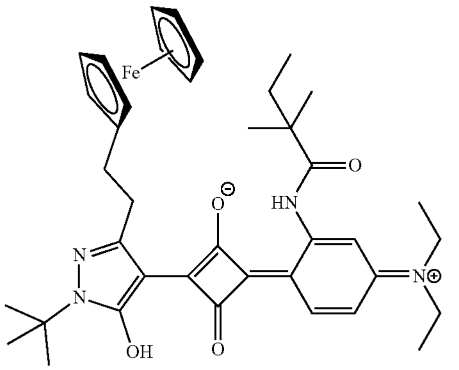

<Additive>

(Antifading Agent 1)

An exemplary compound IV-8 in the above antifading agent

IV-8

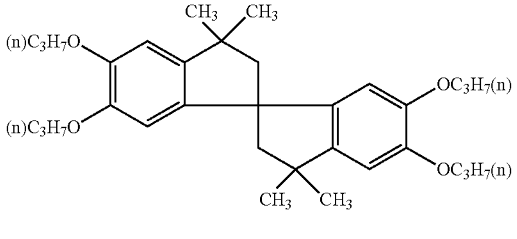

(Leveling Agent 1)

A polymer surfactant composed of the following constitutional components was used as a leveling agent 1. In the following structural formulae, the proportion of each constitutional component is in terms of a molar ratio, and t-Bu means a tert-butyl group.

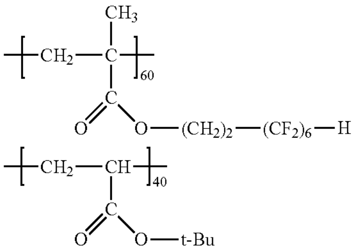

(Base Material 1)

A polyethylene terephthalate film, LUMIRROR XD-510P (product name, film thickness: 50 μm, manufactured by Toray Industries, Inc.) was used as a base material 1.

<1> Production of Base Material-Attached Wavelength Selective Absorption Filter No. 101>

(Preparation of Toluene Solution of Extensible Resin Component 1)

3.0 parts by mass of the extensible resin component 1 was dissolved in 97.0 parts by mass of toluene. Next, 5 parts by mass of KYOWADO 700 SEN-S(product name, manufactured by Kyowa Chemical Industry Co., Ltd.) was added thereto, and the mixture was stirred at room temperature for 1 hour, and then subjected to filtration with a metal sintered filter (FH025 (product name), manufactured by Pall Corporation) with an absolute filtration precision of 2.5 μm to remove KYOWADO 700 SEN-S, thereby preparing a toluene solution of an extensible resin component 1 having a concentration of 3% by mass, from which a base component had been removed.

(1) Preparation of Wavelength Selective Absorption Filter Forming Liquid

Each component was mixed according to the composition shown below to prepare a wavelength selective absorption filter forming liquid (a composition) No. 101.

| Composition of wavelength selective absorption filter forming liquid No. 101 | | |
|---|---|---|
| Resin 1 | 44.9 | parts by mass |
| Resin 2 | 17.5 | parts by mass |
| Toluene solution of extensible resin component 1 (the formulation amount of the extensible resin component 1 is 20.0 parts by mass) | 667.7 | parts by mass |
| Peelability control resin component 1 | 0.2 | parts by mass |
| Leveling agent I | 0.1 | parts by mass |
| Dye A: Exemplary Compound E-24 | 3.9 | parts by mass |
| Dye C: Exemplary Compound C-73 | 0.6 | parts by mass |
| Antifading agent 1 | 12.4 | parts by mass |
| Toluene (a solvent) | 1063.3 | parts by mass |
| Cyclohexanone (a solvent) | 190.0 | parts by mass |

Subsequently; the obtained wavelength selective absorption filter forming liquid No. 101 was filtered using a filter paper (#63, manufactured by Toyo Filter Paper Co., Ltd.) having an absolute filtration precision of 10 μm, and further subjected to filtration using a metal sintered filter (product name: Pall filter PMF, media code: FH025, manufactured by Pall Corporation) with an absolute filtration precision of 2.5 μm.

(2) Production of Base Material-Attached Wavelength Selective Absorption Filter

The above-described wavelength selective absorption filter forming liquid No. 101 after the filtration treatment was applied onto the base material 1 by using a bar coater so that the film thickness after drying was 2.5 μm, and dried at 130° C. to produce a base material-attached wavelength selective absorption filter No. 101.

<2> Production of Base Material-Attached Wavelength Selective Absorption Filter Nos. 102 to 104 and 201 to 204>

The base material-attached wavelength selective absorption filter Nos. 102 to 104 and 201 to 204 were produced in the same manner as in the production of the wavelength selective absorption filter No. 101, except that the kind and the formulation amount of the dye were changed to the contents shown in Table 1.

Here, the Nos. 101 to 104 are the wavelength selective absorption filters according to the embodiment of the present invention, and Nos. 202 to 204 are wavelength selective absorption filters for comparison. It is noted that the No. 201 is a control filter which does not contain a dye.

In these wavelength selective absorption filter Nos. 101 to 104, 202, and 203, the formulation amount of the dye C was adjusted so that the relative brightness described later was 82.0 to 83.0%. Further, for those containing the dye A, the formulation amount of the dye A was adjusted so that the NTSC coverage rate described later was 77.0% or more. This made it possible to discuss the difference in the coverage rate of the color gamut. It is noted that, in the wavelength selective absorption filter No. 204, the coverage rate of the color gamut could not be adjusted to a desired level by adjusting the formulation amount of the dye A, which will be described later.

[Evaluation]

The base material-attached wavelength selective absorption filters produced as described above were evaluated as follows. The results are collectively shown in Table 1.

<Maximal Absorption Value of Wavelength Selective Absorption Filter>

Using a UV3150 spectrophotometer (product name) manufactured by Shimadzu Corporation, the absorbance of the base material-attached wavelength selective absorption filter in a wavelength range of 380 nm to 800 nm was measured for every 1 nm. Using an absorbance $Ab_x$ (λ) at each wavelength λ nm of the base material-attached wavelength selective absorption filter and an absorbance $Ab_0$ (λ) of the control filter which does not contain a dye (that is, the wavelength selective absorption filter No. 201), the absorbance Ab (λ) of the wavelength selective absorption filter was calculated according to the following expression.

$$Ab(\lambda)=Ab_x(\lambda)-Ab_0(\lambda)$$

Hereinafter, among the absorbances Ab (λ) of the wavelength selective absorption filter in a wavelength range of 380 to 800 nm, the wavelength at which the highest absorbance Ab (λ) among the wavelengths at which the highest maximum absorption is exhibited was defined as the maximal absorption wavelength (hereinafter, also simply referred to as "$\lambda_{max}$"), and the absorbance at $\lambda_{max}$ was defined as the maximal absorption value (hereinafter, also simply referred to as "Ab ($\lambda_{max}$)").

[2. Production of Polarizing Plate]

<1> Surface Treatment of Wavelength Selective Absorption Filter

The base material-attached wavelength selective absorption filter Nos. 101 to 104 and 201 to 204 were subjected to a corona treatment on the surface opposite to the base material film, to produce the base material-attached wavelength selective absorption filter Nos. 101 to 104 and 201 to 204, which had been subjected to the surface treatment.

<2> Production of Polarizer (Polarizing Layer)>

According to Example 1 of JP2001-141926A, a circumferential speed difference was imparted between two pairs of nip rollers to stretch a film in the longitudinal direction, thereby producing a polarizing layer including a polyvinyl alcohol resin having a thickness of 12 μm.

Specifically, a long polyvinyl alcohol film (manufactured by KURARAY Co., Ltd., product name: 9X75RS) having a thickness of 75 μm was continuously transported by a guide roll, immersed in a water bath at 30° C. to be swelled by 1.5 times, and subjected to a stretching treatment to obtain a stretching ratio of 2 times. Then, it was immersed in a dyeing bath (30° C.) formulated with iodine and potassium iodide to be subjected to a dyeing treatment and a stretching treatment to obtain a stretching ratio of 3 times, and subsequently subjected to a crosslinking treatment in an acidic bath (60° C.) to which boric acid and potassium iodide had been added and a stretching treatment to obtain a stretching ratio of 6.5 times, and dried 50° C. for 5 minutes, thereby producing a polarizing layer.

<3> Production of Front-Side Polarizing Plate-Protective Film (Outer Polarizing Plate-Protective Film)

(1) Preparation of (Meth)acrylic Resin A 8,000 g of methyl methacrylate (MMA), 2,000 g of methyl 2-(hydroxymethyl)acrylate (MHMA), and 10,000 g of toluene as a polymerization solvent were charged into a reactor having an inner volume of 30 L, equipped with a stirrer, a temperature sensor, a cooling pipe, and a nitrogen introduction pipe, and heated up to 107° C. while passing nitrogen through the solution. At a time when the reflux caused by the heating was started, 10 g of t-amyl peroxyisononanoate was added thereto as a polymerization initiator, the solution polymerization was allowed to proceed under reflux at approximately 105° C. to 110° C. while dropwise adding a solution consisting of 20 g of t-amyl peroxyisononanoate and 100 g of toluene for 2 hours, and further, aging was carried out for 4 hours. The polymerization reaction rate was 95%, and the content (in terms of mass ratio) of MHMA in the obtained polymer was 20%.

Next, 10 g of a mixture (manufactured by Sakai Chemical industry Co., Ltd., product name: Phoslex A-18) of stearyl phosphate and distearyl phosphate was added as a cyclization catalyst to the obtained polymerization solution, and a cyclization condensation reaction was allowed to proceed under reflux at approximately 80° C. to 100° C. for 5.5 hours.

Next, the obtained polymerization solution in which the cyclization condensation reaction had been allowed to proceed was introduced into a vent-type screw twin-screw extruder (ϕ=29.75 mm, L/D=30, where L indicates the outer diameter of the screw, and D indicates the length of the screw) having a barrel temperature of 260° C., a rotation speed of 100 rpm, a degree of pressure reduction of 13 to 400 hPa (10 to 300 mmHg), and one rear vent and four fore-vents at a processing rate of 2.0 kg/hour in terms of resin amount, and a cyclization condensation reaction and devolatilization were carried out in the extruder. Next, after completion of the devolatilization, the resin in a hot-melt state, remaining in the extruder, was discharged from a front end of the extruder and pelletized using a pelletizer, thereby obtaining a (meth)acrylic resin A. The (meth)acrylic resin A had a lactone ring structure. The mass average molecular weight of the resin was 110000, and the glass transition temperature thereof was 125° C.

(2) Production of Outer Polarizing Plate-Protective Film 100 parts by mass of the (meth)acrylic resin A and 10 parts by mass of a rubber elastic body C-1 were supplied to a twin-screw extruder, and melted and extruded in a sheet shape at approximately 280° C., thereby producing a longitudinally shaped outer polarizing plate-protective film having a thickness of 40 μm. As the rubber elastic body C-1, Kane Ace M-210 (product name, manufactured by Kaneka Corporation) was used.

In the present invention, the front-side polarizing plate-protective film means a protective film of the polarizing plate positioned on the viewer side in a case of being incorporated into a liquid crystal display device among the polarizing plates provided on both sides of the liquid crystal panel, and the outer polarizing plate-protective film means a polarizing plate-protective film positioned on the side far from the liquid crystal panel in a case of being incorporated into a liquid crystal display device among the polarizing plate-protective films provided on both sides of the polarizes <4> Production of Polarizing Plate A polarizing plate in which the base material-attached wavelength selective absorption filter subjected to the surface treatment, the polarizing layer, and the outer polarizing plate-protective film, each of which had been produced as described above, had been bonded in this order were produced as follows. The wavelength selective absorption filter functions as an inner polarizing plate-protective film in the polarizing plate.

First, the polarizing layer and the base material-attached wavelength selective absorption filter subjected to the surface treatment were laminated to each other using an aqueous solution of 3% by mass of polyvinyl alcohol (manufactured by Kuraray Co., Ltd., product name: PVA-117H) in a roll-to-roll manner so that the corona-treated surface of this wavelength selective absorption filter (inner polarizing plate-protective film) was positioned on the polarizing layer side and that the absorption axis of the polarizing layer and the longitudinal direction of the base material-attached wavelength selective absorption filter subjected to the surface treatment were parallel to each other, thereby obtaining a laminate A. It is noted that the longitudinal direction of the base material-attached wavelength selective absorption filter subjected to the surface treatment means the longitudinal direction of the base material 1.

Next, an adhesive M having the following composition was applied onto the outer polarizing plate-protective film by using a microgravure coater so that the thickness was 5 μm, thereby preparing an adhesive-attached front-side polarizing plate-protective film. Next, this adhesive-attached front-side polarizing plate-protective film and the laminate A were bonded to each other so that the adhesive-attached surface of the adhesive-attached front-side polarizing plate-protective film and a surface of the polarizing layer of the laminate A were bonded to each other, and irradiated with ultraviolet rays from the optical filter side, thereby producing a polarizing plate. The line speed was set to 20 m/min, and the accumulated light amount of ultraviolet rays was set to 300 mJ/cm$^2$. Here, the transmission axis of the polarizer (the polarizing layer) and the transportation direction of the outer polarizing plate-protective film were disposed to be orthogonal to each other.

—Composition of Adhesive M—

| | |
|---|---|
| 2-hydroxyethyl acrylate | 100 parts by mass |
| Tolylene diisocyanate | 10 parts by mass |
| Photopolymerization initiator (product name: IRGACURE 907, manufactured by BASF SE) | 3 parts by mass |

Subsequently, after carrying out drying at 70° C. the base material 1 (a polyethylene terephthalate film) which is a base material film of the base material-attached wavelength selective absorption filter was continuously peeled off using the same device as the separator-peeling device having a peeling roller, and further, a commercially available acrylate-based pressure sensitive adhesive was applied onto the peeled wavelength selective absorption filter to produce a polarizing plate.

This polarizing plate has a structure obtained by carrying out lamination in the following order, the acrylate-based pressure-sensitive adhesive layer/the wavelength selective absorption filter/the polyvinyl alcohol layer/the polarizing layer/the adhesive M/the outer polarizing plate-protective film.

[Production of Liquid Crystal Display Device]

A liquid crystal panel of a commercially available liquid crystal display device (manufactured by Xiaomi Inc, product name: L43M5-4X) was taken out, and a polarizing plate on the front side (the viewer side) was peeled off, and instead, the polarizing plate prepared above was bonded on the acrylate-based pressure-sensitive adhesive layer side. In this way, a liquid crystal display device was produced.

[Evaluation of Color Reproduction Range]

The produced liquid crystal display device was allowed to carry out full screen displaying for each of white, red, green, and blue, and the brightness of white display and the chromaticity of each of red, green, and blue were measured by using a spectroradiometer (manufactured by TOPCON TECHNOHOUSE CORPORATION, product name: SR-UL2).

An area obtained by overlapping a triangle created by connecting the measured chromaticity points of red, green, and blue on the xy chromaticity diagram in the xyY color system of the International Commission on Illumination (CIE) 1931 and a triangle created by connecting the three primary color points of the NTSC standard or DCI-P3 standard was determined, and the area of this overlapped portion was divided by the area of the triangle created by connecting the three primary color points of the NTSC standard or DCI-P3 standard to calculate each of the coverage rates in terms of the NTSC standard and the coverage rate in terms of the DCI-P3 standard. These coverage rates are shown in the column of "Color gamut" in Table 1.

In the present invention, the coverage rate for the NTSC standard (hereinafter, abbreviated as "NTSC coverage rate") is 77.0% or more, which is the pass level, and the coverage rate for the DCI-P3 standard (hereinafter, "DCI-P3 coverage rate"). 80.0% or more is the pass level.

The three primary color points of the NTSC standard are as follows.

Red: x=0.670, y=0.330

Green: x=0.210, y=0.710

Blue: x=0.140, y=0.080

In addition, the three primary color points of the DCI-P3 standard are as follows.

Red: x=0.680, y=0.320

Green: x=0.265, y=0.690

Blue: x=0.150, y=0.060

(2) Relative Brightness

The relative brightness of the brightness of white display, measured in a case where the wavelength selective absorption filter had been used, with respect to the brightness of white display, measured in a case where a control filter which does not contain a dye (that is, the wavelength selective absorption filter No. 201) had been used, was calculated.

In the present invention, the relative brightness of 82.0% or more is the pass level, and it is more preferably 82.4% or more.

<Evaluation of Light Resistance>

The base material-attached wavelength selective absorption filter of the present invention was irradiated with light for 200 hours in an environment of 60° C. and 50% relative humidity using Super Xenon Weather Meter SX75 (product name, light source: 7.5 kW, a water-cooling type xenon lamp, irradiation illuminance: 150 W/m$^2$) (ultraviolet rays of 300 nm to 400 nm)) manufactured by Suga Test Instruments Co., Ltd. The maximal absorption values before and after this light irradiation were measured respectively, and the light resistance was calculated according to the following expression.

[Light resistance(%)]=([a maximal absorption value after light irradiation for 200 hours)]/[a maximal absorption value before light irradiation])×100

Since the above light resistance test corresponds to an acceleration test, there is no problem as long as the light resistance is 10% or more as the practical level. In the present invention, it is preferable to satisfy 70% or more.

a case where the relative brightness was adjusted to a desired level (82.0% or more). As described above, in a case where the dye C was contained, the color reproducibility could be improved with respect to the wavelength selective absorption filter No. 201 that did not contain the dye; however, in a case where the dye A defined by the present invention was not contained, it was not possible to achieve both the excellent color reproduction and the high brightness even in a case where the content of the dye C was adjusted.

In addition, the wavelength selective absorption filter No. 204 of Comparative Example does not contain the dye C defined by the present invention. In this wavelength selective absorption filter No. 204 of Comparative Example, the NTSC coverage rate was 72.4% and could not be adjusted to be 77.0% or more, and the DCI-P3 coverage rate was 77.0%, which was less than 80.0%. As a result, the color reproduction range was narrow. This is caused by the fact that the blue absorption derived from the dye A is present on the long wavelength side as compared with the blue chromaticity points of NTSC and DCI-P3, and thus in a case where the dye C defined by the present invention is not contained, it is difficult to improve the NTSC coverage rate and the DCI-P3 coverage rate even in a case where the

TABLE 1

| | Dye A | | | | Dye C | | | | Color gamut | | Relative | Light resistance | |
|---|---|---|---|---|---|---|---|---|---|---|---|---|---|
| Filter No. | Kind of coloring agent | $\lambda_{max}$ | Content | Ab ($\lambda_{max}$) | Kind of coloring agent | $\lambda_{max}$ | Content | Ab ($\lambda_{max}$) | NTSC (%) | DCI-P3 (%) | (%) brightness | Dye A | Dye C |
| 101 | Exemplary compound E-24 | 409 | 3.9% | 0.36 | Exemplary compound C-73 | 593 | 0.60% | 0.40 | 79.3 | 85.0 | 82.4 | 95% | 92% |
| 102 | Exemplary compound E-24 | 409 | 2.2% | 0.20 | Exemplary compound C-73 | 593 | 0.60% | 0.40 | 77.4 | 85.0 | 82.8 | 95% | 92% |
| 103 | Exemplary compound E-13 | 426 | 1.1% | 0.24 | Exemplary compound C-73 | 593 | 0.60% | 0.40 | 78.7 | 85.0 | 82.4 | 74% | 92% |
| 104 | Coloring agent (B-3) described in JP2017-142412A | 410 | 2.7% | 1.60 | Exemplary compound C-73 | 593 | 0.60% | 0.40 | 77 3 | 85.0 | 82.5 | 13% | 92% |
| 201 | Absent | — | — | — | Absent | — | — | — | 71.4 | 76.9 | 100 (Reference) | — | — |
| 202 | Absent | — | — | — | Exemplary compound C-73 | 593 | 0.60% | 0.40 | 76.5 | 84.7 | 83.0 | — | 92% |
| 203 | Absent | — | — | — | Exemplary compound C-73 | 593 | 0.63% | 0.42 | 76.6 | 85.0 | 82.4 | — | 92% |
| 204 | Exemplary compound E-24 | 409 | 3.9% | 0.36 | Absent | — | — | — | 72.4 | 77.0 | 99.6 | 95% | — |

(Note in table)

The content of the dye means the content proportion of the dye in the wavelength selective absorption filter in terms of the mass ratio.

The notation of "—" in the column of "Dye" indicates that the dye is not contained.

$\lambda_{max}$ in each of the dye A and the dye C means a wavelength derived from the dye A or the dye C among the maximal absorption wavelengths possessed by the wavelength selective absorption filter in a wavelength range of 380 to 800 nm, at winch the highest absorbance Ab (λ) is exhibited, and the unit thereof is nm.

Ab ($\lambda_{max}$) means the value of the absorbance at the maximal absorption wavelength $\lambda_{max}$.

The "—" notation in the column of the light resistance evaluation indicates that the corresponding dye is not contained.

"NTSC" means the NTSC coverage rate, and "DCI-P3" means the DCI-P3 coverage rate.

From Table 1, the following facts can be seen.

The wavelength selective absorption filter Nos. 202 and 203 of Comparative Examples do not contain the dye A defined by the present invention. In these wavelength selective absorption filter Nos. 202 and 203 of Comparative Examples, the NTSC coverage rate was low, which was less than 77.0%, and the color reproducibility was insufficient in content of the dye A is adjusted, and the excellent color reproducibility cannot be exhibited.

On the other hand, it was found that in the wavelength selective absorption filter Nos. 101 to 104, the NTSC coverage rate is 77.0% or more, the DCI-P3 coverage rate is 85.0%, the color reproduction range was widened, and moreover, the relative brightness is as high as 82.0% or more, and thus, both excellent color reproducibility and high brightness can be achieved. Further, it was found that the Nos. 101 to 103 containing a coloring agent represented by General Formula (A1) as the dye A are excellent in light resistance as well.

Although the present invention has been described with reference to the embodiments, it is the intention of the inventors of the present invention that the present invention should not be limited by any of the details of the description unless otherwise specified and rather be construed broadly within the spirit and scope of the invention appended in WHAT IS CLAIMED IS.

EXPLANATION OF REFERENCES

1: upper polarizing plate
2: direction of absorption axis of upper polarizing plate
3: upper electrode substrate of liquid crystal cell
4: alignment control direction of upper substrate
5: liquid crystal layer
6: lower electrode substrate of liquid crystal cell
7: alignment control direction of lower substrate
8: lower polarizing plate
9: direction of absorption axis of lower polarizing plate
B: backlight unit
10: liquid crystal display device

What is claimed is:

1. A wavelength selective absorption filter comprising:
a resin; and
a dye,
wherein the dye contained in the wavelength selective absorption filter consists of a dye A and a dye C,
wherein the dye A and the dye C each has a main absorption wavelength band in a different wavelength range,
wherein the dye A and the dye C do not have fluorescence,
the dye A: a dye having a main absorption wavelength band in the wavelength selective absorption filter at a wavelength of 400 to 450 nm,
the dye C: a dye having a main absorption wavelength band in the wavelength selective absorption filter at a wavelength of 560 to 600 nm;
wherein the dye A is a coloring agent represented by General Formula (A1), General Formula (A1)

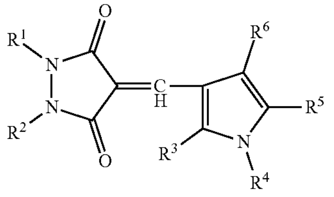

wherein, in the General Formula (A1), $R^1$ and $R^2$ each independently represent an alkyl group or an aryl group, $R^3$, $R^5$ and $R^6$ each independently represent a hydrogen atom or a substituent, $R^4$ represents a hydrogen atom, an alkyl group or an aryl group, and $R^5$ and $R^6$ may be bonded to each other to form a 6-membered ring; and
wherein the alkyl group of $R^4$ is an unsubstituted alkyl group, or a substituted alkyl group whose substituent is an aryl group, a heterocyclic group, a carboxy group, a hydroxy group, an alkoxy group, an aryloxy group, an alkylamino group, an alkylcarbonylamino group, a cyano group, an acyl group, or a monovalent group in which at least the two thereof are linked to each other.

2. A polarizing plate comprising the wavelength selective absorption filter according to claim 1.

3. An organic electroluminescent display device or a liquid crystal display device, comprising the wavelength selective absorption filter according to claim 1.

* * * * *